United States Patent [19]

Wiggins, Jr. et al.

[11] 4,234,761
[45] Nov. 18, 1980

[54] METHOD OF COMMUNICATING DIGITAL SPEECH DATA AND A MEMORY FOR STORING SUCH DATA

[75] Inventors: Richard H. Wiggins, Jr., Dallas; George L. Brantingham, Lubbock, both of Tex.

[73] Assignee: Texas Instruments Incorporated, Dallas, Tex.

[21] Appl. No.: 916,989

[22] Filed: Jun. 19, 1978

Related U.S. Application Data

[62] Division of Ser. No. 901,392, Apr. 28, 1978.

[51] Int. Cl.² .................. G11C 13/00; G10L 1/08
[52] U.S. Cl. ................... 179/1 SM; 365/45; 370/7
[58] Field of Search .............. 365/45, 63, 73; 179/15 AV, 1 SM, 1 SA

[56] References Cited

U.S. PATENT DOCUMENTS

| | | | |
|---|---|---|---|
| 3,638,007 | 1/1972 | Brooks | 365/45 |
| 3,969,705 | 7/1976 | Waggener | 365/45 |
| 4,117,263 | 9/1978 | Yeh | 179/1 SM |
| 4,163,120 | 7/1979 | Baumwolspiner | 179/1 SM |

*Primary Examiner*—Terrell W. Fears
*Attorney, Agent, or Firm*—Andrew J. Dillon; Stephen S. Sadacca; Mel Sharp

[57] ABSTRACT

A method of communicating Digital Speech Data to a speech synthesis circuit. The data is compressed to on the order of 1000-1200 bits, per second for normal human speech. The speech synthesis circuit utilizes linear predictive coding techniques for producing high quality speech or other sounds.

The data is preferably stored in a memory which is coupled to the speech synthesis circuit. The data has variable frame lengths; in the disclosed embodiment, four different frame lengths are described having frame lengths from four bits to forty-nine bits. The memory stores the variable frame length data and communicates the same to the speech synthesis circuit in response to certain control signals.

8 Claims, 55 Drawing Figures

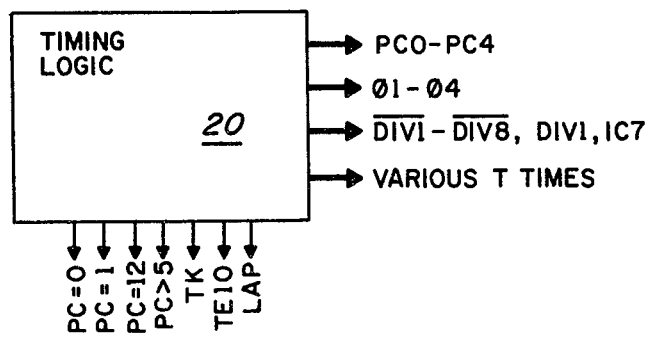
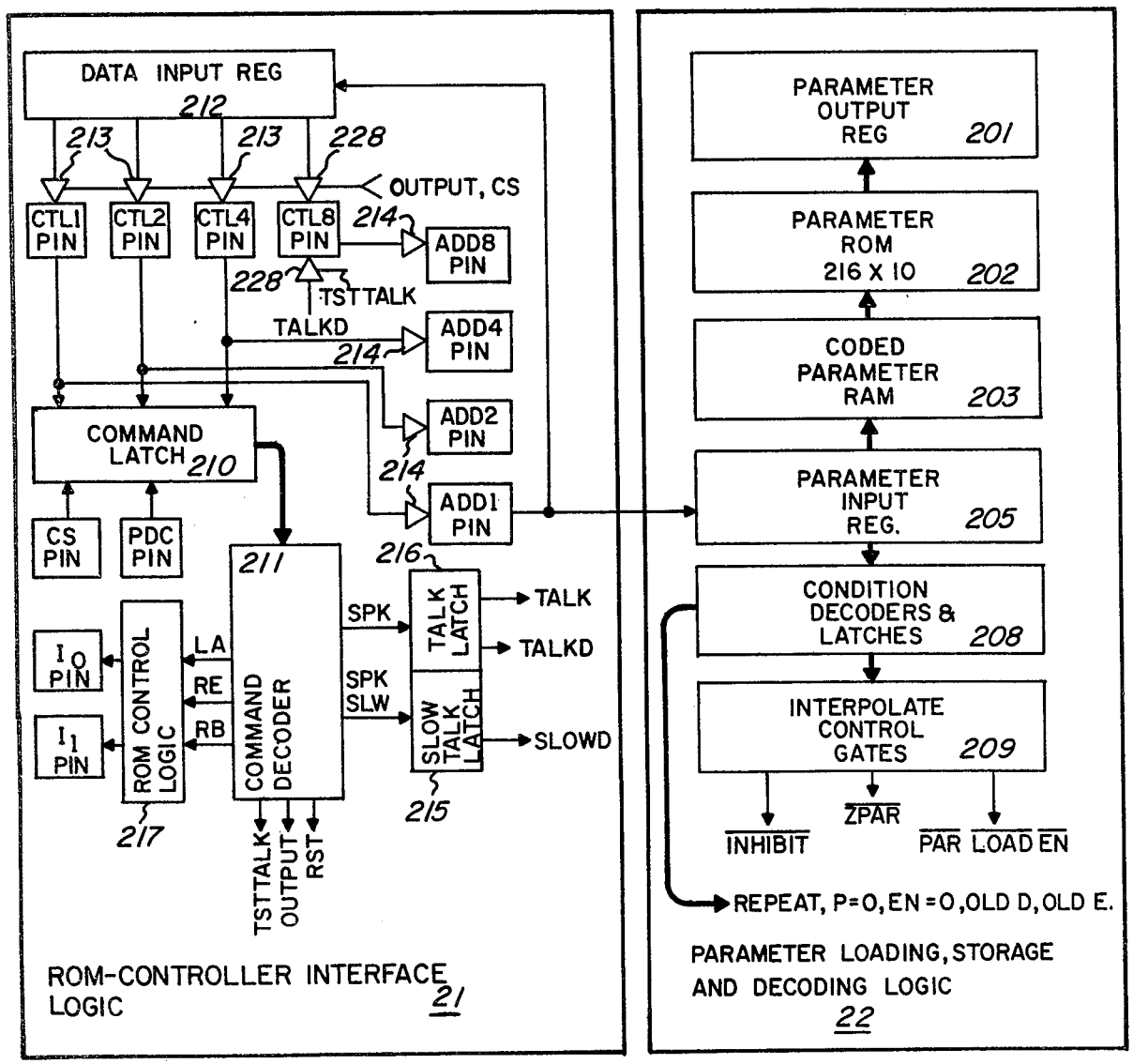
Fig. 4a

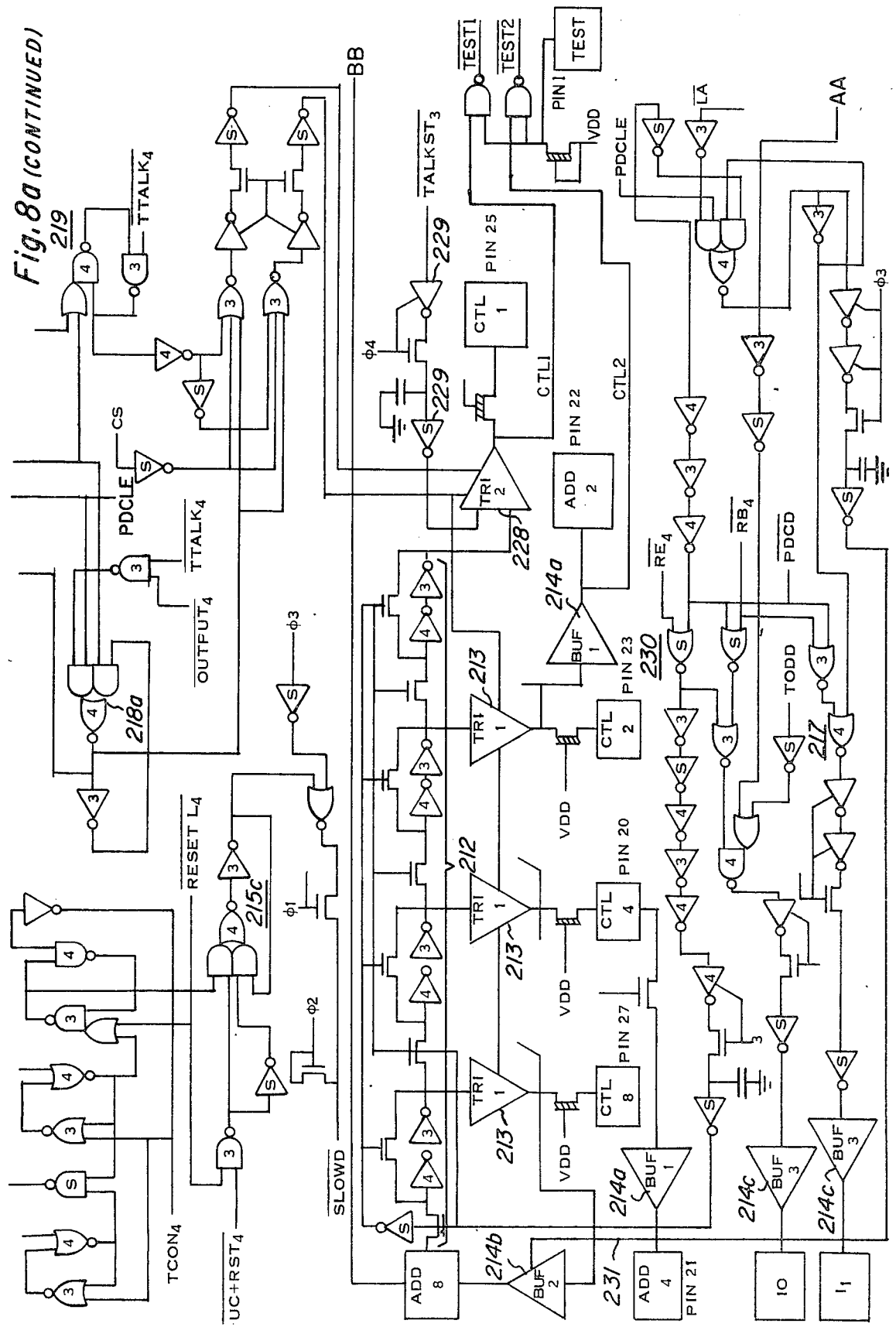

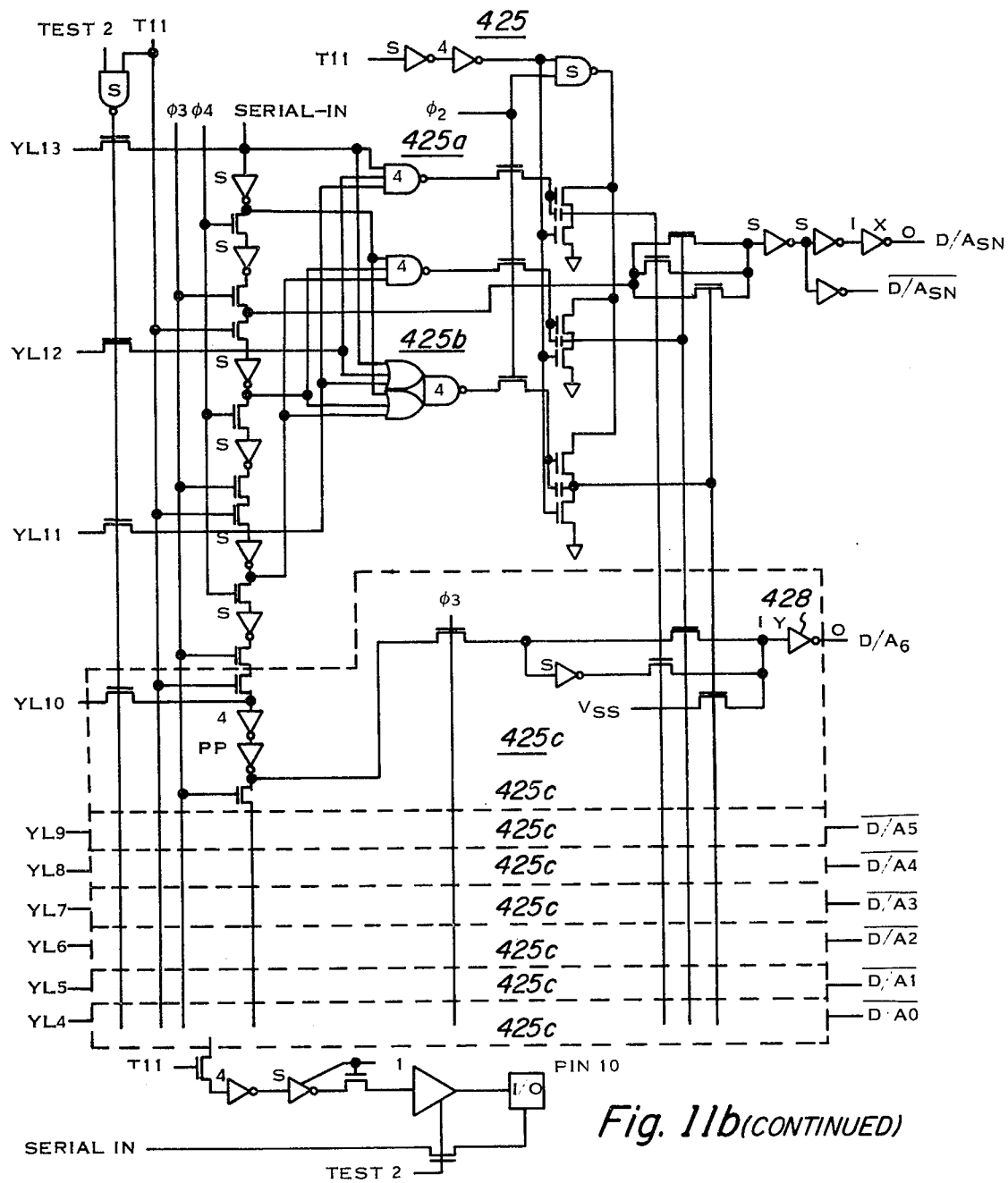
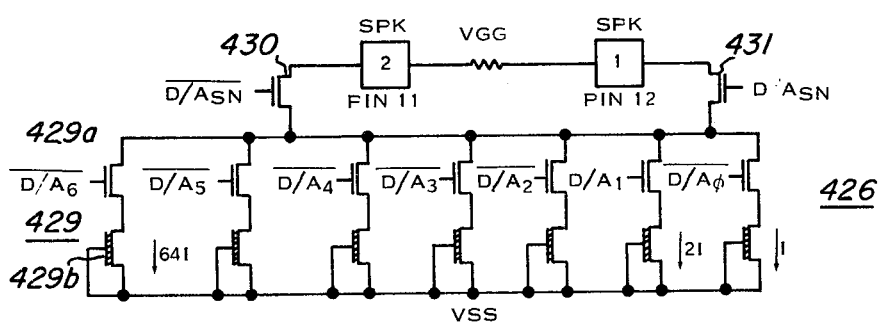
Fig. 11b (CONTINUED)

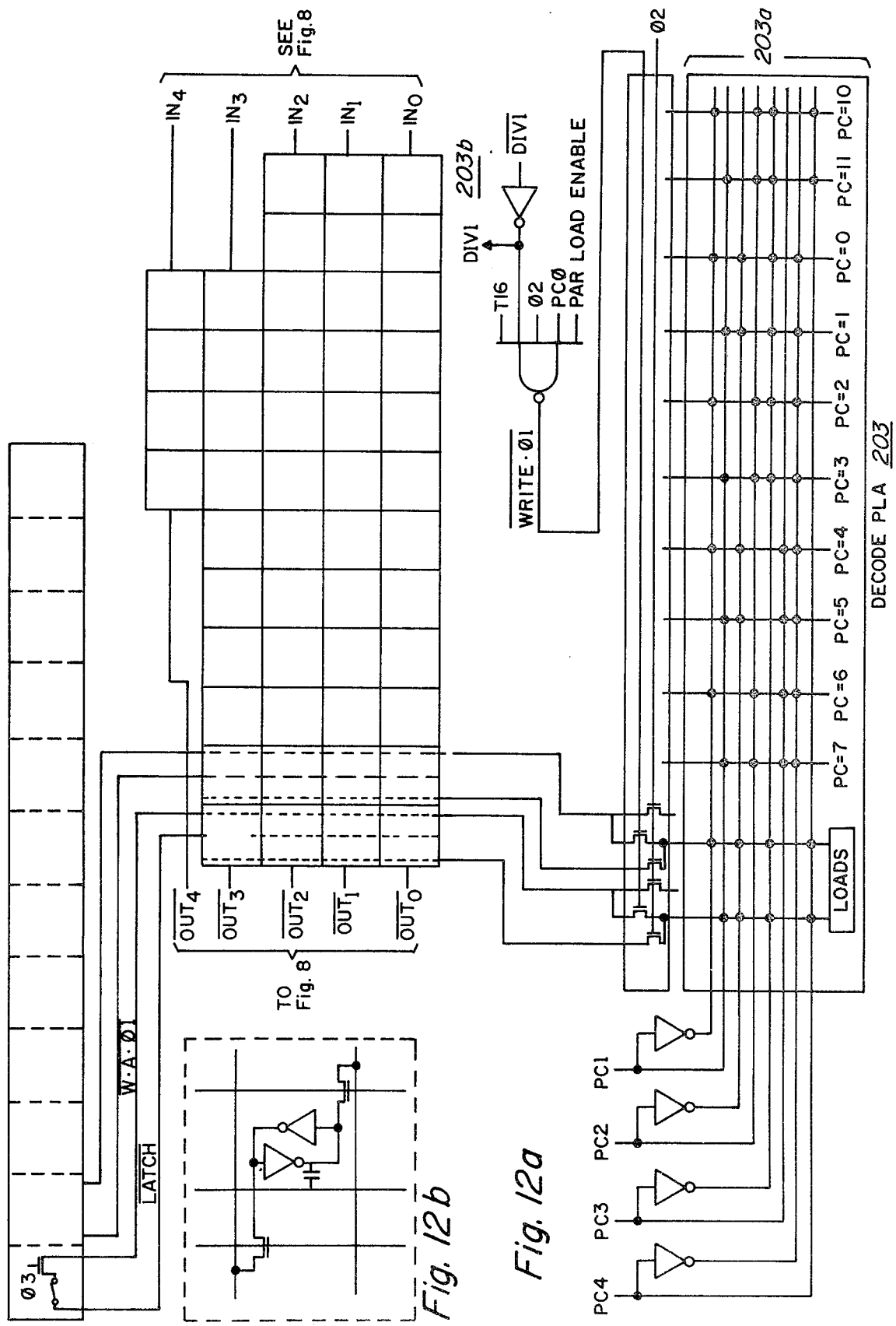

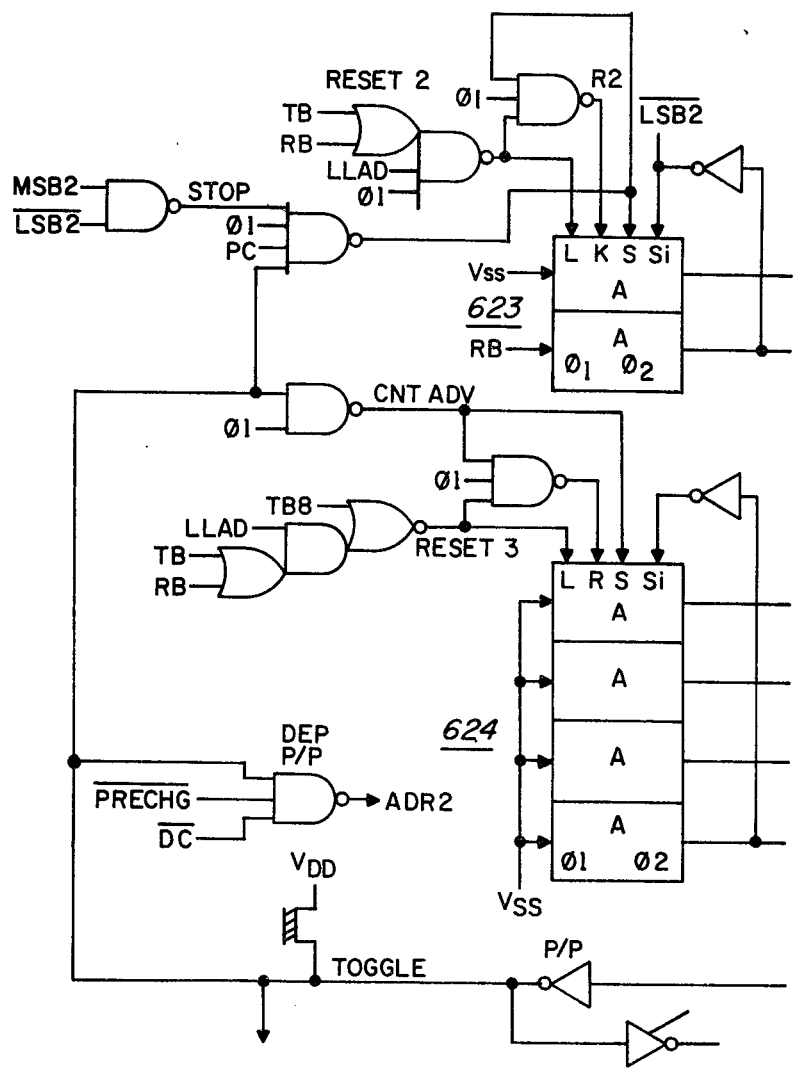
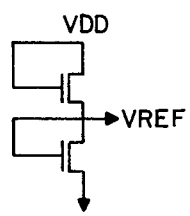
Fig. 20e

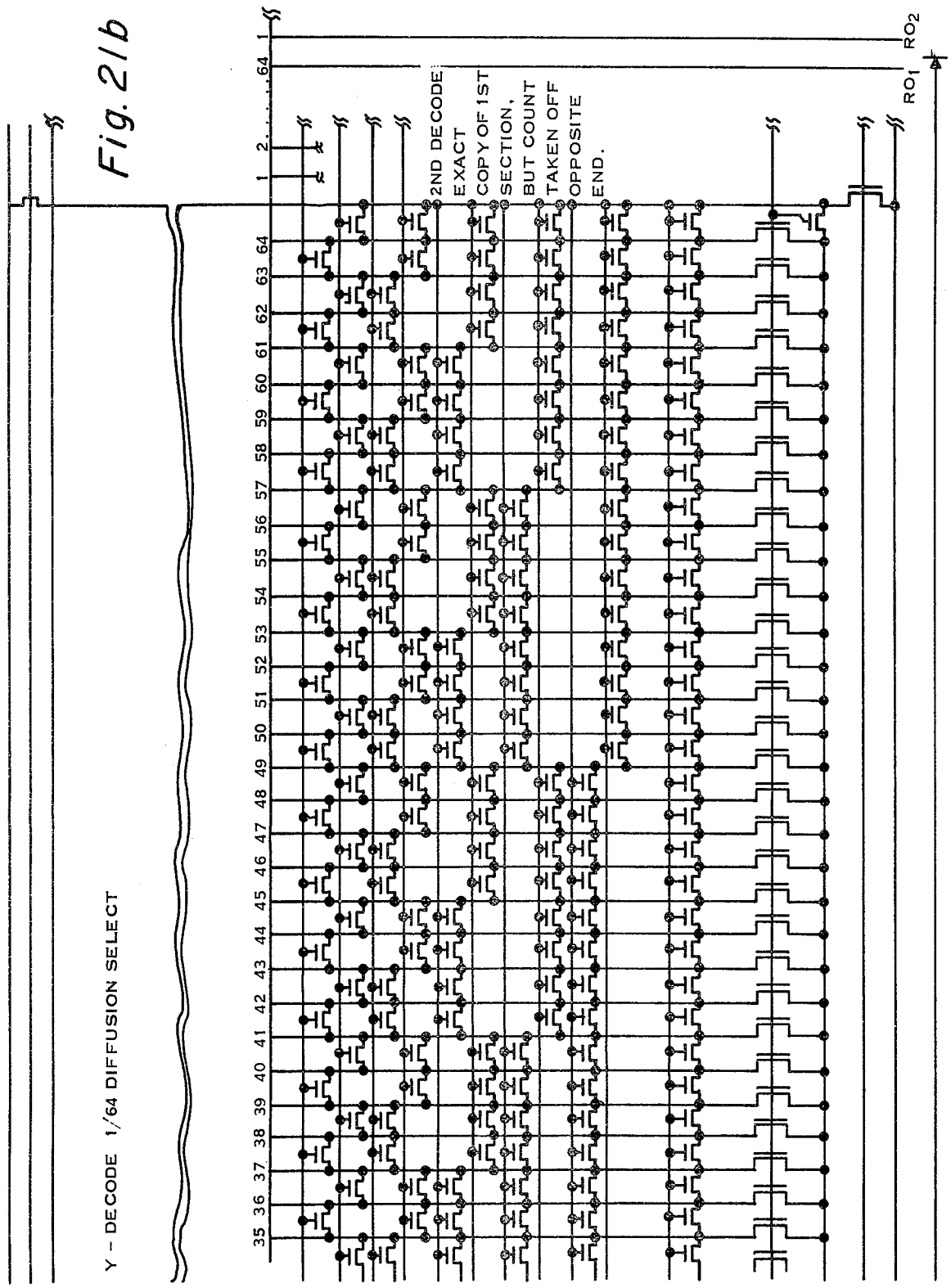

METHOD OF COMMUNICATING DIGITAL SPEECH DATA AND A MEMORY FOR STORING SUCH DATA

RELATED APPLICATIONS

This application is a division of U.S. Patent application Ser. No. 901,392, filed Apr. 28, 1978. The following additional applications are related to the instant application:

Patent application Ser. No. 901,391, filed Apr. 28, 1978 for an "Electronic Learning Aid or Game Having Synthesized Speech";

Patent application Ser. No. 901,395, filed Apr. 28, 1978 for a "Learning Aid or Game Having a Miniature Electronic Speech Synthesis Chip";

Patent application Ser. No. 901,393 filed Apr. 28, 1978 for a "Speech Synthesis Integrated Circuit Device";

Patent application Ser. No. 901,394 filed Apr. 28, 1978 for a "Parameter Interpolator for Speech Synthesis Circuit";

Patent application Ser. No. 901,151 filed Apr. 28, 1978 for a "Synchronous Method and Apparatus for Speech Synthesis Circuit";

Patent application Ser. No. 907,439, filed May 19, 1978 for a "Digital to Analog Converter"; and Patent application Ser. No. 907,365, filed May 19, 1978 for a "MOS Digital-to-Analog Driver".

BACKGROUND OF THE INVENTION

This invention relates to a method for communicating speech data to a speech synthesis circuit and preferably from a memory device.

Several techniques are known in the prior art for digitizing human speech. For example, pulse code modulation, differential pulse code modulation, adaptive predictive coding, data modulation, channel vocoders, cepstrum, vocoders, format vocoders, voice excited vocoders and linear predictive coding techniques of speech digitalization are known. These techniques are briefly explained in "Voice Signals: Bit by Bit" on pages 28-34 of the October 1973 issue of IEEE Spectrum.

Certain applications and particularly those in which the digitized speech is to be stored in a memory tend to use the Linear Predictive Coding technique because it produces very high quality speech using rather low data rates. Linear Predictive Coding systems usually make use of a multi-stage digital filter. In the past, such digital filters have typically been implemented by appropriately programming large scale digital computers. However, in U.S. Patent application Ser. No. 807,461, filed 6/17/77, there is taught a particularly useful digital filter for a speech synthesis circuit, which digital filter may be implemented on an integrated circuit using standard MOS or equivalent technology. A theoretical discussion of Linear Predictive Coding can be found in "Speech Analysis and Synthesis by Linear Prediction of the Speech Wave" at Volume 50, number 2 (part 2) of The Journal of the Acoustical Society of America.

Disclosed herein is a talking learning aid which utilizes speech synthesis technology for producing human speech. A complete talking learning aid is disclosed, so, in addition to describing the speech synthesis circuits in detail, this patent also discloses the details of the learning aid's controller and the Read-Only-Memory devices used to store the digitized speech. Of course, those practicing the present invention may wish to practice the invention in conjunction with a talking learning aid, such as that described herein, other learning aids or any other application wherein the generation of human speech from digital data is desirable. Using the techniques described in the aforementioned U.S. Patent application Ser. No. 807,461 and the teachings of this patent permit those desiring to make use of digital speech technology to do so with one, or a small number of relatively inexpensive integrated circuit devices.

As aforementioned, Linear Predictive Coding permits the synthesis of human speech from digital data having a relatively low data rate. For example, using ten bit parameters for speech energy, pitch and ten filter coefficients and by updating these twelve parameters fifty timer per second yields very high quality speech and only at a bit rate of 6000 bits per second (bps). Thus, if this data were stored in a 131 K bit Read-Only-Memory, then 21.8 seconds of human speech would be stored therein. However, if the bit rate could be dropped to an average of 1000-1200 bps then that 131 K bit Read-Only-Memory could store 109 to 131 seconds of spoken speech. The advantages of being able to lower the bit rate while maintaining the quality of the resulting speech are obvious since less Read-Only-Memory capacity is required to store a given amount of speech. Thus, the primary objective of this invention was to effect a reduction of the bit rate without unduly affecting quality.

The foregoing objects are achieved as is now described. Variable frame length data is provided to the speech synthesis circuit. Preferably, a full length frame includes a pitch parameter, an energy parameter, a repeat bit and a plurality of speech coefficients. Each parameter is encoded according to a preselected coding scheme and has a preselected length, the encoded parameter being longer as its significance in speech synthesis increases. A particular encoded pitch parameter is used to signify that the speech is unvoiced. An unvoiced frame includes fewer speech coefficients than does a regular voiced frame. A repeat bit preferably is used to signify that the frame contains pitch and energy parameters, but no speech coefficients. Thus, the frames may include all, a few or none of the speech coefficients. To further reduce the data rate, special encoded energy parameters preferably indicate that a frame is either a pause or the last frame sent.

The frames of speech data are preferably stored in a memory, such as a Read-Only-Memory. The data is communicated to the speech synthesis circuit in response to certain control signals applied as the Read-Only-Memory. In the disclosed embodiment, these control signals are generated by circuits disposed upon the same integrated circuit that the speech synthesis circuits are disposed.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of an illustrative embodiment when read in conjunction with the accompanying drawings, wherein

FIGS. 4a and 4b form a composite block diagram (when placed side by side) of the speech synthesizer chip;

FIGS. 12a and 12b are schematic diagrams of the parameter RAM;

FIGS. 21a and 21b form a composite logic diagram of the X and Y address decoders and the array of memory cells;

GENERAL DESCRIPTION

Figure 1:
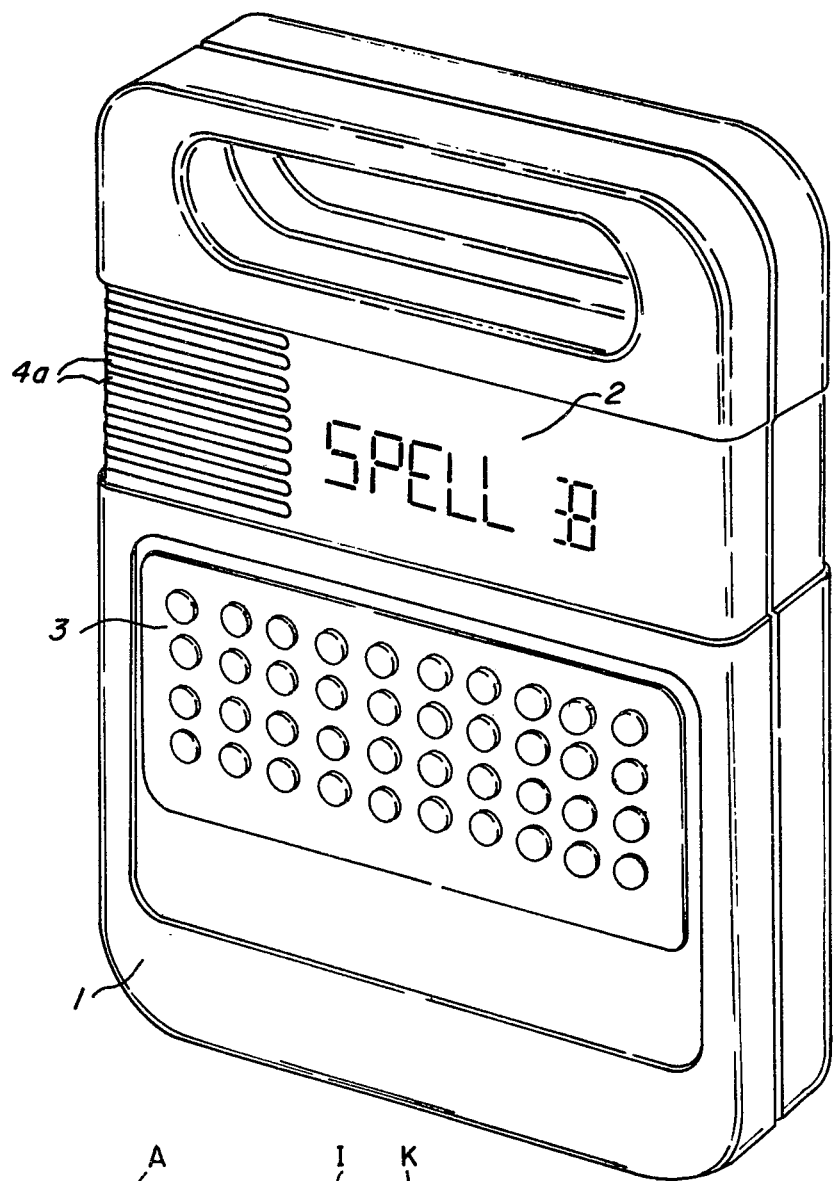
FIG. 1 is a front view of a talking learning aid.

FIG. 1 is a front view of a talking learning aid of the type which may embody the present invention. The learning aid includes a case 1 which encloses electronic circuits preferably implemented on integrated circuits (not shown in this figure). These circuits are coupled to a display 2, a keyboard 3 and a speaker 4 or other voice coil means (also not shown in FIG. 1). However, the openings 4a are shown behind which speaker 4 is preferably mounted. The display is preferably of the vacuum fluorescent type in the embodiment to be described; however, it will be appreciated by those skilled in the art that other display means, such as arrays of light emitting diodes, liquid crystal devices, electrochromic devices, gas discharge devices or other displays means alternatively may be used if desired. Also, in this embodiment, as a matter of design choice, the display has eight character positions. The keyboard 3 of the learing aid of this embodiment has forty key switch positions, twenty-six of which are used to input the letters of the alphabet into the learning aid. Of the remaining fourteen key switch positions, five are utilized for mode keys (on/spelling mode, learn mode, word guesser game mode, code breaker mode and random letter mode), another five are used to control functions performed by the learning aid in its modes (enter, say again, replay, erase and go) and the remaining four are used for an apostrophe key, a blank space key, a word list select key and an off key. The words spoken by the learning aid, as well as the correct spelling of those words, are stored as digital information in one or more Read-Only-Memories.

The learning aid depicted in FIG. 1 may be battery powered or powered from a source of external electrical power, as desired. The case is preferably made from injection molded plastic and the keyboard switches may be provided by two 5 by 8 arrays of key switches of the type disclosed in U.S. Pat. No. 4,005,293, if desired. Of course, other types of case materials or switches alternatively may be used.

Having described the outward appearance of the learning aid, the modes in which the learning aid may operate will be first described followed by a description of the block diagrams and detailed logic diagrams of the various electronic circuits used to implement the learning aid of FIG. 1.

MODES OF OPERATION

The learning aid of this embodiment has five modes of opertion which will be subsequently described. It will be evident to those skilled in the art, however, that these modes of operation may be modified, reduced in number or expanded in capability. As a matter of design choice, the present talking and learning aid is provided with the following modes of operation.

The first mode, the spelling mode, is automatically entered when the "on" key is depressed. In the spelling mode the learning aid randomly selects ten words from a selected word list and at a selected difficulty category within the selected word list. The word list may be changed by depressing the "word list select" key which is coupled to a software implemented flip flop circuit which flips each time the "word list select" key is depressed. The word list select flip flop then determines, as will be seen, which pair of read-only-memories from which the ten words will be randomly selected. Each word list preferably includes words arranged in four levels of difficulty. This embodiment of the learning automatically enters the least difficult level of difficulty. The fact that the least difficulty level has been selected is shown by displaying "SPELL A" in display 2. The level difficulty may be increased by depressing the B, C or D keys, and display 2 will show, in response, "SPELL B", "SPELL C" or "SPELL D", respectively. Having selected the word list and level difficulty, the "go" key is depressed upon which the learning aid commences to randomly select ten words and to say the word "spell" followed by the first randomly selected word. A dash, that being segment D in display 2 (FIG. 2), comes up in the left hand most character position. At this time the student may either (1) enter his or her spelling of the word and then depress the "enter" key or (2) depress the "say again" key. The student may also depress the "erase" key if he or she realizes that the spelling being inputted is incorrect before having depressed the "enter" key; the student may then again try to input the correct spelling. The "say again" key causes the word to be spoken by the learning aid again. In some embodiments a subsequent depression of the "say again" key may cause the selected word to be repeated once more, however, then at a slower rate. As the student enters his or her spelling of the word using the alphabet keys at keyboard 3, the inputted spelling appears at display 2 and the shifts from left to right as the letters are inputted. Following the depression the "enter" key, the learning aid compares the student's spelling with a correct spelling, which is stored in one of the Read-Only-Memories, and verbally indicates to the student whether the student spelling was correct or incorrect. The verbal response is also stored as digital information in a Read-Only-Memory. Of course, a visual response may likewise or alternatively be used, if desired. In this embodiment the student is given two opportunities to spell the word correctly and if the student has still failed to correctly spell the word, the learning aid then verbally (via speaker 4) and visually (via display 2) spells the word for the student and goes on to the next word from the group of ten randomly selected words.

At the end the test of the spelling of the ten randomly selected words, the learning aid then verbally and visually indicates the number of right and wrong answers. Further, in order to give the student additional reinforcement, the learning aid preferably gives a audible response which is a function of the correctness of the spellings. In this embodiment the learning aid plays a tune, the number of notes of which is a function of the correctness of the student's spellings for the group of selected words. The use of the "enter", "say again", "erase", and "go" function keys has just been described with reference to the spelling mode of operation. There is an additional function key, "replay", whose function has not yet been described. The "replay" key causes the learning aid to repeat the group of ten randomly selected words after the group has been completed or causes the learning aid to start over with the first word of the group of ten words if it is depressed during the progression through the group. Alternatively, at the end of a group of ten words, the student may depress the "go" which initiates the random selection of another group of ten words from the selected word list.

An exemplary set of spell mode problems is shown in Table I; exemplary key depressions, which a student might make during the exemplary set of problems, are listed along with the responses made by the learning aid at display 2 and speaker 4.

The learn mode is entered by depressing the "learn" key. In the learn mode, after the "go" key is depressed the learning aid randomly selects ten words from the selected word list at the selected difficulty level and then proceeds to display the first randomly selected word at display 2 and approximately one second later to speak "say it". Approximately two seconds thereafter the learning proceeds to pronounce the word shown in display 2. During this interval the student is given the opportunity to try to pronounce the word spelled at display 2; the learning aid then goes on to demonstrate how the word should be pronounced. After going through the ten randomly selected words the learning automatically returns to the aforementioned spell mode, but the ten words tested during the spell mode are the ten words previously presented during the learn mode. While in the learn mode the "say again", "erase", "repeat" and "enter" keys are invalid. The difficulty level is selected as in the spelling mode, but in the learn mode the learning aid displays the various levels as "SAY IT A", "SAY IT B", etc. Depressing the "go" key causes the learning aid to select another group of ten words in the learn mode. An exemplary set of learn mode problems are set forth in Table II.

The word guesser mode is entered by depressing the "word guesser" mode key. In the word guesser mode the learning aid randomly selected a word from the selected word list and displays dashes in a number of character positions at display 2, the number of character positions corresponding to the number of letters in the randomly selected word. Thus, if the learning aid randomly selects the word "course" for instance, then the dashes will appear in six of the eight character positions in display 2, starting with the left most position and proceeding to the right for six character positions. The dash is shown in the characters of the display by energizing the D segments in those character positions (see FIG. 2). The child may then proceed to enter his or her guesses of the letters in the randomly selected word by depressing the letter keys at keyboard 2. For a correct choice, the learning aid gives an audible response of four tones and shows every place the chosen letter occurs in the randomly selected word. Once letters have been correctly guessed, they remain in the display until the end of the game. For incorrect guesses the learning aid preferably makes no response, but may alternatively say something like "incorrect guess." In this embodiment the child is given six incorrect guesses. Upon the seventh incorrect guess the learning says "I win". On the other hand, if the child correctly guesses all the letters before making seven incorrect guesses the learning aid speaks "you win" and gives an audible response of four tones. Thus in the word guesser mode, the learning aid permits the child to play the traditional spelling game known as "hangman" either by himself or herself or along with other children. Exemplary word guesser problems are set forth in Table III.

The disclosed learning aid has another mode of operation known as "code breaker" which is entered by depressing the "code breaker" mode key. In this mode the child may enter any word of his or her choice and upon depressing the "enter key" the letters in the display are exchanged according to a predetermined code. Thus, in the code breaker mode the learning aid may be used to encode words selected by the child. Further in the code breaker mode the learning aid may be used to decode the encoded words by entering the encoded word and depressing the "enter key".

Another mode with which the learning aid may be provided is the "random letter" mode which is entered by depressing the "random letter" key. In the random letter mode the learning automatically displays in response to depression of the "go" key a randomly selected letter of the alphabet in the first character position of display 2. The letters of the alphabet occur in approximate proportion to as they occur in the english language; thus, the more commonly letters are displayed more frequently than uncommonly used letters. If the "go" key is again depressed then another randomly selected letter is displayed in the first character position and the previously selected letter moves right to the second character position and so forth in response to further depressions of the "random letter" key.

Figure 2:
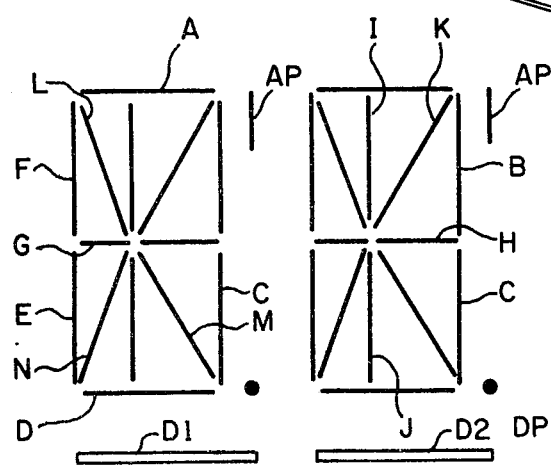
FIG. 2 depicts the segment details of the display.

Referring now to FIG. 2, there is shown a preferred arrangement of the segments of display 2. Display 2 preferably has eight character positions each of which is provided by a sixteen segment character has fourteen segments arranged somewhat like a "British flag" with an additional two segments for an apostrophe and a decimal point. In FIG. 2, segments a–n are arranged more or less in the shape of the "British flag" while segment ap provides apostrophe and segment dpt provides a decimal point. Segment conductors Sa through Sn, Sdp and Sap are respectively coupled to segments a through n, dpt and ap in the eight character positions of display 2. Also, for each character position, there is common electrode, labeled as D1–D8. When display 2 is provided by a vacuum flourescent display device, the segments electrodes are provided anodes in the vacuum flourescent display device while each common electrode is preferably provided by a grid associated with each character position. By appropriately multiplexing signals on the segment conductors (Sa–Sn, Sdpt and Sap) with signals on the character common electrodes (D1–D8) the display may be caused to show the various letters of the alphabet, a period, and an apostrophe and various numerals. For instance, by appropriately energizing segment conductors A,B,C,E and F when character common electrode D1 is appropriately energized the letter A is actuated in the first character position of display 2. Further, by appropriate strobing segment conductors A,B,C,D,H,I and J when character common electrode D2 is appropriately energized, the letter B is caused to be actuated in the second character position of display 2. It should be evident to those skilled in the art that the other letters of the alphabet as well as the apostrophe, period and numerals may be formed by appropriate energization of appropriate segment conductors and common electrodes. In operation, the character common electrodes D1–D8 are sequentially energized with an appropriate voltage potential as selected segment conductors are energized to their appropriate voltage potential to produce a display of characters at display 2. Of course, the segment electrodes could alternatively be sequentially energized as the digit electrodes are selectively energized in producing a display at display 2.

BLOCK DIAGRAM OF THE LEARNING AID

Figure 3:
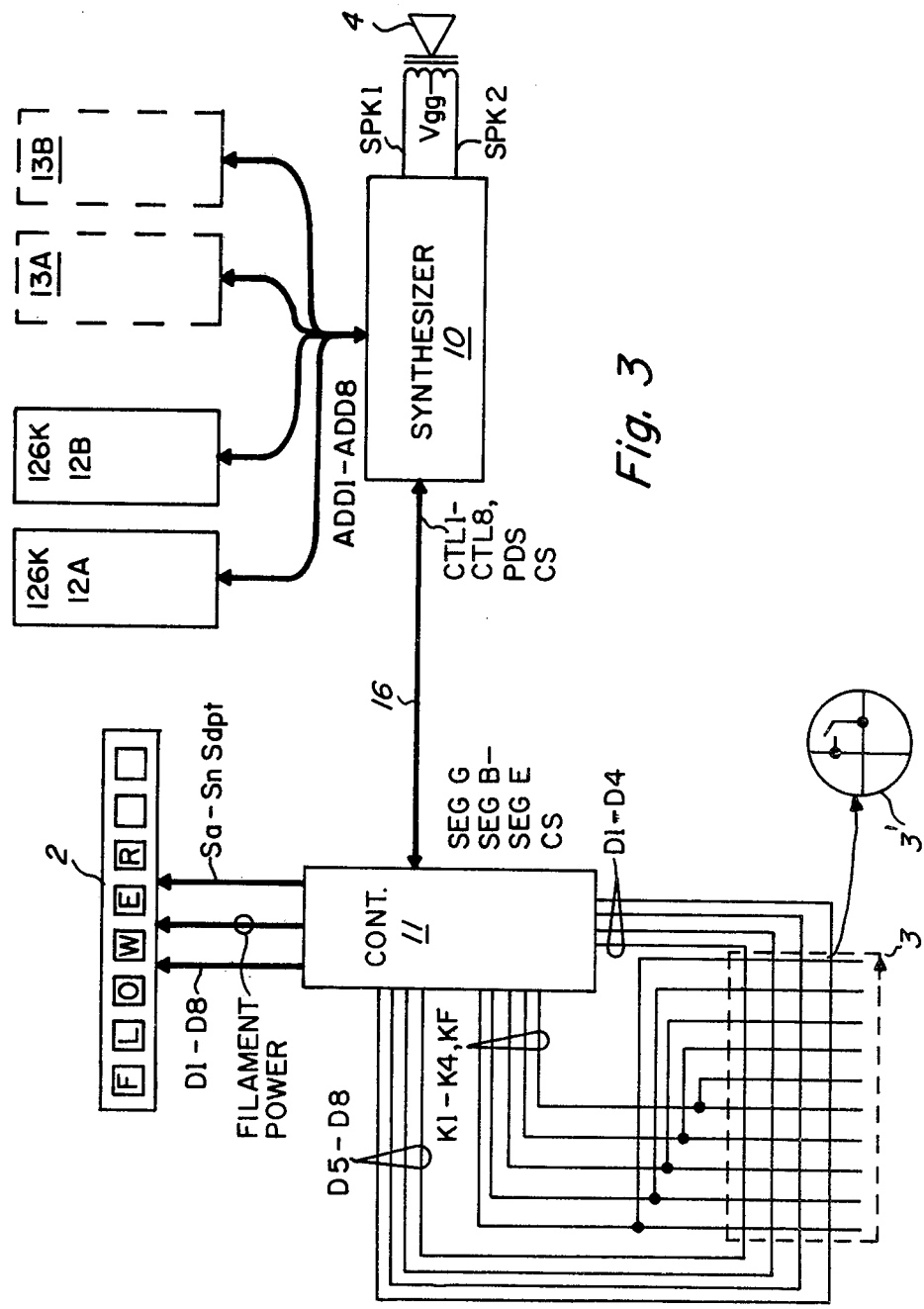
FIG. 3 is a block diagram of the major components preferably making up the learning aid.

FIG 3. is a block diagram of the major components making up the disclosed embodiment of a speaking learning aid. The electronics of the disclosed learning aid may be divided into three major functional groups, one being a controller 11, another being a speech synthesizer 10, and another being a read-only-memory (ROM) 12. In the embodiment disclosed, these major electronic functional groups are each integrated on separate integrated circuit chips except for the ROM functional group which is integrated onto two integrated circuit chips. Thus, the speech synthesizer 10 is preferably implemented on a single integrated circuit denoted by the box labeled 10 in FIG. 3 while the controller is integrated on a separate integrated circuit denoted by a box 11 in FIG. 3. The word list for the learning aid is stored in the ROM functional group 12, which stores both the correct spellings of the words as well as frames of digital coding which are converted by speech synthesizer 10 to an electrical signal which drives speaker or other voice coil means 4. In the embodiment disclosed, ROM functional group 12 is preferably provided with 262,144 bits of storage. As a matter of design choice, the 262,144 bits of data is divided between two separate read-only-memory chips, represented in FIG. 3 at numerals 12a and 12b. The memory capacity of ROM functional group 12 is a design choice; however, using the data compression features which are subsequentially discussed with reference to FIG. 6, the 262,144 bits of read-only-memory may be used to store on the order of 250 words of spoken speech and their correct spellings as well as various tones, praise phrases and correction phases spoken by the learning aid.

As is discussed with reference to FIG. 1, the "word list select" key causes the learning aid to select words from another word list. In FIG. 3, the basic word list used with the learning aid is stored in ROMs 12a and 12b along with their spelling and appropriate phraseology which the learning aid speaks during its different modes of operation. The second word list, which may be selected by depressing the "word list select" key, is preferably stored in another pair of ROMs 13a and 13b. In FIG. 3 these are depicted by dashed lines because these read-only-memories are preferably plugged into the learning aid by a person using the system (of course, when childred use the system it is preferable that an adult change the read-only-memories since children may not have the required manual dexterity) rather than normally packaged with the learning aid. In this manner many different "libraries" of word lists may be made available for use with the learning aid.

Of course, the number of chips on which the learning aid is implemented is a design choice and as large scale integration techniques are improved (using electron beam etching and other techniques), the number of integrated circuit chips may be reduced from four to as few as a single chip.

Synthesizer chip 10 is interconnected with the read-only-memories via data path 15 and is interconnected with controller 11 via data path 16. The controller 11, which may be provided by an appropriately programmed microprocessor type device, preferably actuates display 2 by providing segment information on segment conductors Sa–Sn, Sdpt and Sap along with character position information on connectors D1–D8. In the embodiment herein disclosed, controller 11 preferably also provides filament power to display 2 when a vacuum fluorescent device is used therefor. Of course, if a liquid crystal, electrochromographic, light emitting diode or gas discharge display were used such filament power would not be required. One technique for generating filament power on a controller chip is described in U.S. Patent application Ser. No. 843,017 filed Oct. 17, 1977. Controller 11 also scans keyboard 3 for detecting key depressions thereat. Keyboard 3 has forty switch positions which are shown in representative form in FIG. 3, the switch locations occurring where the conductors cross within the dashed line at numeral 3 in FIG. 3. A switch closure causes the conductors shown as crossing in FIG. 3 to be coupled together. At numeral 3' the switch occurring at a crossing of conductors at numeral 3 is shown in detail. In addition to actuatng display 2 and sensing key depression at keyboard 3, controller 11 also perform such functions as providing addresses for addressing ROMs 12a and 12b (via synthesizer 10), comparing the correct spellings from ROMs 12a or 12b with spellings inputted by a student at keyboard 3, and other such functions which will become apparent. Addresses from controller 11 are transmitted to ROMs 12a–b by synthesizer 10 because, as will be seen, synthesizer 10 preferably is equipped with buffers capable of addressing a plurality of read-only-memories. Preferably, only one of the pair of ROMs will output information in response to this addressing because of a chip select signal which is transmitted from synthesizer 10 to all the Read-Only-Memories. Controller 11, in this embodiment, transmits addresses to the ROMs via synthesizer 10 so that only synthesizer 10 output buffers need be sized to transmit addresses to a plurality of ROMs simultaneously. Of course, controller 11 output buffers could also be sized to transmit information to a plurality of read-only-memories simultaneously and thus in certain embodiments it may be desirable to also couple controller 11 directly to the ROMs.

As will be seen, synthesizer chip 10 synthesizes human speech or other sounds according to frames of data stored in ROMs 12a–12b or 13a–13b. The synthesizer 10 employs a digital lattice filter of the type described in U.S. Patent application Ser. No. 807,461, filed June 17, 1977. U.S. Patent application Ser. No. 807,461 since abandoned and continued in U.S. Patent application Ser. No. 905,328, filed May 12, 1978, is hereby incorporated herein by reference. The following discussion of the speech synthesizer assumes that the reader has a basic understanding of the operation of the lattice filter described in U.S. Patent application Ser. No. 807,461, since abandoned and continued in U.S. Patent application Ser. No. 905,328, filed May 12, 1978; therefore, the reader is encouraged to read that patent before delving into the following detailed discussion of the speech synthesizer. As will also be seen, synthesizer 10 also includes a digital to analog (D to A) converter for converting the digital output from the lattice filter to analog signals for driving speaker 4 or other voice coil means with those analog signals. Synthesizer 10 also includes timing, control and data storage and data compression systems which will be subsequently described in detail.

SYNTHESIZER BLOCK DIAGRAM

Figure 4B:
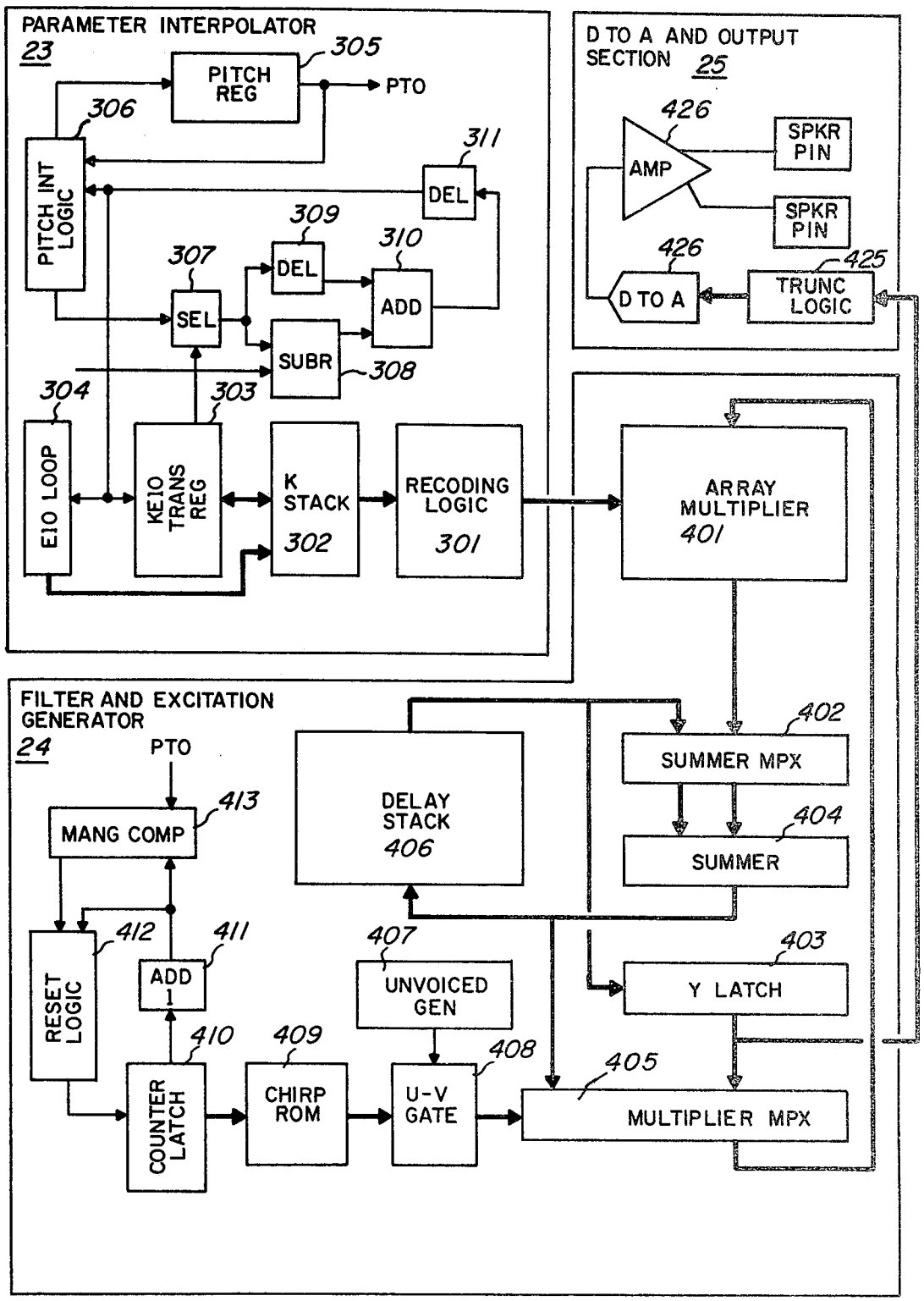

FIGS. 4a and 4b form a composite block diagram of the synthesizer 10. Synthesizer 10 is shown as having six major functional blocks, all but one of which are shown in greater detail in block diagram form in FIGS. 4a and 4b. The six major functional blocks are timing logic 10; ROM-Controller interface logic 21; parameter loading, storage and decoding logic 22; parameter interprelater 23; filter and excitation generator 24 and D to A and output section 25. Subsequentially, these major functional blocks will be described in detail with respect to FIGS. 5a–b, 6, 7a–b, 8a–c, 9a–b, 10a–d and 11a–b.

Rom/Controller Interface Logic

Referring again to FIGS. 4a and 4b, ROM/Controller interface logic 21 couples synthesizer 10 to read-only-memories 12a and 12b and to controller 11. The control 1-8 (CTL1-CTL8), chip select (CS) and processor data clock (PDC) pins are coupled, in this embodiment, to the controller while the address 1-8 (ADD1-ADD8) and instruction 0-1 (I0-I1) pins are connected to ROMs 12a and 12b (as well as ROMs 13a–13b, if used). ROM/Controller interface logic 21 sends address information from controller 11 to the Read-Only-Memories 12a–12b and preferably returns digital information from the ROMs back to the controller 11; logic 21 also brings data back from the ROMs for use by synthesizer 10 and initiates speech. A Chip Select (CS) signal enables tri-state buffers, such as buffers 213, and a three bit command latch 210. A Processor Data Clock (PDC) signal sets latch 210 to hold the data appearing at CTL1-CTL4 pins from the controller. Command latch 210 stores a three bit command from controller 11, which is decoded by command decoder 211. Command decoder 211 is responsive to eight commands which are: speak (SPK) or speak slowly (SPKSLOW) for causing the synthesizer to access data from the Read-Only-Memory and speak in response thereto either at a normal rate or at a slow rate; a reset (RST, command for resetting the synthesizer to zero; a test talk (TTALK) so that the controller can assertain whether or not the synthesizer is still speaking; a load address (LA) where four bits are received from the controller chip at the CTL1-CTL8 pins and transferred to the ROMs as an address digit via the ADD1-ADD8 pins and associated buffers 211; a read and branch (RB) command which causes the Read-Only-Memory to take the contents of the present and subsequent address and use that for a branch address; a read (RE) command which causes the Read-Only-Memory to output one bit of data on ADD1, which data shifts into a four bit data input register 212; and an output command which transfers four bits of data in the data input register 212 to controller 11 via buffers 213 and the CTL1-CTL8 pins. Once the synthesizer 10 has commenced speaking in response to a SPK or SPKSLOW command it continues speaking until ROM interface logic 21 encounters a RST command or an all ones gate 207 (see FIG. 7a–7b) detects an "energy equal to fifteen" code and resets talk latch 216 in response thereto. As will be seen, an "energy equal to 15" code is used as the last frame of data in a plurality of frames of data for generating words, phases or sentences. The LA, RE and RB commands decoded by decoder 211 are re-encoded via ROM control logic 217 and transmitted to the read-only-memories via the instruction (I0-I1) pins.

The processor Data Clock (PDC) signal serves other purposes than just setting latch 210 with the data on CTL1-CTL4. It signals that an address is being transferred via CTL1-CTL8 after an LA or output command has been decoded or that the TTALK test is to be performed and outputted on pin CTL8. A pair of latches 218A and B (FIGS. 7a–7b) associated with decoder 211 disable decoder 211 when the aforementioned LA, TSTTALK and OUTPUT commands have been decoded and a subsequent PDC occurs so that the data then on pins CTL1-CTL8 is not decoded.

A TALK latch 216 is set in response to a decoded SPK or SPKSLW command and is reset: (1) during a power up clear (PUC) which automatically occurs whenever the synthesizer is energized; (2) by a decoded RST command or (3) by an "energy equals fifteen" code in a frame of speech data. The TALKD output is delayed output to permit all speech parameters to be inputed into the synthesizer before speech is attempted. The talk slow latch 215 is set in response to a decoded SPKSLOW command and reset in the same manner as latch 216. The SLOWD output is similarly a delayed output to permit all the parameters to be inputted into the synthesizer before speech is attempted.

Parameter Loading, Storage and Decoding Logic

The parameter loading, storage and decoding logic 22 includes a six bit long parameter input register 205 which receives serial data from the read-only-memory via pin ADD1 in response to a RE command outputted to the selected read-only-memory via the instruction pins. A coded parameter random access memory (RAM) 203 and condition decoders and latches 208 are connected to receive the data inputted into the parameter input register 205. As will be seen, each frame of speech data is inputted in three to six bit portions via parameter input register 205 to RAM 203 in a coded format where the frame is temporarily stored. Each of the coded parameters stored in RAM 203 are converted to a ten bit parameter by parameter ROM 202 and temporarily stored in a parameter output register 201.

As will be discussed with respect to FIG. 6, the frame of data may be either wholly are partially inputted into parameter input register 205, depending upon the length of the particular frame being inputted. Condition decoders and latches 208 are responsive to particular portions of the frame of data for setting repeat, pitch equal zero, energy equal zero, old pitch and old energy latches. The function of these latches will be discussed subsequently with respect to FIGS. 7a–7b. The condition decoders and latches 208 as well as various timing signals are used to control various interpolation control gates 209. Gates 209 generate an inhibit signal when interpolation is to be inhibited, a zero parameter signal when the parameter is to be zeroed and a parameter load enable signal which, among other things, permits data in parameter input register 205 to be loaded into the coded parameter RAM 203.

Parameter Interpolater

The parameters in parameter output registers 201 are applied to the parameter interpolator functional block 23. The inputted K1-K10 speech parameters, including speech energy are stored in a K-stack 302 and E10 loop 304, while the pitch parameter is stored in a pitch register 305. The speech parameters and energy are applied via recording logic 301 to array multiplier 401 in the filter and excitation generator 24. As will be seen, however, when a new parameter is loaded into parameter output register 201 it is not immediately inserted into K-stack 302 or E10 loop 34 or register 305 but rather the corresponding value in K-stack 302, E10 loop 304 or register 305 goes through eight interpolation cycles during which a portion of the difference between the present value in the K-stack, E10 loop 305 or register 305 and the target value of that parameter in parameter output register 201 is added to the present value in K-stack 203, E10 loop 304 or register 305.

Essentially the same logic circuits are used to perform the interpolation of pitch, energy and the K1-K10 speech parameters. The target value from the parameter output register 201 is applied along with the present value of the corresponding parameter to a subtractor 308. A selector 307 selects either the present pitch from pitch logic 306 or present energy or K coefficient data from KE10 transfer register 303, according to which parameter is currently in parameter output register 201, and applies the same to subtractor 308 and a delay circuit 309. As will be seen, delay circuit 309 may provide anywhere between zero delay to three bits of delay. The output of delay circuit 309 as well as the output of subtractor 308 is supplied to an adder 310 whose output is applied to a delay circuit 311. When the delay associated with delay circuit 309 is zero the target value of the particular parameter in parameter output register 201 is effectively inserted into K-stack 302, E10 loop 304 or pitch register 305, as is appropriate. The delay in delay circuit 311 is three to zero bits, being three bits when the delay in the delay circuit 309 is zero bits, whereby the total delay through selector, 307 delay, 309 and 311, adder 310 and subtractor 308 is constant. By controlling the delays in delay circuit 309 and 311, either all, ½, ¼ or ⅛ of the difference outputted from subtractor 308 (that being the difference between the target value and the present value) is added back into the present value of the parameter. By controlling the delays in the fashion set forth in Table IV, a relatively smooth eight step parameter interpolation is accomplished.

U.S. Patent application Ser. No. 807,461, since abandoned and continued in U.S. Patent application Ser. No. 905, 328, filed May 12, 1978, discusses with reference to FIG. 7 thereof a speech synthesis filter wherein speech coefficients K1-K9 are stored in the K-stack continuously, until they are updated, while the K10 coefficient and the speech energy (referred to by the letter A in U.S. Patent application Ser. No. 807,461, since abandoned and continued in U.S. Patent application Ser. No. 905,328, filed May 12, 1978) are periodically exchanged. In parameter interpolator 23, speech coefficients K1-K9 are likewise stored in stack 302, until they are updated, whereas the energy parameter and the K10 coefficient effectively exchange places in K-stack 302 during a twenty time period cycle of operations in the filter and excitation generator 24. To accomplish this function, E10 loop 304 stores both the energy parameter and the $K_{10}$ coefficient and alternately inputs the same into the appropriate location in K-stack 302. KE10 transfer register 303 is either loaded with the K10 or energy parameter from E10 loop 304 or the appropriate K1-K9 speech coefficient from K-stack 302 for interpolation by logics 307-311.

As will be seen, recoding logic 301 preferably performs a Booth's algorithm on the data from K-stack 302, before such data is applied to array multiplier 401. Recoding logic 301 thereby permits the size of the array multiplier 401 to be reduced compared to the array multiplier described in U.S. Patent application Ser. No. 807,461, since abandoned and continued in U.S. Patent application Ser. No. 905,328, filed May 12, 1978.

Filter and Excitation Generator

The filter excitation generator 24 includes the array multiplier 401 whose output is connected to a summer multiplexer 402. The output of summer multiplexer 402 is coupled to the input of summer 404 whose output is coupled to a delay stack 406 and multiplier multiplexer 405. The output of the delay stack is applied as an input to summer multiplexer 402 and to Y latch 403. The output of Y latch 403 is coupled to an input of multiplier multiplexer 405 along with truncation logic 501. The output of multiplier multiplexer 405 is applied as an input to array multiplier 401. As will be seen filter and excitation generator 24 make use of the lattice filter described in U.S. Patent application Ser. No. 807,461, since abandoned and continued in U.S. Patent application Ser. No. 905,328, filed May 12, 1978. Various minor interconnections are not shown in FIG. 4b for sake of clarity, but which will be described with reference to FIGS. 10a, 10b, 11a and 11b. The arrangement of the foregoing elements generally agrees with the arrangement shown in FIG. 7 of U.S. Patent application Ser. No. 807,461, since abandoned and continued in U.S. Patent application Ser. No. 905,328, filed May 12, 1978; thus array multiplier 401 corresponds to element 30', summer multiplexer 402 corresponds to elements 37b', 37c' and 37d', gates 414 (FIGS. 11a and 11b) correspond to element 33', delay stack 406 corresponds to elements 34' and 35', Y latch 403 corrresponds to element 36' and multiplier multiplexer 405 corresponds to elements 38a', 38b', 38c' and 38d'.

The voice excitation data is supplied from unvoiced/voice gate 408. As will be subsequently described in greater detail, the parameters inserted into parameter input gate 205 are supplied in a compressed data format.

According to the data compression scheme used, when the coded pitch parameter is equal zero in input register 205, it is interpreted as an unvoiced condition by condition decoders and latches 208. Gate 408 responds by supplying randomized data from unvoiced generator 407 as the excitation input on line 414. When the coded pitch parameter is of some other value, however, it is decoded by parameter ROM 202, loaded into parameter output register 201 and eventually inserted into pitch register 305, either directly or by the interpolation scheme previously described. Based on the period indicated by the number in pitch register 305, voiced excitation is derived from chirp ROM 409. As discussed in U.S. Patent application Ser. No. 807,461, since abandoned and continued in U.S. Patent application Ser. No. 905,328, filed May 12, 1978, the voiced excitation signal may be an impulse function or some other repeating function such as a repeating chirp function. In this embodiment, a chirp has been selected as this tends to reduce the "fuzziness" from the speech generated (because it apparently more closely models the action of the vocal cards than does a impulse function) which chirp is repetitively generated by chirp ROM 409. Chirp ROM 409 is addressed by counter latch 410, whose address is incremented in an add one circuit 411. The address in counter latch 410 continues to increment in add one circuit 411, recirculating via reset logic 412 until magnitude comparator 413, which compares the magnitude of the address being outputted from add one circuit 411 and the contents of the pitch register 305, indicates that the value in counter latch 410 then compares with or exceeds the value in pitch register 305, at which time reset logic 412 zeroes the address in counter 410. Beginning at address zero and extending through approximately fifty addresses is the chirp function in chirp ROM 409. Counter latch 410 and chirp ROM 409 are set up so that addresses larger than fifty do not cause any portion of the chirp function to be outputted from chirp ROM 409 to UV gate 408. In this manner the chirp function is repetitively generated on a pitch related period during voiced speech.

SYSTEM TIMING

Figure 5:
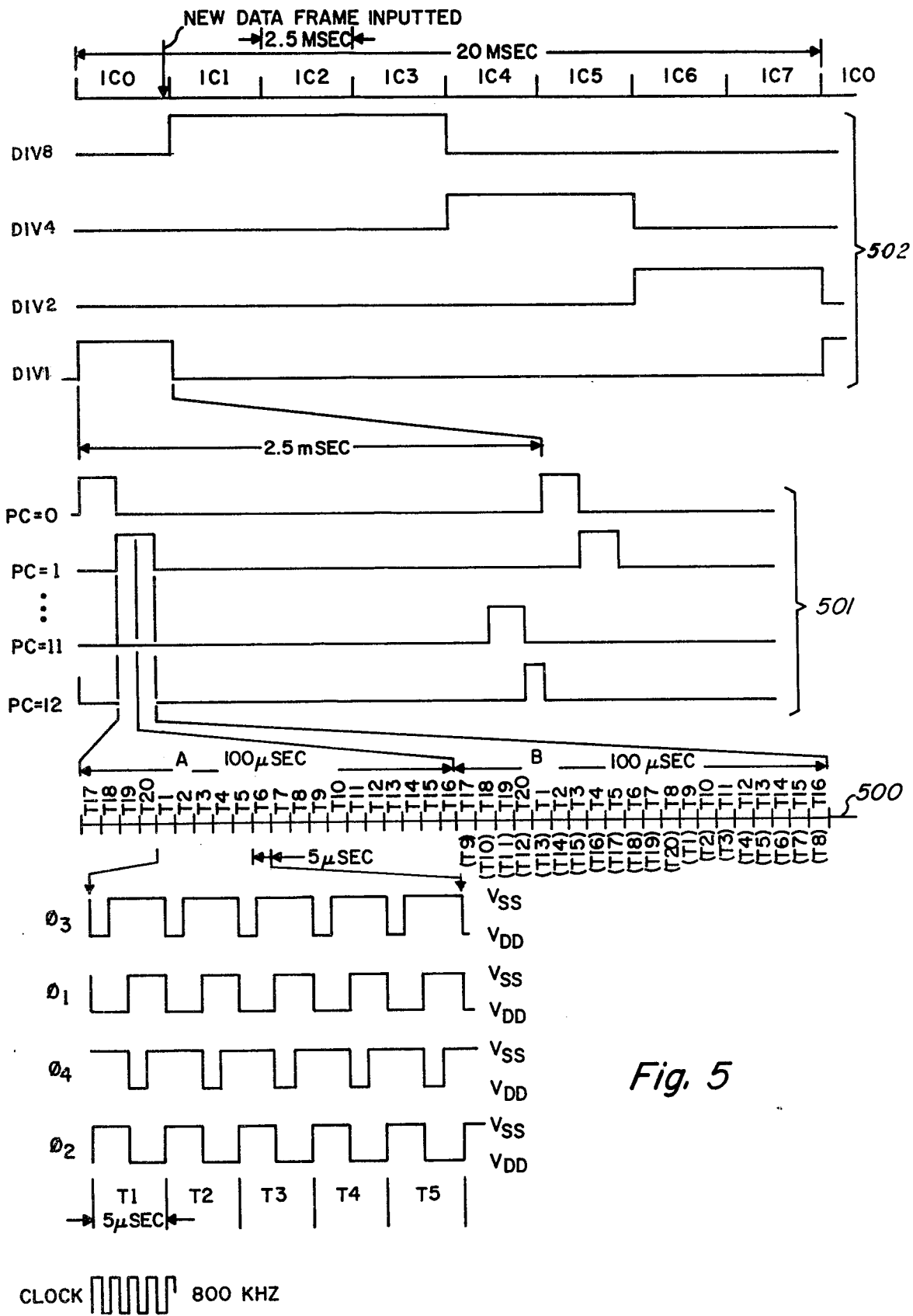
FIG. 5 is a timing diagram of various timing signals preferably used on the synthesizer.

FIG. 5 depicts the timing relationships between the occurrences of the various timing signals generated on synthesizer chip 10. Also depicted are the timing relationships with respect to the time new frames of data are inputted to synthesizer chip 10, the timing relationship with respect to the interpolations performed on the inputted parameters, the timing relations with respect to the foregoing with the time periods of the lattice filter and the relationship of all the foregoing to the basic clock signals.

The synthesizer is preferably implemented using precharged, conditional discharge type logics and therefore FIG. 5 shows clocks $\phi1-\phi4$, which may be appropriately used with such precharge-conditional discharge logic. There are two main clock phases ($\phi1$ and $\phi2$) and two precharge clock phases ($\phi3$ and $\phi4$). Phase $\phi3$ goes low during the first half of phase $\phi1$ and serves as a precharge therefor. Phase $\phi4$ goes low during the first half of phase $\phi2$ and serves as a precharge therefore. A set of clocks $\phi1-\phi4$ required to clock one bit of data and thus correspond to one time period.

The time periods are labeled T1-T20 and each preferably has a time period on the order of five microseconds. Selecting a time period on the order of five microseconds permits, as will be seen, data to be outputted from the digital filter at a ten kilohertz rate (i.e., at a 100 microsecond period) which provides for a frequency response of five kilohertz in the D to A output section 25 (FIG. 4b). It will be appreciated by those skilled in the art, however, that depending on the frequency response which is desired and depending upon the number of Kn speech coefficients used, and also depending upon the type of logics used, that the periods or frequencies of the clocks and clock phases shown in FIG. 5 may be substantially altered, if desired.

As is explained in U.S. Patent application Ser. No. 807,461, since abandoned and continued in U.S. Patent application Ser. No. 905,328, filed May 12, 1978, one cycle time of the lattice filter in filter excitation generator 24, preferably comprises twenty time periods, T1-T20. For reasons not important here, the numbering of these time periods differs between this application and U.S. Patent application Ser. No. 807,461, since abandoned and continued in U.S. Patent application Ser. No. 905,328, filed May 12, 1978. To facilitate the reader's understanding of the differences in the numbering of the time periods, both numbering schemes are shown at the time period time line 500 in FIG. 5. At time line 500, the time periods, T1-T20 which are not enclosed in parenthesis identify the time periods according to the convention used in this application. On the other hand, the time periods convention are as used in U.S. Patent application Ser. No. 807,461, since abandoned and continued in U.S. Patent application Ser. No. 905,328, filed May 12, 1978. Thus, time period T17 is equivalent to time period (T9).

At numeral 501 is depicted the parameter count (PC) timing signals. In this embodiment there are thirteen PC signals, PC=0 through PC=12. The first twelve of these, PC=0 through PC=11 correspond to times when the energy, pitch, and K1-K10 parameters, respectively, are available in parameter output register 201. Each of the first twelve PC's comprise two cycles, which are labeled A and B. Each such cycle starts at time period T17 and continues to the following T17. During each PC the target value from the parameter output register 201 is interpolated with the existing value in K-stack 302 in parameter interpolator 23. During the A cycle, the parameter being interpolated is withdrawn from the K-stack 302, E10 loop 304 or register 305, as appropriate, during an appropriate time period. During the B cycle the newly interpolated value is reinserted in the K-stack (or E10 loop or pitch register). The thirteenth PC, PC=12, is provided for timing purposes so that all twelve parameters are interpolated once each during a 2.5 milliseconds interpolation period.

As was discussed with respect to the parameter interpolator 23 of FIG. 4b and Table IV, eight interpolations are performed for each inputting of a new frame of data from ROMs 12a-b into synthesizer 10. This is seen at numeral 502 of FIG. 5 where timing signals DIV 1, DIV 2, DIV 4 and DIV 8 are shown. These timing signals occur during specific interpolation counts (IC) as shown. There are eight such interpolation counts, IC0-IC7. New data is inputted from the ROMs 12a-b into the synthesizer during IC0. These new target values of the parameters are then used during the next eight interpolation counts, IC1 through IC0; the existing parameters in the pitch register 305 K-stack 302 and E10 loop 304 are interpolated once during each interpolation count. At the last interpolation count, IC0, the present value of the parameters in the pitch register 305, K-stack 302 and E10 loop 304 finally attain the target values previously inputted toward the last IC0 and thus new target values may then again be inputted as a new frame of data. Inasmuch as each interpolation count has a period of 2.5 milliseconds, the period at which new data frames are inputted to the synthesizer chip is 20 microseconds or equivalent to a frequency of 50 hertz. The DIV 8 signal corresponds to those interpolation counts in which one-eighth of the difference produced by subtractor 308 is added to the present values in adder 310 whereas during DIV 4 one-fourth of the difference is added in, and so on. Thus, during DIV 2, ½ of the difference from subtractor 308 is added to the present value of the parameter in adder 310 and lastly during DIV 1 the total difference is added in adder 310. As has been previously mentioned, the effect of this interpolation scheme can be seen in Table IV.

PARAMETER DATA COMPRESSION

It has been previously mentioned that new parameters are inputted to the speech synthesizer at a 50 hertz rate. It will be subsequently seen that in parameter interpolator and excitation generator 24 (FIG. 4b) the pitch data, energy data and K1-Kn parameters are stored and utilized as ten bit digital binary numbers. If each of these twelve parameters were updated with a ten bit binary number at a fifty hertz rate from an external source, such as ROMs 12a and 12b, this would require a 12×10×50 or 6,000 hertz bit rate. Using the data compression techniques which will be explained, we reduce this bit rate required for synthesizer 10 to on the order of 1,000 to 1,200 bits per second. And more importantly, it has been found that the speech compression schemes herein disclosed do not appreciably degrade the quality of speech generated thereby in comparison to using the data uncompressed.

Figure 6:
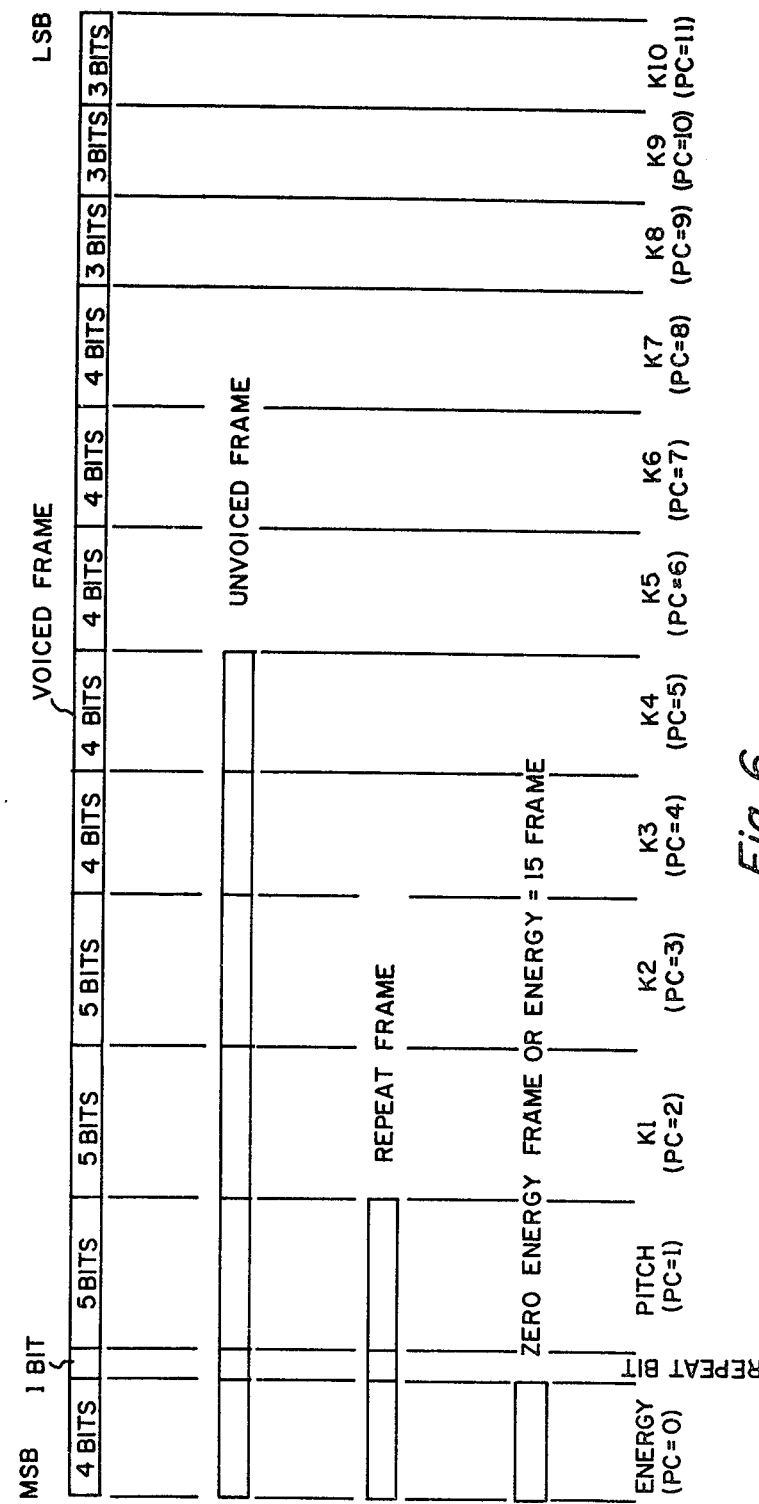
FIG. 6 pictorially shows the data compression scheme preferably used to reduce the data rate required by the synthesizer.

The data compression scheme used is pictorially shown in FIG. 6. Referring now to FIG. 6, it can be seen that there is pictorially shown four different lengths of frames of data. One, labeled voiced frame, has a length of 49 bits while another entitled unvoiced frame, has a length of 28 bits while still another called "repeat frame" has a length of ten bits and still another which may be alternatively called zero energy frame or energy equals fifteen frame has the length of but four bits. The "voiced frame" supplies four bits of data for a coded energy parameter as well as coded four bits for each of five speech parameters K3 through K7. Five bits of data are reserved for each of three coded parameters, pitch, K1 and K2. Additionally, three bits of data are provided for each of three coded speech parameters K8-K10 and finally another bit is reserved for a repeat bit.

In lieu of inputting ten bits of binary data for each of the parameters, a coded parameter is inputted which is converted to a ten bit parameter by addressing parameter ROM 202 with the coded parameter. Thus, coefficient K1, for example, may have any one of thirty-two different values, according to the five bit code for K1, each one of the thirty-two values being a ten bit numerical coefficient stored in parameter ROM 202. Thus, the actual values of coefficients K1 and K2 may have one of thirty-two different values while the actual values of coefficients K3 through K7 may be one of sixteen different values and the values of coefficients K8 through K9 may be one of eight different values. The coded pitch parameter is five bits long and therefore may have up to thirty-two different values. However, only thirty-one of these reflect actual pitch values, a pitch code of 00000 being used to signify an unvoiced frame of data. The coded energy parameter is four bits long and therefore would normally have sixteen available ten bit values; however, a coded energy parameter equal to 0000 indicates a silent frame such as occur as pauses in and between words, sentences and the like. A coded energy parameter equal to 1111 (energy equals fifteen), on the other hand, is used to signify the end of a segment of spoken speech, thereby indicating that the synthesizer is to stop speaking. Thus, of the sixteen codes available for the coded energy parameter, fourteen are used to signify different ten bit speech energy levels.

Coded coefficients K1 and K2 have more bits than coded coefficients K3-K7 which in turn have more bits than coded coefficients K8 through K10 because coefficient K1 has a greater effect on speech than K2 which has a greater effect on speech than K3 and so forth through the lower order coefficients. Thus given the greater significance of coefficients K1 and K2 than coefficients K8 through K10, for example, more bits are used in coded format to define coefficients K1 and K2 than K3-K7 or K8-K10.

Also it has been found that voiced speech data needs more coefficients to correctly model speech than does unvoiced speech and therefore when unvoiced frames are encountered, coefficients K5 through K10 are not updated, but rather are merely zeroed. The synthesizer realized when an unvoiced frame is being outputted because the uncoded pitch parameter is equal to 00000.

It has also been found that during speech there often occur instances wherein the parameters do not significantly change during a twenty millisecond period; particularly, the K1-K10 coefficients will often remain nearly unchanged. Thus, a repeat frame is used wherein new energy and new pitch are inputted to the synthesizer, however, the K1-K10 coefficients previously inputted remain unchanged. The synthesizer recognizes the ten bit repeat frame because the repeat bit between energy and pitch then comes up whereas it is normally off. As previously mentioned, there occur pauses between speech or at the end of speech which are preferably indicated to the synthesizer; such pauses are indicated by a coded energy frame equal to zero, at which time the synthesizer recognizes that only four bits are to be sampled for that frame. Similarly, only four bits are sampled when an "energy equals fifteen."

Using coded values for the speech in lieu of actual values, alone would reduce the data rate to 48×50 or 2400 bits per second. By additionally using variable frame lengths, as shown in FIG. 6, the data rate my be further reduced to on the order of one thousand to twelve hundred bits per second, depending on the speaker and on the material spoken.

The effect of this data compression scheme can be seen from Table V where the coding for the word "HELP" is shown. Each line represents a new frame of data. As can be seen, the first part of the word "HELP", "HEL", is mainly voiced while the "P" is unvoiced. Also note the pause between "HEL" and "P" and the advantages of using the repeat bit. Table VI sets forth the encoded and decoded speech parameter. The 3, 4 or 5 bit code appears as a hexadecimal number in the left-hand column, while the various decoded parameter values are shown as ten bit, two's complement numbers expressed as hexadecimal numbers in tabular form under the various parameters. The decoded speech parameter are stored in ROM 203. The repeat bit is shown in Table V between the pitch and K parameters for sake of clarity; preferably, according to the embodiment of FIG. 6, the repeat bit occurs just before the most significant bit (MSB) of the pitch parameter.

SYNTHESIZER LOGIC DIAGRAMS

The various portions of the speech synthesizer of FIGS. 4a and 4b will now be described with reference to FIGS. 7a through 14b which, depict, in detail, the logic circuits implemented on a semiconductor chip, for example, to form the synthesizer 10. The following discussion, with reference to the aforementioned drawings, refers to logic signals available at many points in the circuit. It is to be remembered that in P channel MOS devices a logical zero corresponds to a negative voltage, that is, Vdd, while a logical one refers to a zero voltage, that is, Vss. It should be further remembered that P-channel MOS transistors depicted in the aforementioned figures are conductive when a logical zero, that is, a negative voltage, is applied at their respective gates. When a logic signal is referred to which is unbarred, that is, has no bar across the top of it, the logic signal is to be interpreted as "TRUE" logic; that is, a binary one indicates the presence of the signal (Vss) whereas a binary zero indicates the lack of the signal (Vdd). Logic signal names including a bar across the top thereof are "FALSE" logic; that is, a binary zero (Vdd voltage) indicates the presence of the signal whereas a binary one (Vss voltage) indicates that the signal is not present. It should also be understood that a numeral three in clocked gates indicates that phase $\phi 3$ is used as a precharge whereas a four in a clocked gate indicates that phase $\phi 4$ is used as a precharge clock. An "S" in the gate indicates that the gate is statically operated.

Timing Logic Diagram

Figure 7A:
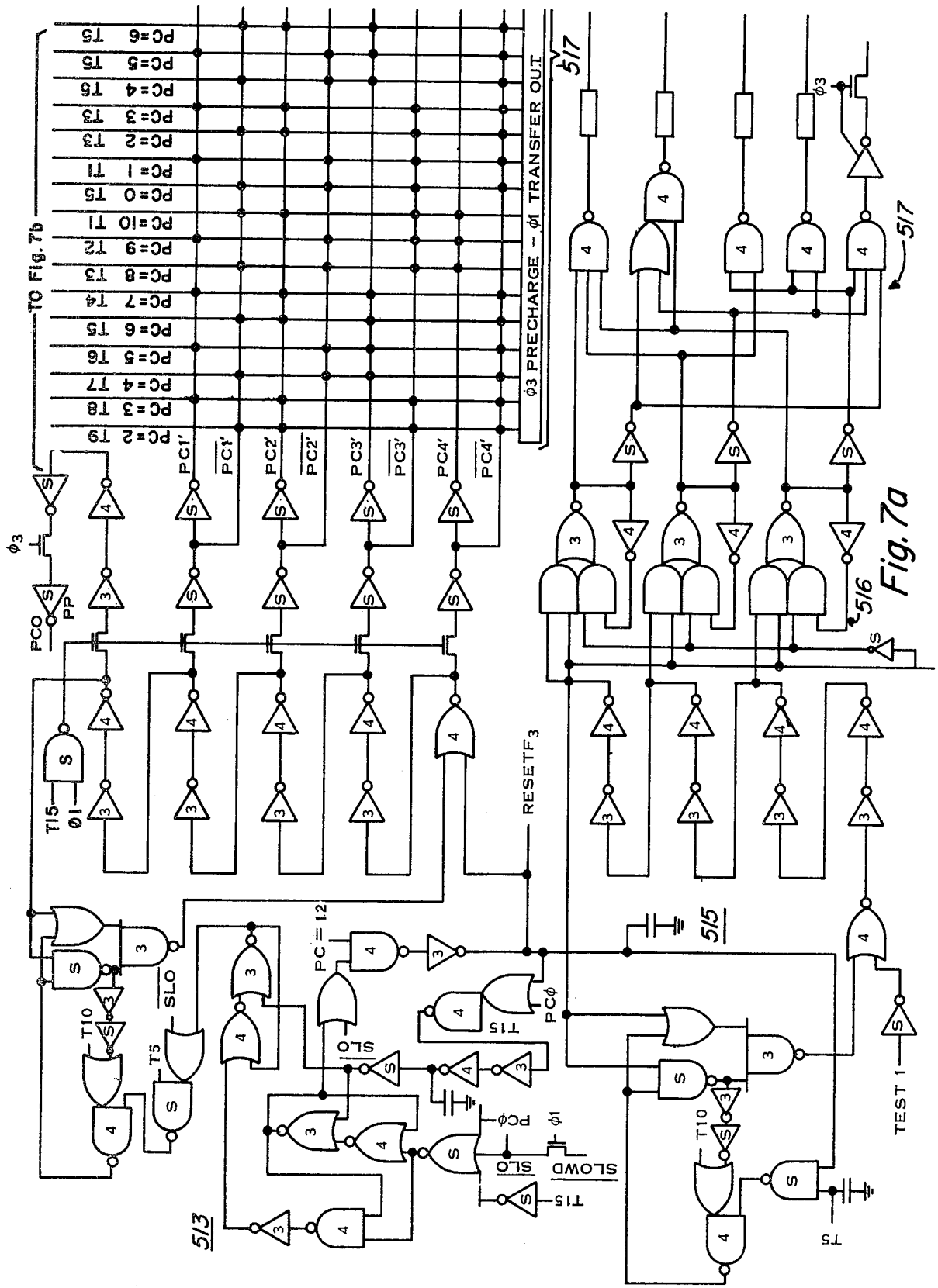
FIGS. 7a and 7b form a composite logic diagram of the synthesizer's timing circuits.
Figure 7A:
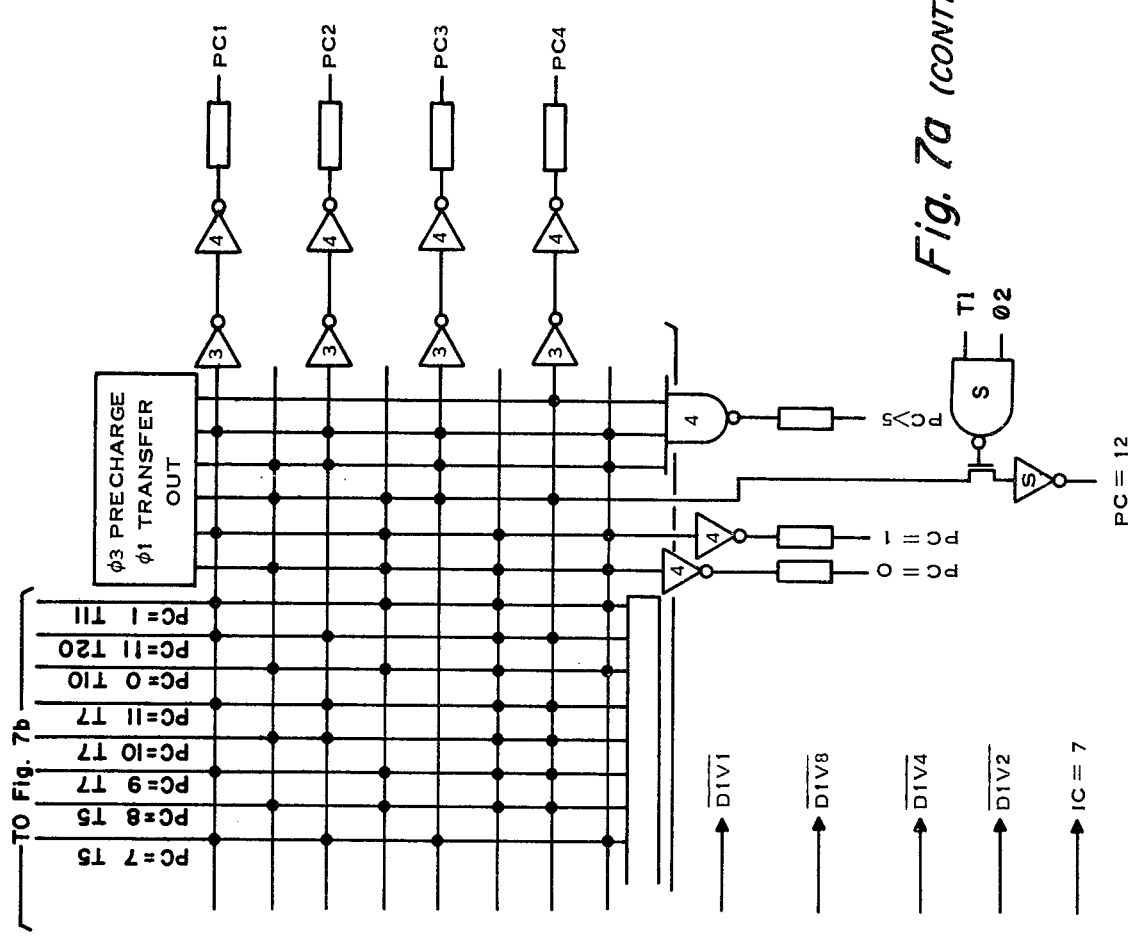
Figure 7B:
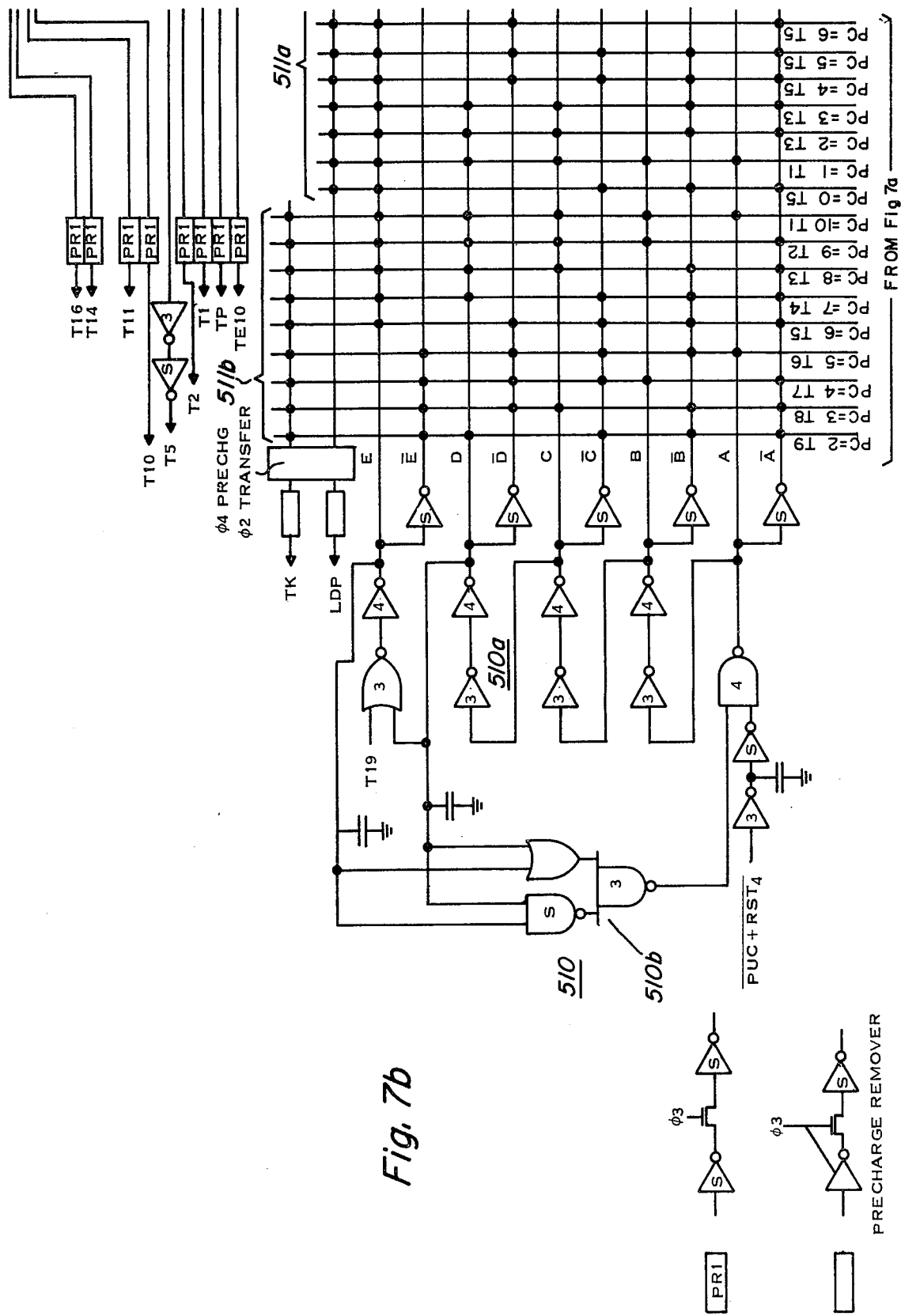
Figure 7B:
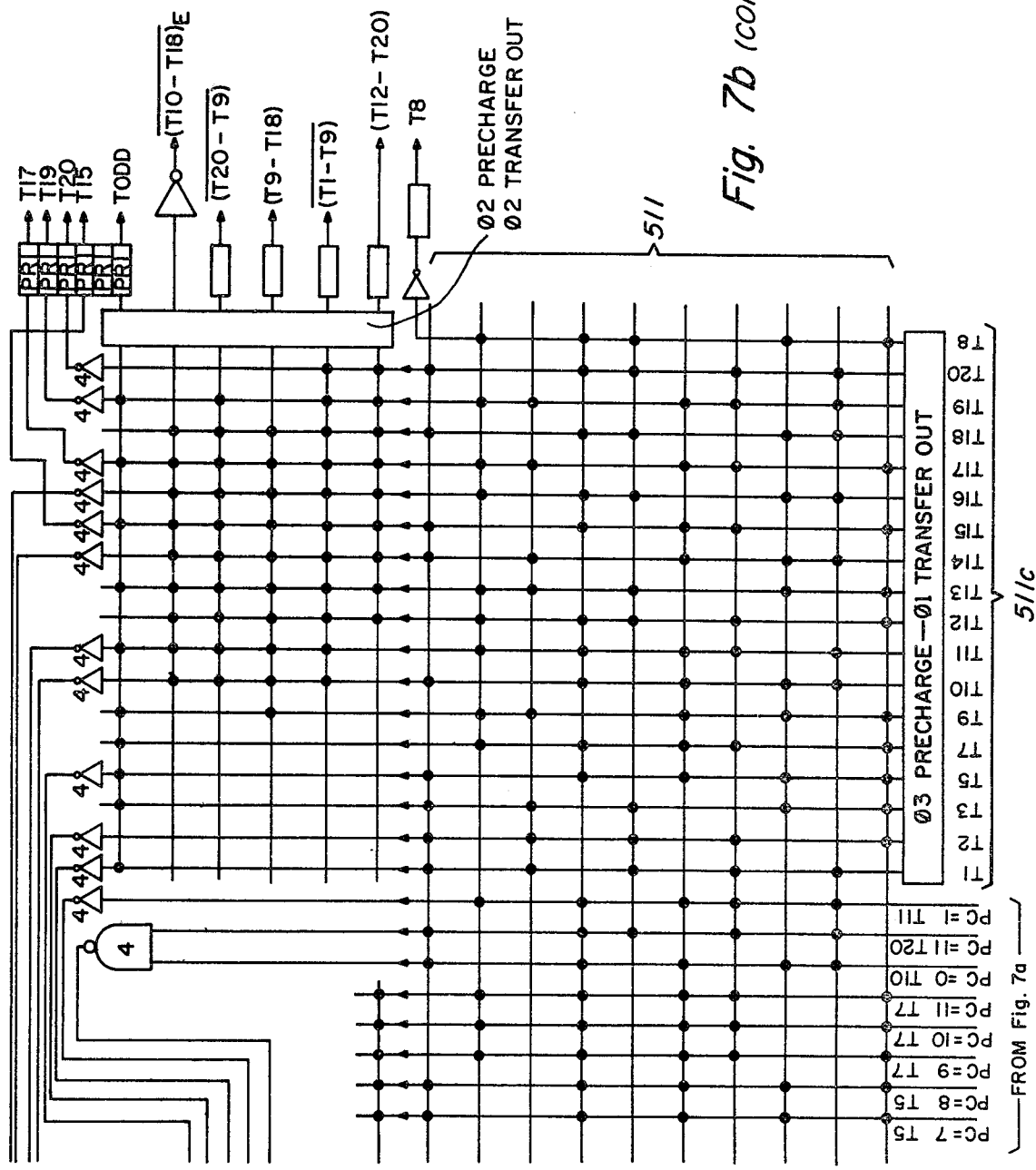

Referring now to FIGS. 7a and 7b, they form a composite, detailed logic diagram of the timing logic for synthesizer 10. Counter 519 is a pseudorandom shift counter including a shift register 510a and feed back logic 510b. The counter 510 counts into pseudorandom fashion and the TRUE and FALSE outputs from shift register 510a are supplied to the input section 511 of a timing PLA. The various T time periods decoded by the timing PLA are indicated adjacent to the output lines thereof. Section 511c of the timing PLA is applied to an output timing PLA 512 generating various combinations and sequences of time period signals, such as T odd, $\overline{T10}$-$\overline{T18}$, and so forth. Sections 511a and 511b of timing PLA 511 will be described subsequently.

The parameter count in which the synthesizer is operating is maintained by a parameter counter 513. Parameter counter 513 includes an add one circuit and circuits which are responsive to SLOW and SLOW D. In SLOW, the parameter counter repeats the A cycle of the parameter count twice (for a total of three A cycles) before entering the B cycle. That is, the period of the parameter count doubles so that the parameters applied to the lattice filter are updated and interpolated at half the normal rate. To assure that the inputted parameters are interpolated only once during each parameter count during SLOW speaking operations each parameter count comprises three A cycles followed by one B cycle. It should be recalled that during the A cycle the interpolation is begun and during the B cycle the interpolated results are reinserted back into either K-stack 302, E10 loop 304 or pitch register 305, as appropriate.

Thus, merely repeating the A cycle has no affect other than to recalculate the same value of a speech parameter but since it is only reinserted once back into either K-stack 302, E10 loop 304 or pitch register 305 only the results of the interpolation immediately before the B cycle are retained.

Inasmuch as parameter counter 513 includes an add one circuit, the results outputted therefrom, PC1-PC4, represent in binary form, the particular parameter count in which the synthesizer is operating. Output PC0 indicates in which cycle, A or B, the parameter count is. The parameter counter outputs PC1-PC4 are decoded by timing PLA 514. The particular decimal value of the parameter count is decoded by timing PLA 514 which is shown in adjacent to the timing PLA 514 with nomenclature such as PC=0, PC=1, PC=7 and so forth. The relationship between the particular parameters and the value of PC is set forth in FIG. 6. Output portions 511a and 511b of timing PLA 511 are also interconnected with outputs from timing PLA 514 whereby the Transfer K (TK) signal goes high during T9 of PC=2 or T8 or PC=3 or T7 of PC=4 and so forth through T1 of PC=10. Similarly, a LOAD Parameter (LDP) timing signal goes high during T5 of PC=0 or T1 of PC=1 or T3 of PC=2 and so forth through T7 of PC=11. As will be seen, Signal TK is used in controlling the transfer of data from parameter output register 201 to subtractor 308, which transfer occurs at different T times according to the particular parameter count the parameter counter 513 is in to assure that the appropriate parameter is being outputted from KE10 transfer register 303. Signal LDP is, as will be seen, used in combination with the parameter input register to control the number of bits which are inputted therein according to the number of bits associated with the parameter then being loaded according to the number of bits in each coded parameter as defined in FIG. 6.

Interpolation counter 515 includes a shift register and an add one circuit for binary counting the particular interpolation cycle in which the synthesizer 10 is operating. The relationship between the particular interpolation count in which the synthesizer is operating and the DIV1, DIV2, DIV4 and DIV8 timing signals derived therefrom is explained in detail with reference to FIG. 6 and therefore additional discussion here would be superfluous. It will be noted, however, that interpolation counter 515 includes a three bit latch 516 which is loaded at TI. The output of three bit latch 516 is decoded by gates 517 for producing the aforementioned DIV1 through DIV8 timing signals. Interpolation counter 515 is responsive to a signal RESETF from parameter counter 513 for permitting interpolation counter 515 to increment only after PC=12 has occurred.

ROM/Controller Interface Logic Diagram

Figure 8A:
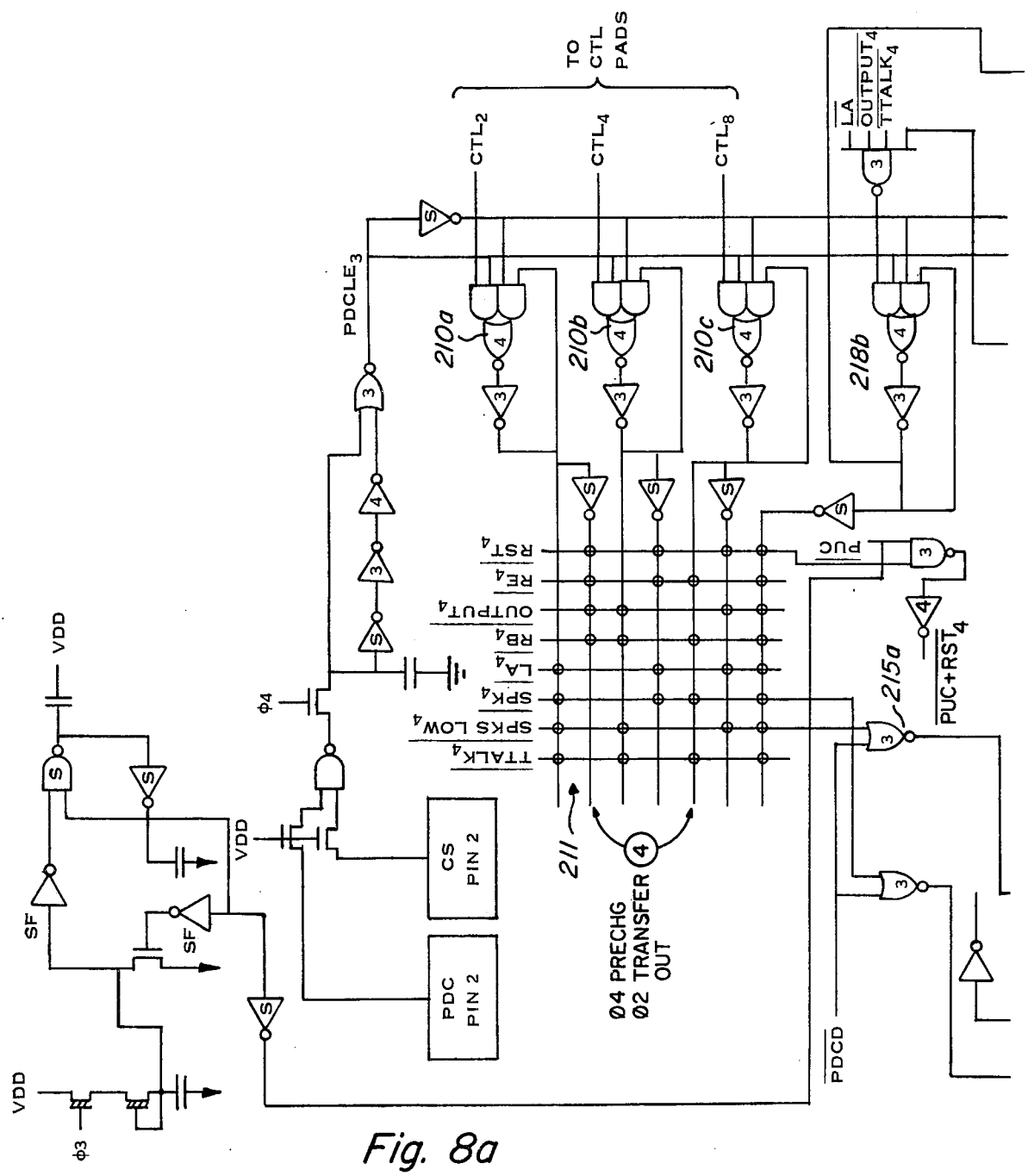
FIGS. 8a, 8b and 8c form a composite logic diagram of the synthesizer's ROM/Controller interface logics.
Figure 8B:
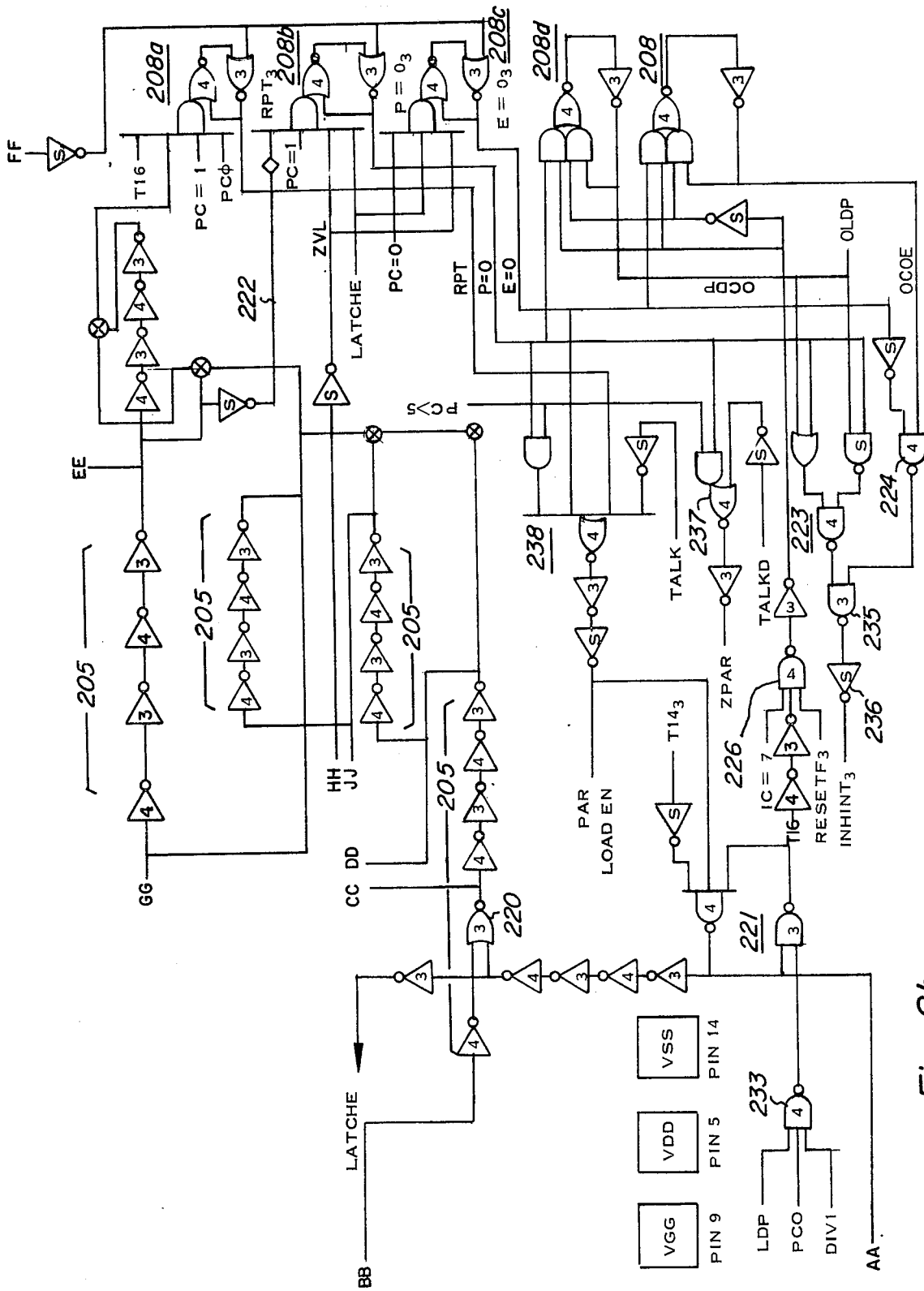
Figure 8B:
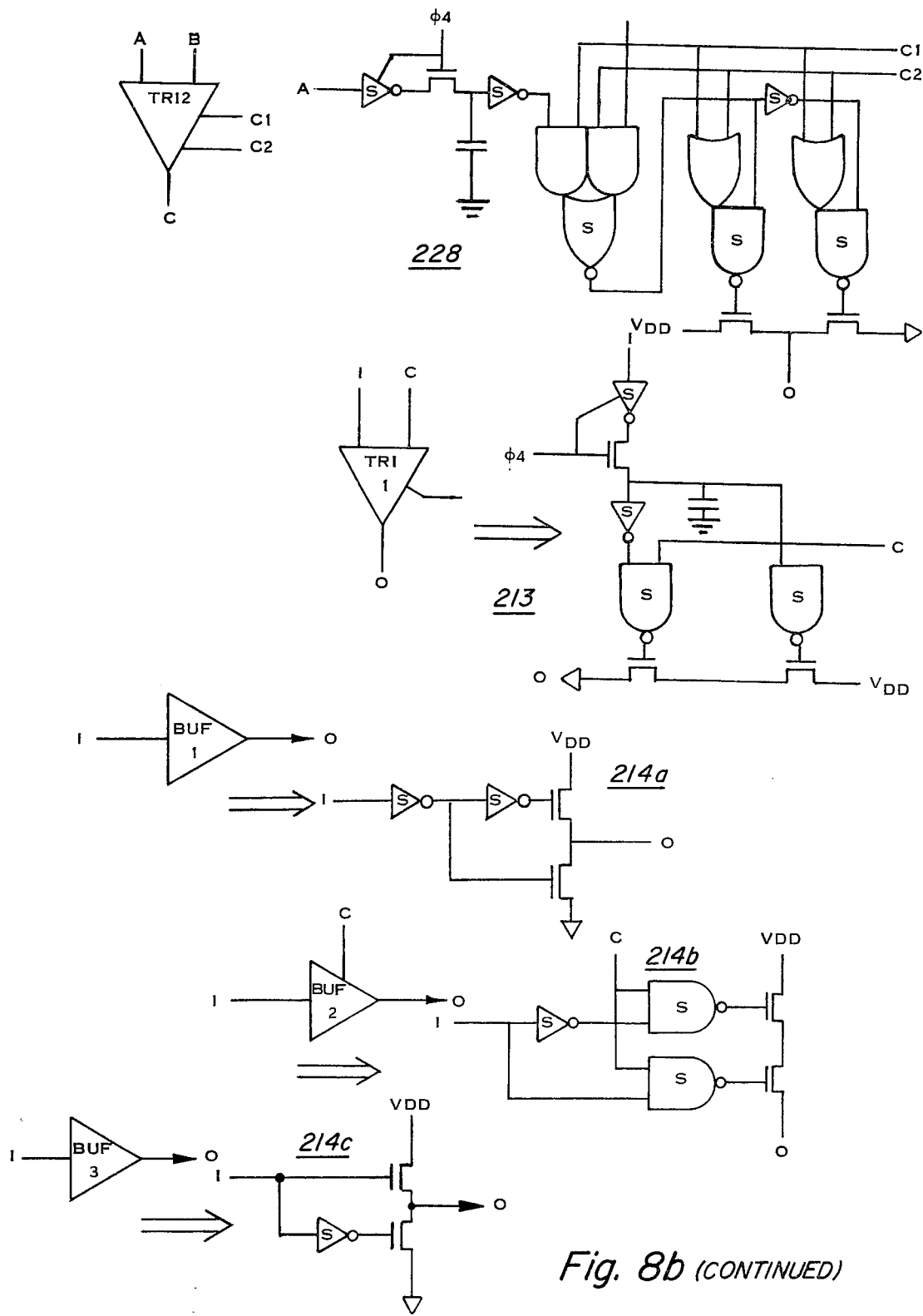
Figure 8C:
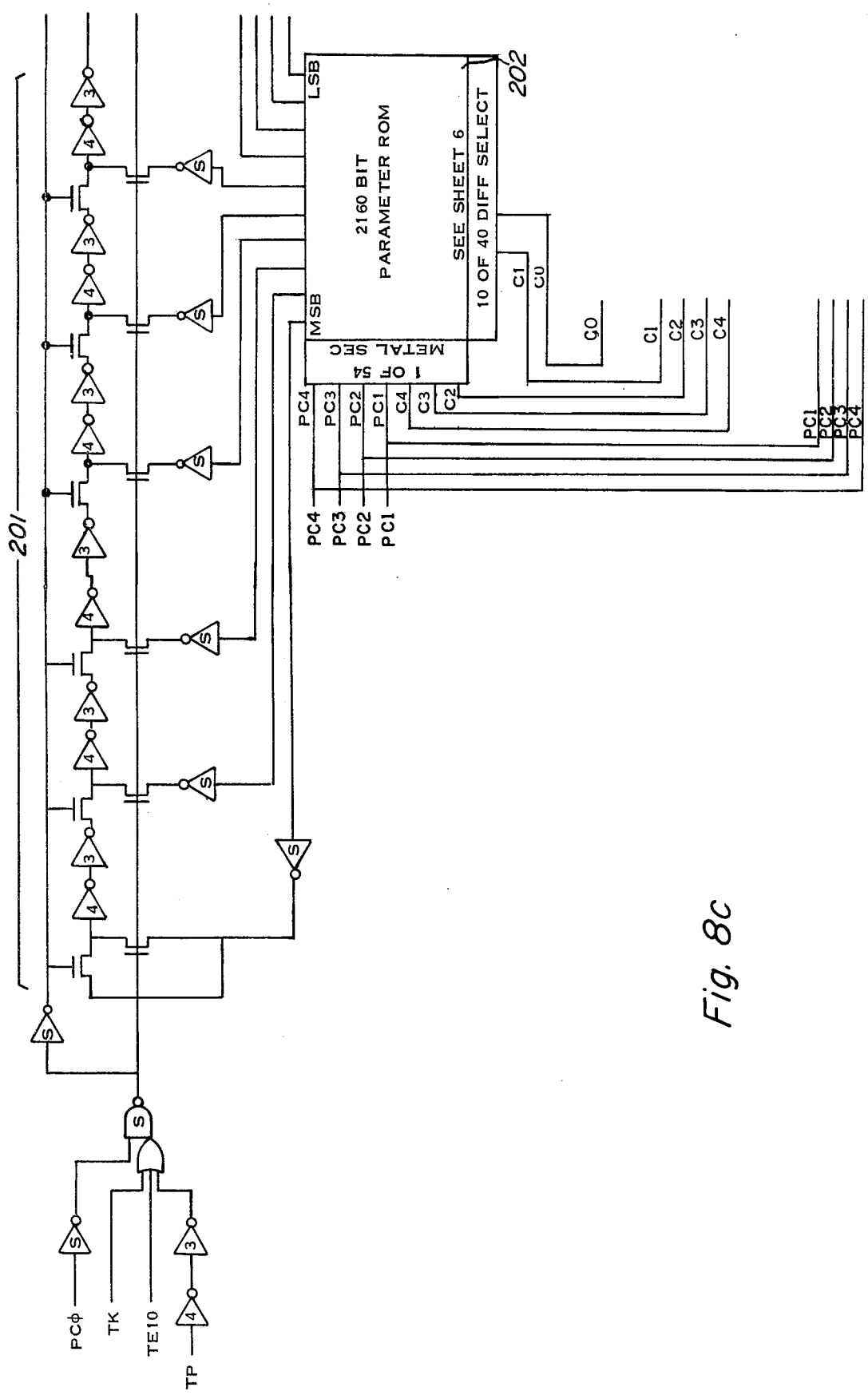
Figure 8C:
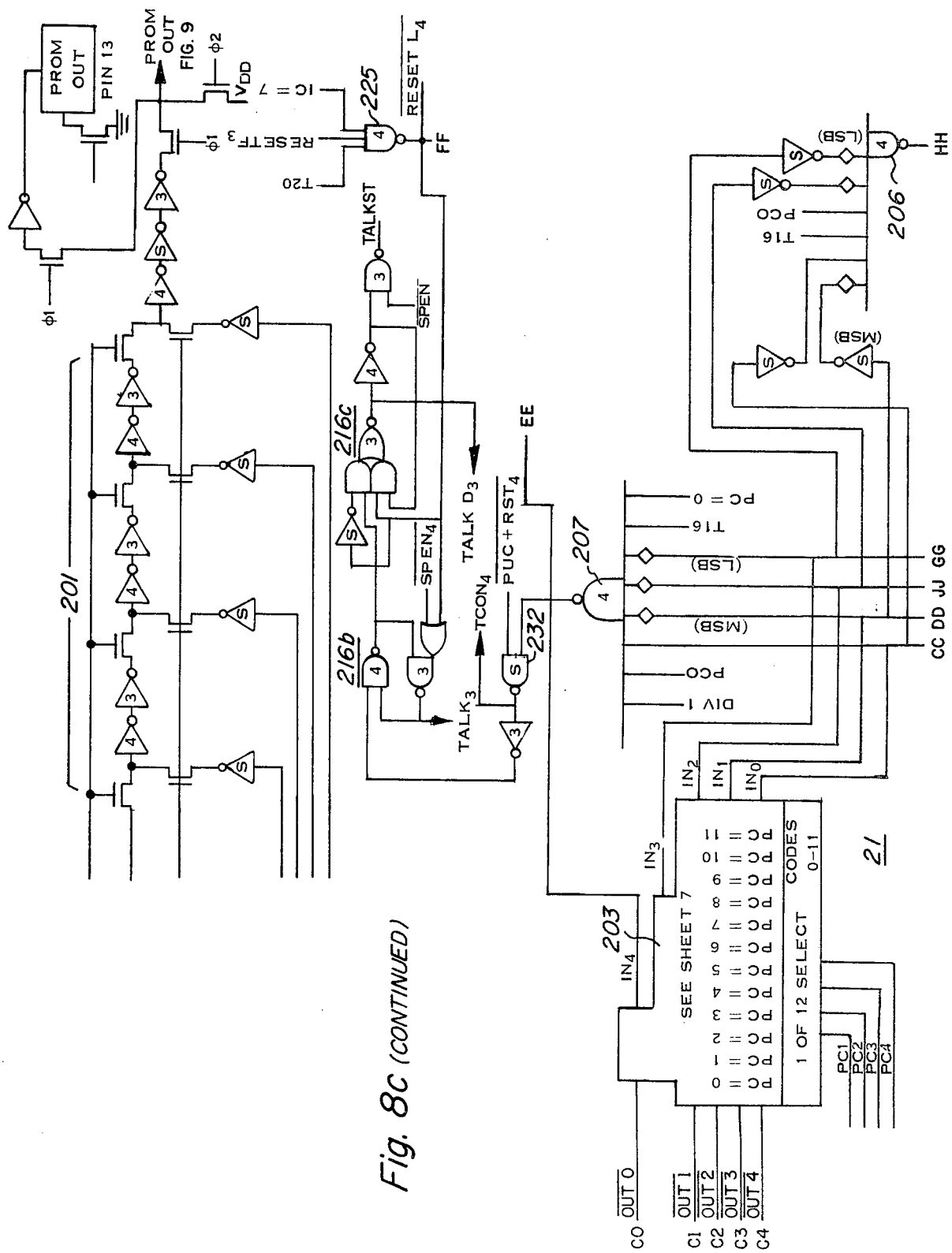

Turning now to FIGS. 8a, 8b and 8c, which form a composite diagram, there is shown a detailed logic diagram of ROM/Controller interface logic 21. Parameter input register 205 is coupled, at its input to address pin ADD8. Register 205 is a six bit shift register, most of the stages of which are two bits long. The stages are two bits long in this embodiment inasmuch as ROMs 12a and b output, as will be seen, data at half the rate at which data is normally clocked in synthesizer 10. At the input of parameter input register 205 is a parameter input control gate 220 which is responsive to the state of a latch 221. Latch 221 is set in response to LDP, PC0 and DIV1 all being a logical one. It is reset at T14 and in response to parameter load enable from gate 238 being a logical zero. Thus, latch 221 permits gate 220 to load data only during the A portion (as controlled by PC0) of the appropriate parameter count and at an appropriate T time (as controlled by LDP) of IC0 (as controlled by DIV1) provided parameter load enable is at a logical one. Latch 221 is reset by T14 after the data has been inputted into parameter register 205.

The coded data in parameter input register 205 is applied on lines IN0–IN4 to coded parameter RAM 203, which is addressed by PC1–PC4 to indicate which coded parameter is then being stored. The contents of register 205 is tested by all one's gate 207, all zeroes gate 206 and repeat latch 208a. As can be seen, gate 206 tests for all zeroes in the four least significant bits of register 205 whereas gate 207 tests for all ones in those bits. Gate 207 is also responsive to PC0, DIV1, T16 and PC=0 so that the zero conditon is only tested during the time that the coded energy parameter is being loaded into parameter RAM 203. The repeat bit occurs in this embodiment immediately in front of the coded pitch parameter; therefore, it is tested during the A cycle of PC=1. Pitch latch 208b is set in response to all zeroes in the coded pitch parameter and is therefore responsive to not only gate 206 but also the most significant bit of the pitch data on line 222 as well as PC=1. Pitch latch 208b is set whenever the loaded coded pitch parameter is a 00000 indicating that the speech is to be unvoiced.

Energy=0 latch 208c is responsive to the output of gate 206 and PC=0 for testing whether all zeroes have been inputted as the coded energy parameter and is set in response thereto. Old pitch latch 208d stores the output of the pitch=0 latch 208b from the prior frame of speech data while old energy latch 208e stores the output of energy=0 latch 208c from the prior frame of speech data. The contents of old pitch latch 208d and pitch=0 latch 208b are compared in comparison gates 223 for the purpose of generating an INHIBIT signal. As will be seen, the INHIBIT signal inhibits interpolations and this is desirable during changes from voiced to unvoiced or unvoiced to voiced speech so that the new speech parameters are automatically inserted into K-stack 302, E10 loop 304 and pitch register 305 as opposed to being more slowly interpolated into those memory elements. Also, the contents of old energy latch 208e and energy=0 latch 208c is tested by NAND gate 224 for inhibiting interpolation for a transition from a non-speaking frame to a speaking frame of data. The outputs of NAND gate 224 and gates 223 are coupled to a NAND gate 235 whose output is inverted to INHIBIT by an inverter 236. Latches 208a–208c are reset by gate 225 and latches 208d and 208e are reset by gate 226. When the excitation signal is unvoiced, the K5–K10 coefficients are set to zero, as aforementioned. This is accomplished, in part, by the action of gate 237 which generates a ZPAR signal when pitch is equal to zero and when the parameter counter is greater than five, as indicated by PC 5 from PLA 514.

Also shown in FIGS. 8a–c is a command latch 210 which comprises three latches 210a, b, and c which latch in the data at CTL2,4 and 8 in response to a processor data clock (PDC) signal in conjunction with a chip select (CS) signal. The contents of command latch 210 is decoded by command decoder 211 unless disabled by latches 218a and 218b. As previously mentioned, these latches are responsive to decoded LA, output and TTALK commands for disabling decoder 211 from decoding what ever data happens to be on the CTL2–CTL8 pins when subsequent PDC signals are received in conjunction with the LA, output and TTALK commands. A decoded TTALK command set TTALK latch 219. The output of TTALK latch 219, which is reset by a Processor Data Clock Leading Edge (PDCLE) signal or by an output from latch 218b, controls along with the output of latch 218a NOR gates 227a and b. The output of NOR gate 227a is a logical one if TTALK latch 219 is set, thereby coupling pins CTL1 to the talk latch via tristate buffer 228 and inverters 229. Tristate latch 228 is shown in detail on the right side of FIGS. 8a–c. NOR gate 227b, on the other hand, outputs a logical one if an output code has been detected, setting latch 228a and thereby connecting pins CTL1 to the most significant bit of data input register 212.

Data is shifted into data input register 212 from address pin 8 in response to a decoded read command by logics 230. RE, RB and LA instructions are outputted to ROM via instruction pins $I_0$–$I_1$ from ROM control logic 217 via buffers 214c. The contents of data input register 212 is outputted to CTL1–CTL4 pins via buffers 213 and to the aforementioned CTL1 pin via buffer 228 when NOR gate 227b inputs a logical one. CTL1–CTL4 pins are connected to address pins ADD1–ADD4 via buffers 214a and CTL8 pin is connected to ADD8 pin 8 via a control buffer 214b which is disabled when addresses are being loaded on the ADD1–ADD1–ADD8 pins by the signal on line 231.

The Talk latch 216 shown in FIGS. 8a–c preferably comprises, three latches 216a, 216b and 216c. Latch 216a is set in response to a decoded SPK command and generates, in response thereto, a speak enable (SPEN) signal. As will be seen, SPEN is also generated in response to a decoded SPKSLOW command by latch 215a. Latch 216b is set in response to speak enable during IC7 as controlled by gate 225. Latches 216a and 216b are reset in response to (1) a decoded reset command, (2) an energy equals fifteen code or (3) on a power-up clear by gate 232. Talk delayed latch 216c is set with the contents of latch 216b at the following IC7 and retains that data through eight interpolation counts. As was previously mentioned, the talk delayed latch permits the speech synthesizer to continue producing speech data for eight interpolation cycles after a coded energy=0 condition has been detected setting latch 208c. Likewise, slow talk latch 215 is implemented with latches 215a, 215b and 215c. Latch 215a enables the speak enable signal while latches 215b and 215c enable the production of the SLOWD signal in much the same manner as latches 216b 21d 216c enable the production of the TALKD signal.

Considering now, briefly, the timing interactions for inputting data into parameter input register 205, it will be recalled that this is controlled chiefly by a control gate 220 in response to the state of a parameter input latch 221. Of course, the state of the latch is controlled by the LDP signal applied to gate 233. The PC0 and DIV1 signals applied to gate 233 to assure that the parameters are loaded during the A cycle of a particular parameter count during IC0. The particular parameter and the parameter T-Time within the parameter count is controlled by LDP according to the portion 511a of timing PLA 511 (FIGS. 7a and 7b). The first parameter inputted (Energy) is four bits long and therefore LDP is initiated during time period T5 (as can be seen in FIGS.

7a and 7b). During parameter count 1, the repeat bit and pitch bits are inputted, this being six bits which are inputted according to LDP which comes up at time period T1. Of course, there four times periods difference between T1 and T5 but only two bits difference in the length of the inputted information. This occurs because it takes two time periods to input each bit into parameter input register 205 (which has two stages per each inputted bit) due to the fact that ROMs 12a-12b are preferably clocked at half the rate at that which synthesizer 10 is clocked. By clocking the ROM chips at half the rate, that the synthesizer 10 chip is clocked simplifies the addressing of the read-only-memories in the aforesaid ROM chips and yet, as can be seen, data is supplied to the synthesizer 10 in plenty of time for performing numerical operations thereon. Thus, in section 511a of timing PLA 511, LDP comes up at T1 when the corresponding parameter count indicates that a six bit parameter is to be inputted, comes up at T3 when the corresponding parameter count indicates that a five bit parameter is to be inputted, comes up at T5 when the corresponding parameter count indicates that a four bit parameter is to be inputted and comes up at time period T7 when the corresponding parameter count (EG parameter counts 9, 10, and 11) which correspond to a three bit coded parameter. ROMs 12a-b are signaled that the addressed parameter ROM is to output information when signaled via $I_0$ instruction pin, ROM control logic 217 and line 234 which provides information to ROM control logic 217 from latch 221.

Parameter Interpolator Logic Diagram

Figure 9A:
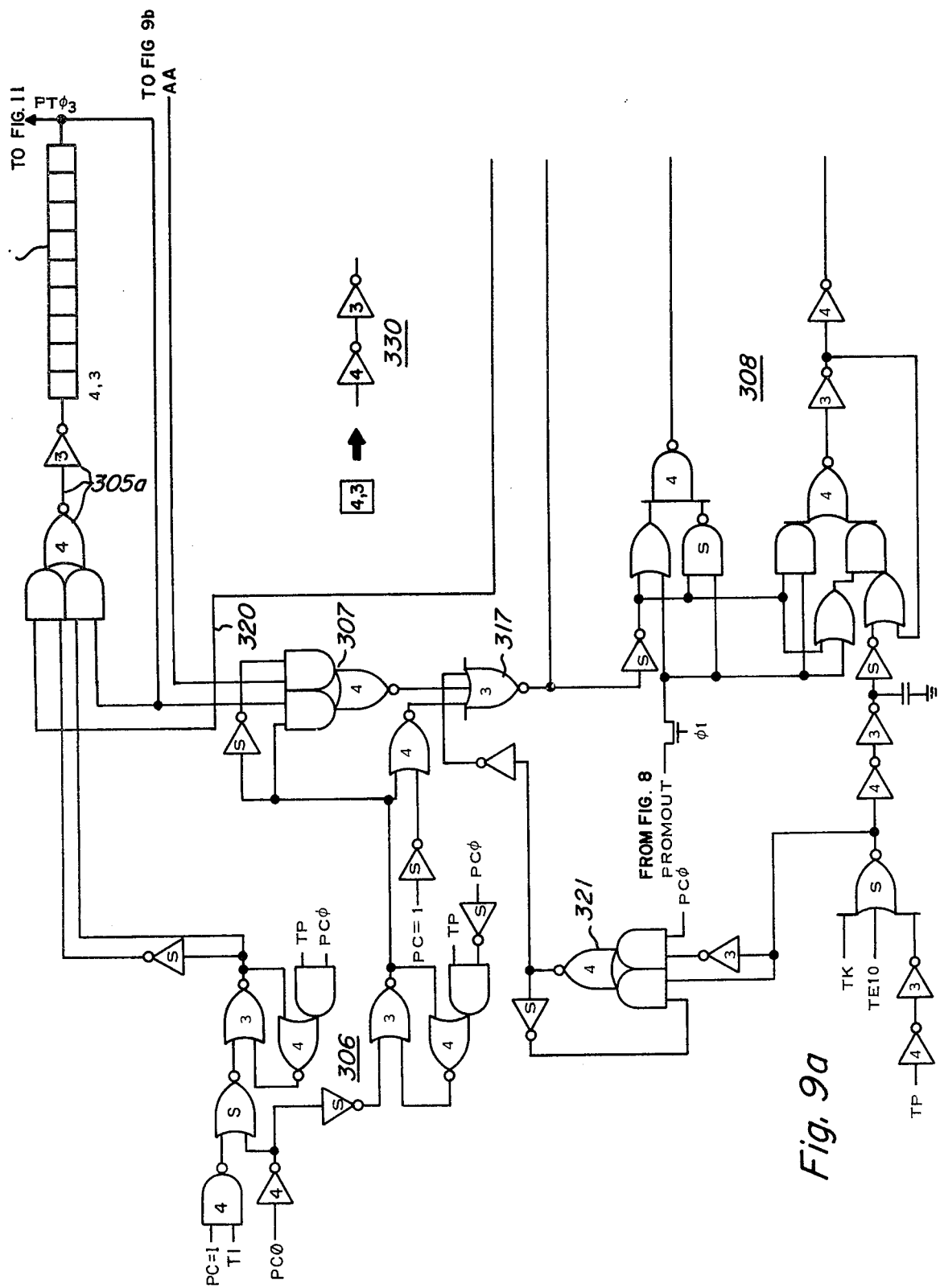
FIGS. 9a and 9b form a composite logic diagram of the iterpolator logics.
Figure 9A:
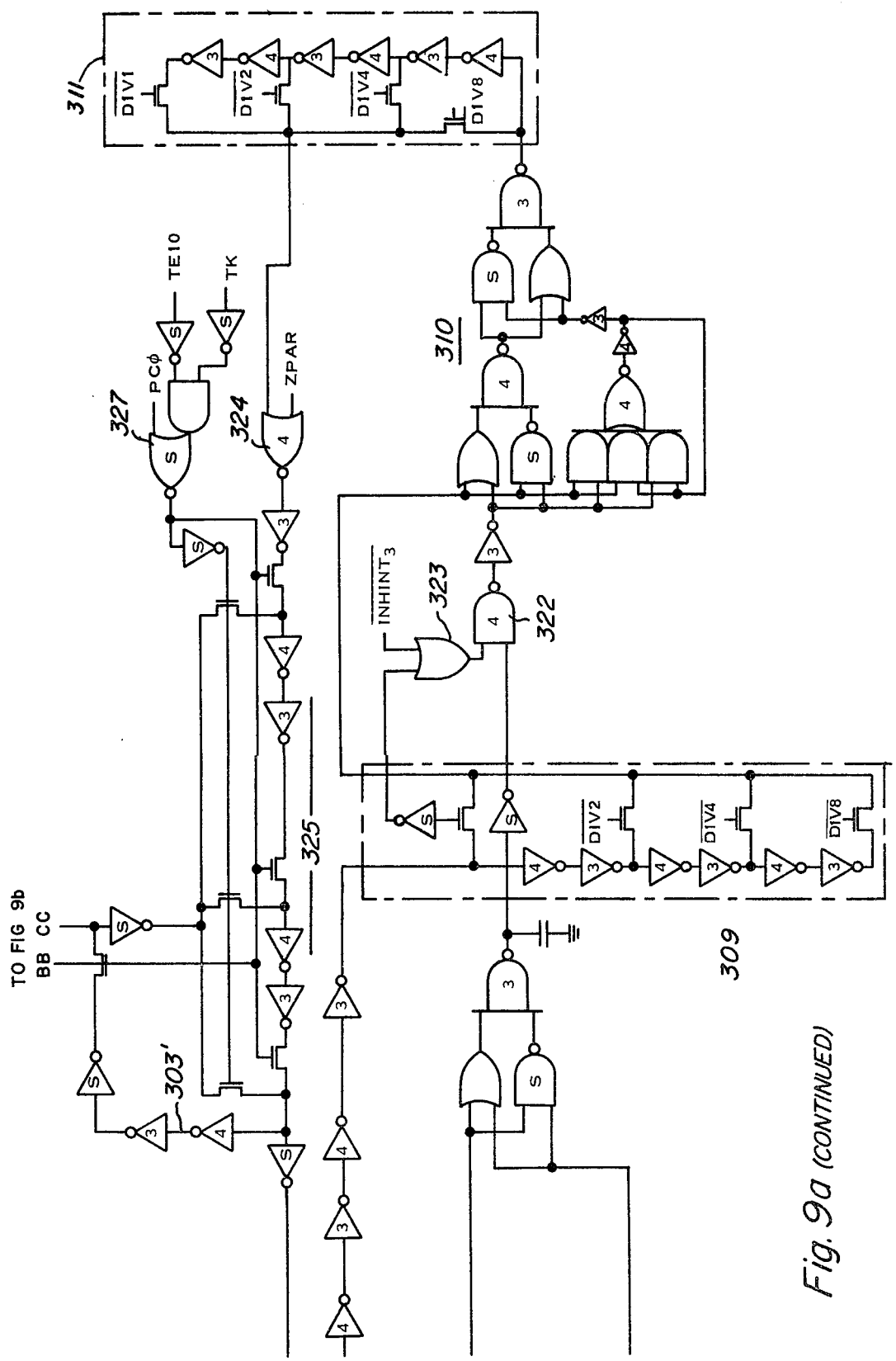
Figure 9B:
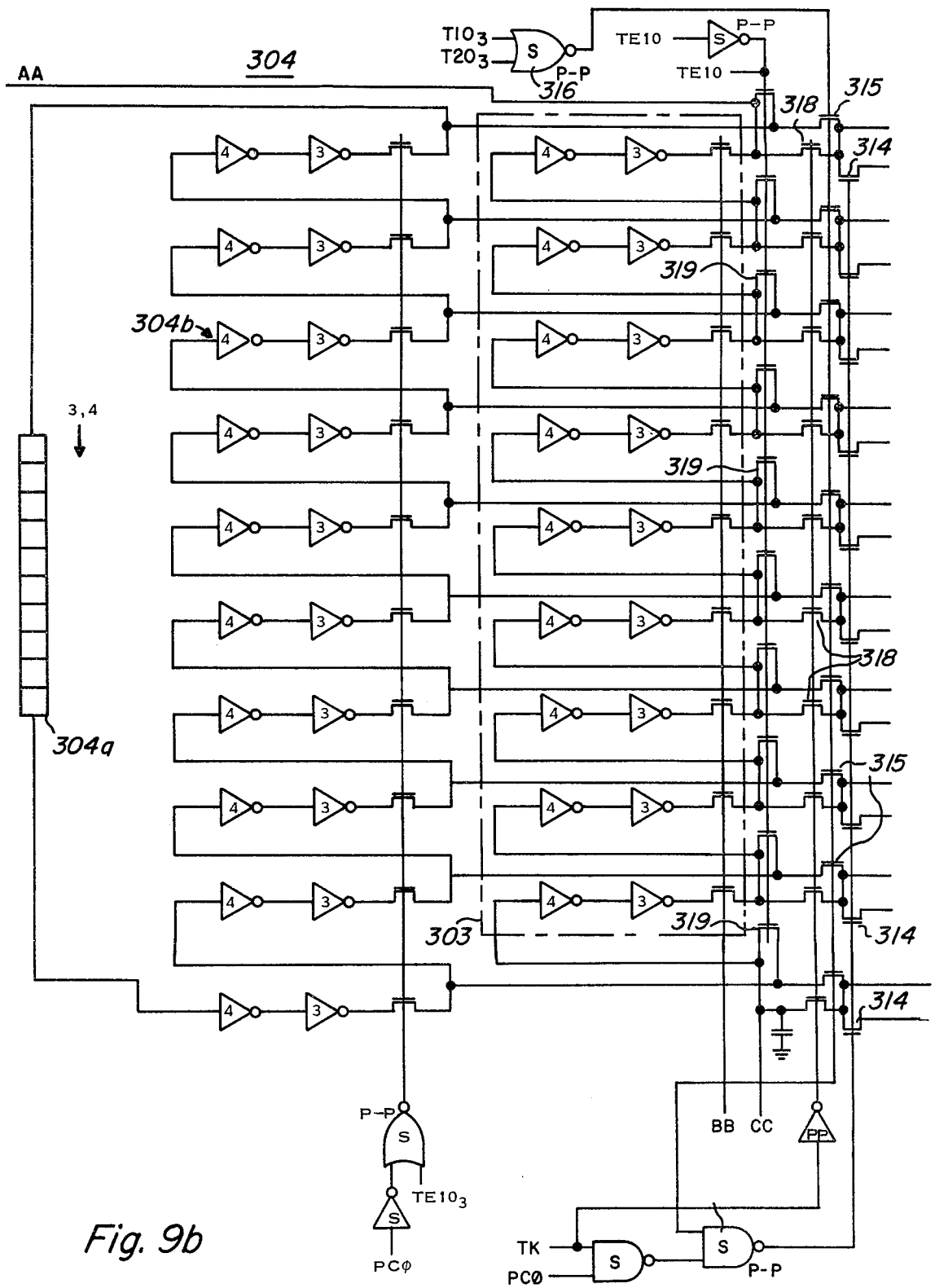
Figure 9B:
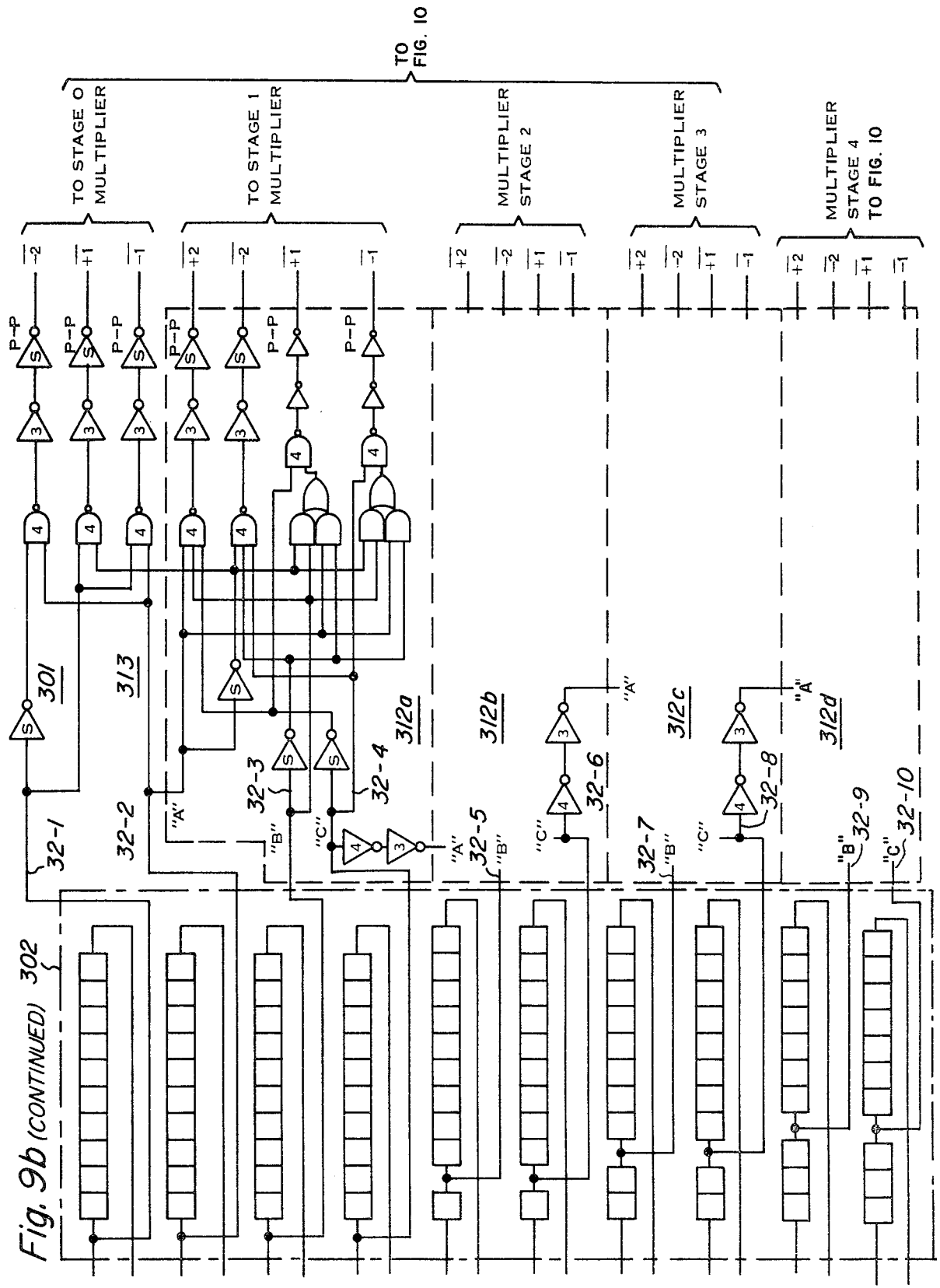

Referring now to FIGS. 9a and 9b, which form a composite diagram the parameter interpolator logic 23 is shown in detail. K-stack 203 comprises ten registers each of which store ten bits of information. Each small square represents one bit of storage, according to the convention depicted at numeral 330. The contents of each shift register is arranged to recirculate via recirculation gates 314 under control of a recirculation control gate 315. K-stack 302 stores speech coefficients K1-K9 and temporarily stores coefficient K10 or the energy parameter generally in accordance with the speech synthesis apparatus of FIG. 7 of U.S. Pat. application Ser. No. 807, 461, since abandoned and continued in U.S. Patent application Ser. No. 905,328, filed May 12, 1978. The data outputted from K-stack 302 to recoding logic 30 at various time periods is shown in Table VII. In Table III of U.S. Patent application Ser. No. 807,461, since abandoned and continued in U.S. Patent application Ser. No. 905,328, filed May 12, 1978, is shown the data outputted from the K-stack of FIG. 7 thereof. Table VII of this patent differs from Table III of the aforementioned patent because of (1) recoding logic 301 receives the same coefficient on lines 32-1 through 32-4, on lines 32-5 and 32-6, on lines 32-7 and 32-8 and on lines 32-9 and 32-10 because, as will be seen, recoding logic 301 responds to two bits of information for each bit which was responded to by the array multiplier of the aforementioned U.S. Patent; (2) because of the difference in time period nomenclature as was previously explained with reference to FIG. 5; and (3) because of the time delay associated with the recoding logic 301.

Figure 10A:
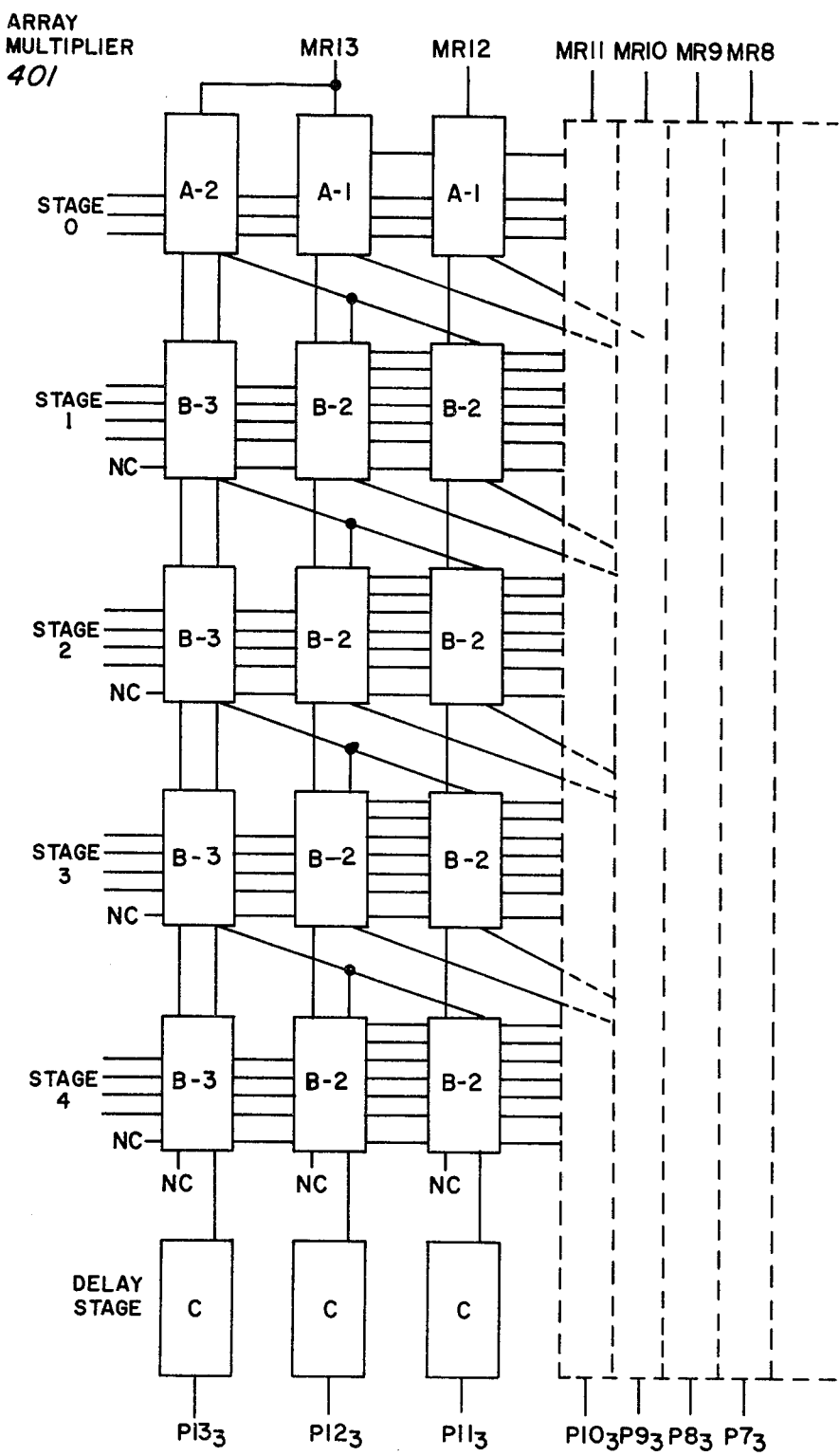
FIGS. 10a–10b form a composite logic diagram of the array multiplier.
Figure 10A:
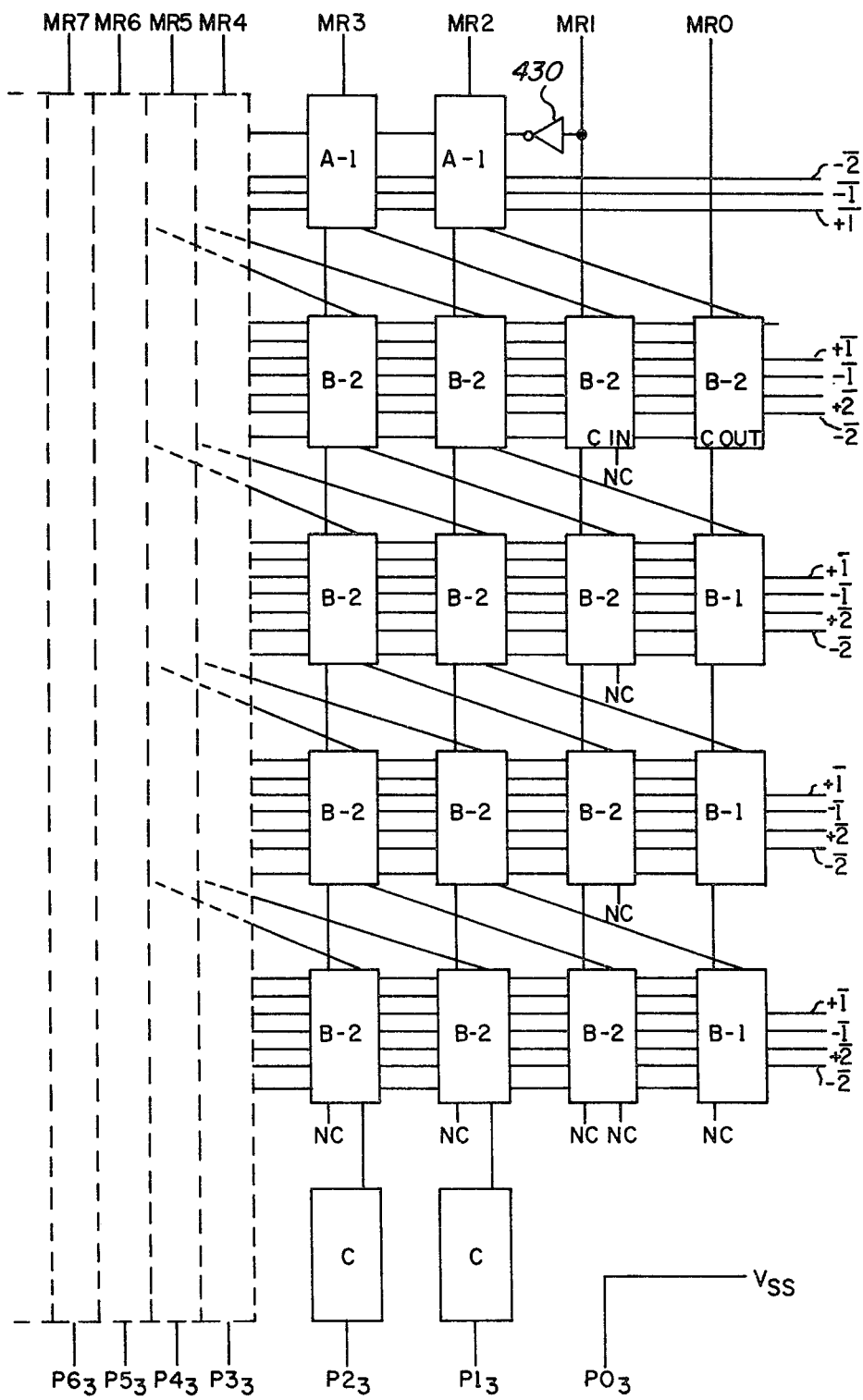
Figure 10B:
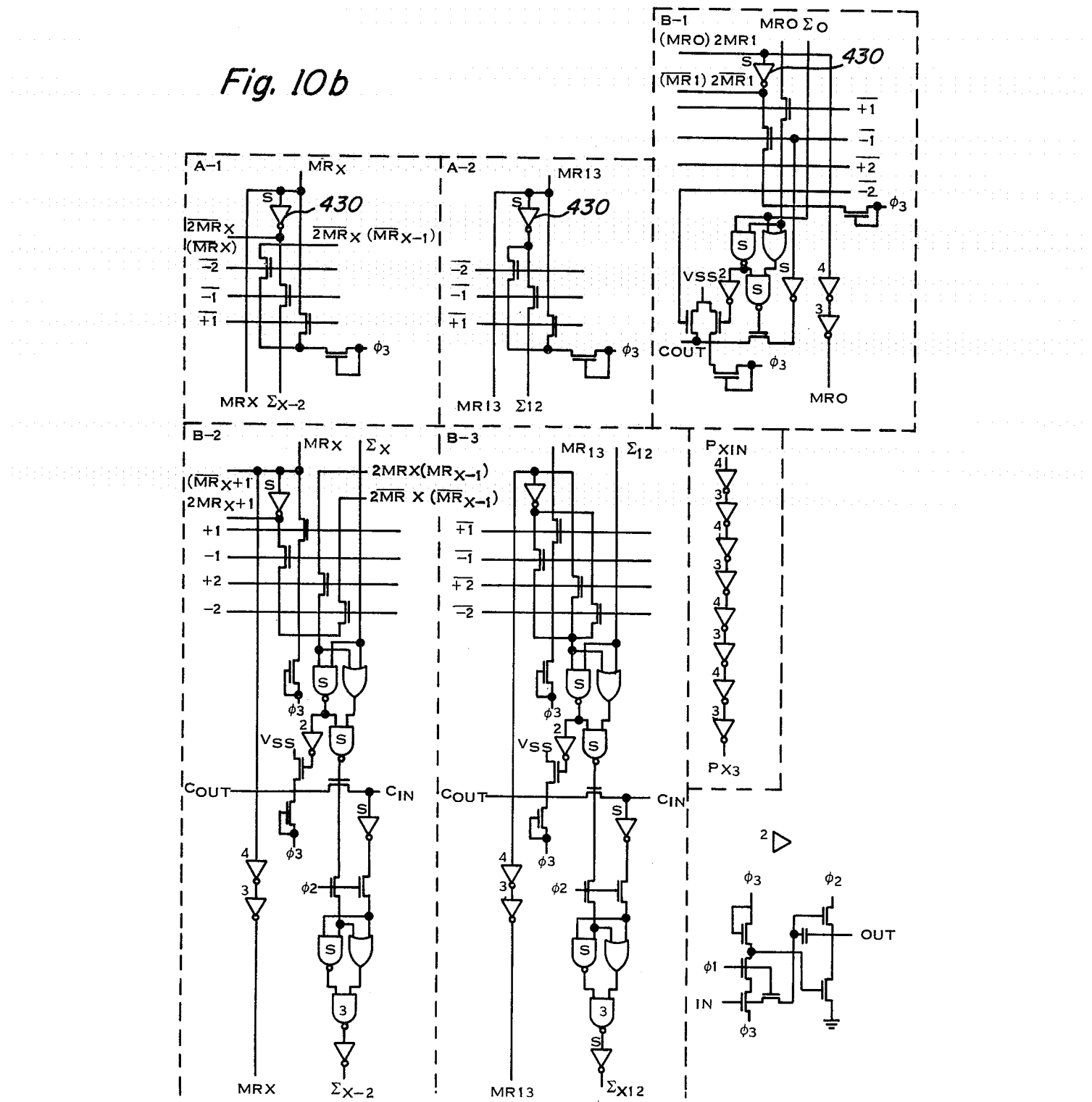

Recoding logic 301 couples K-stack 301 to array multiplier 401 (FIGS. 10a and 10b). Recoding logic 301 includes four identical recoding stages 312a-312d, only one of which, 312a, is shown in detail. The first stage of the recoding logic, 313, differs from stages 312a-312d basically because there is, of course, no carry, such as occurs on input A in stages 312a-312d, from a lower order stage. Recoding logic outputs $\overline{+2}$, $\overline{-2}$, $\overline{+1}$ and $\overline{-1}$ to each stage of a five stage array multiplier 401, except for stage zero which receives only $\overline{-2}$, $\overline{+1}$ and $\overline{-1}$ outputs. Effectively recoding logic 301 permits array multiplier to process, in each stage thereof, two bits in lieu of one bit of information, using Booth's algorithm. Booth's algorithm is explained in "Theory and Application of Digital Processing", published by Prentice-Hall 1975, at pp. 517-18.

The K10 coefficient and energy are stored in E10 loop 304. E10 loop preferably comprises a twenty stage serial shift register; ten stages 304a and E10 loop 304 are preferably coupled in series and another ten stages 304b which are also coupled in series but also have parallel outputs and inputs to K-stack 302. The appropriate parameter, either energy or the K10 coefficient, is transferred from E10 loop 304 to K-stack 302 via gates 315 which are responsive to a NOR gate 316 for transferring the energy parameter from E10 loop 304 to K-stack 302 at time period T10 and transferring coefficient K10 from E10 loop 304 to K-stack 302 at time period T20. NOR gate 306 also controls recirculation control gate 315 for inhibiting circulation in K-stack 302 when data is being transferred.

KE10 transfer register 303 facilitates the transferring of energy or the K1-K10 speech coefficients which are stored in E10 loop 304 or K-stack 302 to adder 308 and delay circuit 309 via selector 307. Register 303 has nine stages provided by paired inverters and a tenth stage being effectively provided by selector 307 and gate 317 for facilitating the transfer of ten bits of information either from E10 loop 304 or K-stack 302. Data is transferred from K-stack 302 to register 303 via transfer gates 318 which are controlled by a Transfer K (TK) signal generated by decoder portion 511b of timing PLA 511 (FIGS. 7a and 7b). Since the particular parameter to be interpolated and thus shifted into register 303 depends upon the particular parameter count in which the synthesizer is operating and since the particular parameter available to be outputted from K-stack 302 is a function of particular time period the synthesizer is operating in, the TK signal comes up at T9 for the pitch parameter, T8 for the K1 parameter, T7 for the K2 parameter and so forth, as is shown in FIGS. 7a, and 7b. The energy parameter or the K10 coefficient is clocked out of E10 loop 304 into register 303 via gates 319 in response to a TE10 signal generated by a timing PLA 511. After each interpolation, that is during the B cycle, data is transferred from register 303 into (1) K-stack 302 via gates 318 under control of signal TK, at which time recirculation gates 314 are turned off by gate 315, or (2) E10 loop 304 via gates 319.

A ten bit pitch parameter is stored in a pitch register 305 which includes a nine stage shift register as well as recirculation elements 305a which provide another bit of storage. The pitch parameter normally recirculates in register 305 via gate 305a except when a newly interpolated pitch parameter is being provided on line 320, as controlled by pitch interpolation control logics 306. The output of pitch 305 (PT0) or the output from register 303 is applied by selector 307 to gate 317. Selector 307 is also controlled by logics 307 for normally coupling the output of register 303 to gate 317 except when the pitch is to be interpolated. Logics 306 are responsive for outputting pitch to adder 308 and delay 309 during the A cycle of PC=1 and for returning the interpolated pitch value on line 320 on the B cycle of PC=1 to register 305. Gate 317 is responsive to a latch 321 for only providing pitch, energy or coefficient information to adder 308 and delay circuit 309 during the interpolation. Since the data is serially clocked, the information may be started to be clocked during an A portion and PC0 may switch to a logical one sometime during the transferring of the information from register 303 or 305 to adder 308 or delay circuit 309, and therefore, gate 317 is controlled by an A cycle latch 321, which latch is set with PC0 at the time a transfer coefficient (TK) transfer E10 (TE10) or transfer pitch (TP) signal is generated by timing PLA 511.

The output of gate 317 is applied to adder 308 and delay circuit 309. The delay in delay circuit 309 depends on the state of DIV1–DIV8 signals generated by interpolation counter 515 (FIGS. 7a and 7b). Since the data exits gate 317 least significant bit first, by delaying the data in delay circuit 309 a selective amount, and applying the output to adder 310 along with the output of subtractor 308, the more delay there is in circuit 309, the smaller the effective magnitude of the difference from subtractor 308 which is subsequently added back in by adder 310. Delay circuit 311 couples adder 310 back into register 303 and 305. Both delay circuits 309 and 303 can insert up to three bits of delay and when adder 309 is at its maximum delay 311 is at its minimum delay and visa-versa. A NAND gate 322 couples the output of subtractor 308 to the input of adder 310. Gate 322 is responsive to the output of an OR gate 323 which is in turn responsive to INHIBIT from inverted 236 (FIGS. 8a–c). Gates 322 and 323 act to zero the output from subtractor 308 when the INHIBIT signal comes up unless the interpolation counter is at IC0 in which case the present values in K-stack 302, E10 loop 304 and P register 305 are fully interpolated to their new target values in a one step interpolation. When an unvoiced frame (FIG. 6) is supplied to the speech synthesis chip, coefficients K5–K10 are set to zero by the action of gate 324 which couples delay circuit 311 to shift register 325 whose output is then coupled to gates 305a and 303′. Gate 324 is responsive to the zero parameter (ZPAR) signal generated by gate 237 (FIGS. 8a–c).

Gate 326 disables shifting in the 304b portion of E10 loop 304 when a newly interpolated value of energy or K10 is being inputted into portion 304b from register 303. Gate 327 controls the transfer gates coupling the stages of register 303, which stages are inhibited from serially shifting data therebetween when TK or TE10 goes high during the A cycle, that is, when register 303 is to be receiving data from either K-stack 302 or E10 loop 304 as controlled by transfer gates 318 or 319, respectively. The output of gates 327 is also connected to various stages of shift register 325 and to a gate coupling 303′ with register 303. Whereby up top the three bits which may trail the ten most significant bits after an interpolation operation may be zeroed.

Array Multiplier Logic Diagram

FIGS. 10a and 10b form a composite logic diagram of array multiplier 401. Array multipliers are sometimes referred to as Pipeline Multipliers. For example, see "Pipeline Multiplier" by Granville E. Ott, published by the University of Missouri.

Array multiplier 401 has five stages, stage 0 through stage 4, and a delay stage. The delay stage is used in array multiplier 41 to give it the same equivalent delay as the array multiplier shown in U.S. Patent application Ser. No. 807,461, since abandoned and continued in U.S. Patent application Ser. No. 905,328, filed May 12, 1978. The input to array multiplier 401 is provided by signals $MR_O$-$MR_{13}$, from multiplier multiplexer 405. $MR_{13}$ is the most significant bit while $MR_0$ is the least significant bit. Another input to array multiplier are the aforementioned +2, −2, +1 and −1 outputs from recoding logic 301 (FIGS. 8a–c). The output from array multiplier 401, $P_{13}$-$P_0$, is supplied to summer multiplexer 402. The least significant bit thereof, P0, is in this embodiment always made a logical one because doing so establishes the mean of the truncation error as zero instead of $-\frac{1}{2}$ LSB which value would result from a simple truncation of a two's complement number.

Array multiplier 401 is shown by a plurality of box elements labeled A-1, A-2, B-1, B-2, B-3 or B-C. The specific logic elements making up these box elements are shown on the right-hand side of composite FIGS. 10a–10b in lieu of repetitively showing these elements and making up a logic diagram of FIG. 401, for simplicity sake. The A-1 and A-2 block elements make up stage zero of the array multiplier and thus are each responsive to the −2, +1 and −1 signals outputted from decoder 313 and are further responsive to MR2–MR13. When multiplies occur in array multiplier 401, the most significant bit is always maintained in the left most column elements while the partial sums are continuously shifted toward the right. Inasmuch as each stage of array multiplier 401 operates on two binary bits, the partial sums, labeled Σn, are shifted to the right two places. Thus no A type blocks are provided for the MR0 and MR1 data inputs to the first stage. Also, since each block in array multiplier 401 is responsive to two bits of information from K-stack 302 received via recoding logic 301, each block is also responsive to two bits from multiplier multiplexer 405, which bits are inverted by inverters 430, which bits are also supplied in true logic to the B type blocks.

Filter and Excitation Generator Logic Diagram

Figure 11A:
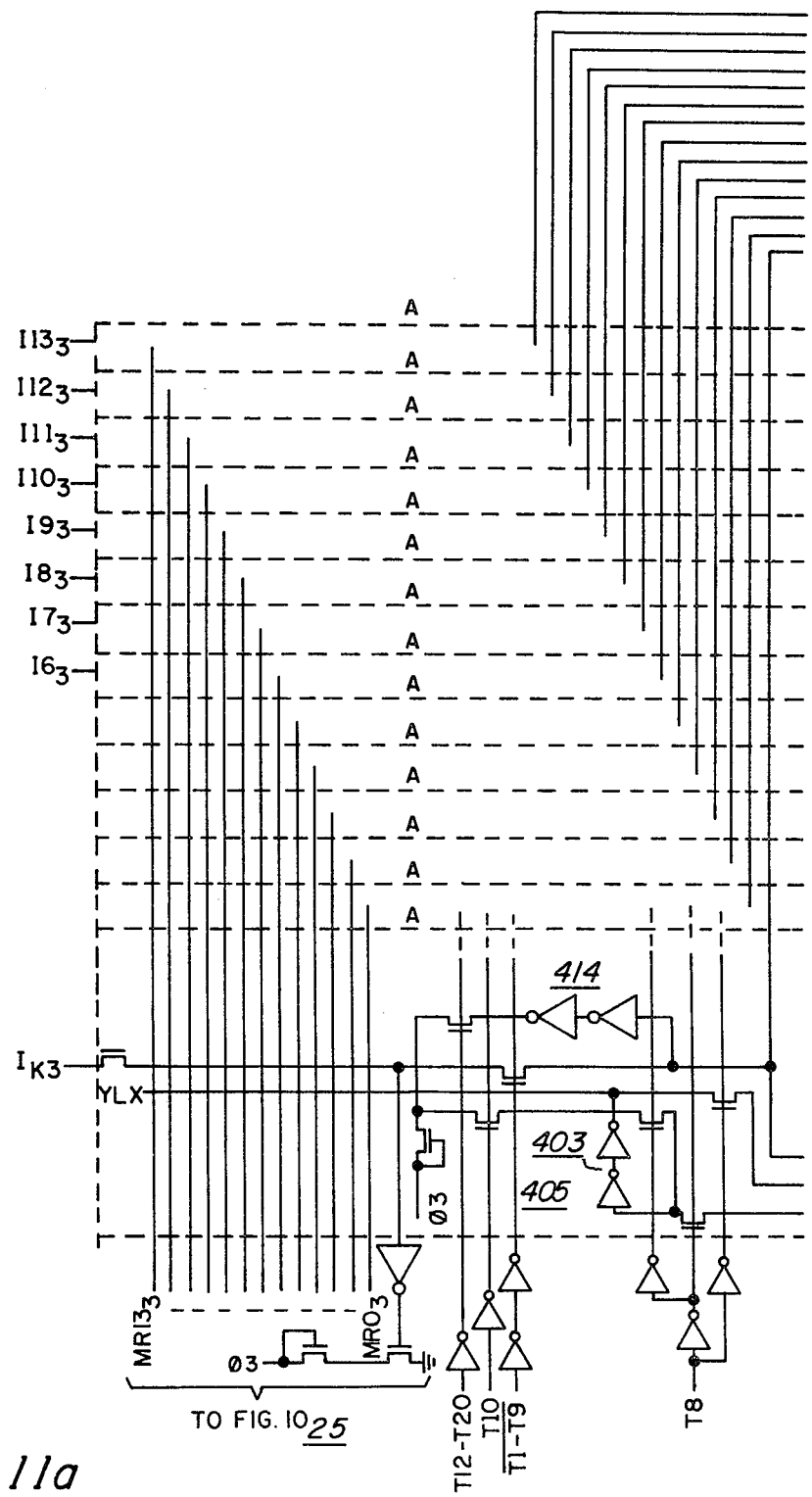
FIGS. 11a and 11b form a composite logic diagram of the speech synthesizer's lattice filter and excitation generator.
Figure 11A:
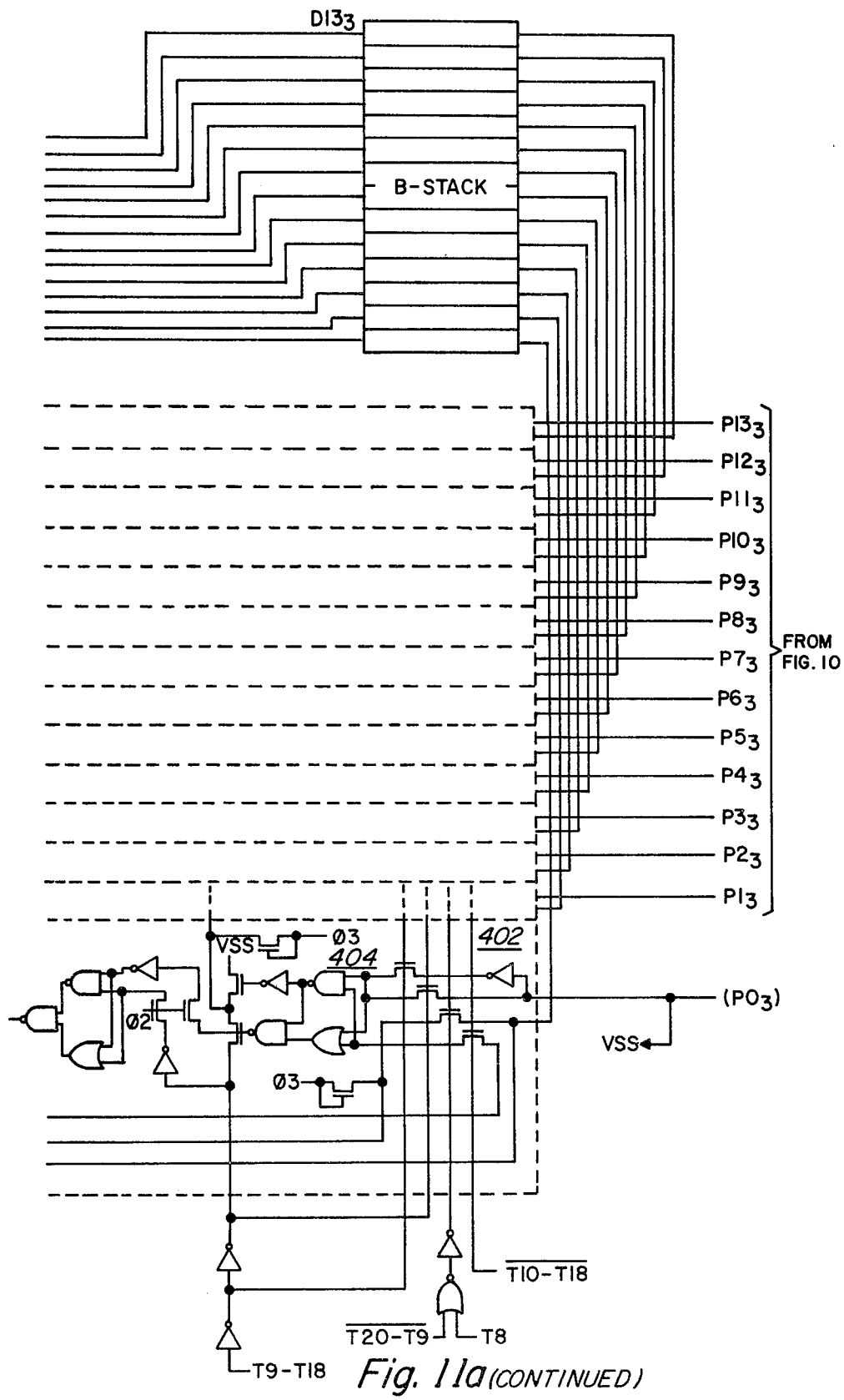
Figure 11B:
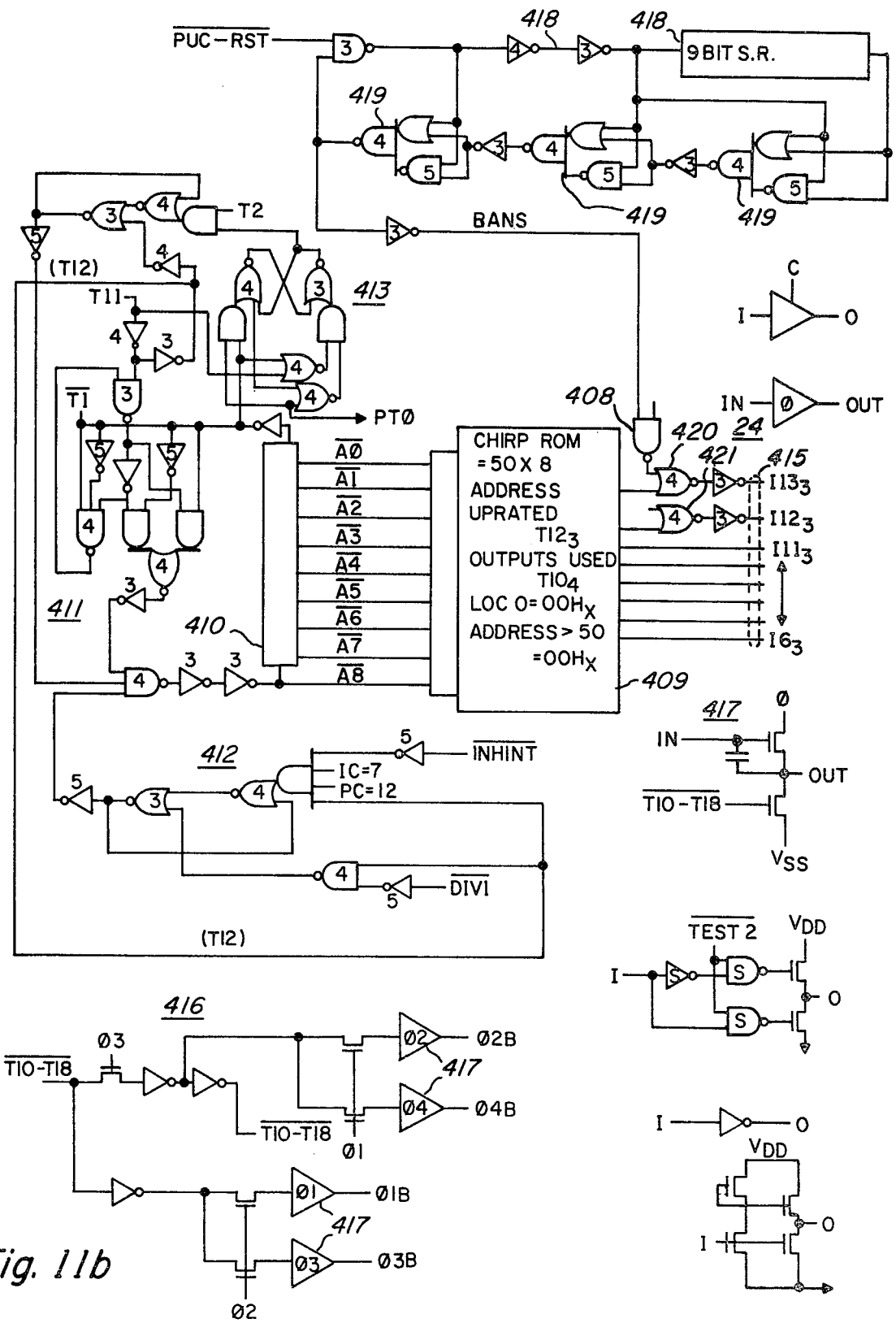

FIGS. 11a–11b form a composite, detailed logic diagram of lattice filter and excitation generator 24 (other than array multiplier 401) and output section 25. In filter and excitation generator 24 is a summer 404 which is connected to receive at one input thereof either the true or inverted output of array multiplier 401 (see FIGS. 10a and 10b) on lines P0–P13 via summer multiplexer 402. The other input of adder 404 is connected via summer multiplexer 402 to receive either the output of adder 404 (at T10–T18), the output of delay stack 406 on lines 440–453 at T20–T7 and T9), the output of Y-latch 403 (at T8) or a logical zero from φ3 precharge gate 420 (at T19 when no conditional discharge is applied to this input). The reasons these signals are applied at these times can be seen from FIG. 8 of the aforementioned U.S. Patent application Ser. No. 807,461, since abandoned and continued in U.S. Patent application Ser. No. b 905,328, filed May 12, 1978; it is to be remembered of course, that the time period designations differs as discussed with reference to FIG. 5 hereof.

The output of adder 404 is applied to delay stack 406, multiplier multiplexer 405, one period delay gates 414 and summer multiplexer 402. Multiplier multiplexer 405 includes a one period delay gates 414 which are generally equivalent to one period delay 34′ of FIG. 7 in U.S. Patent'application Ser. No. 807,461, since abandoned and continued in U.S. Patent application Ser. No. 905,328, filed May 12, 1978. Y-latch 403 is connected to receive the output of delay stack 406. Multiplier multiplexer 405 selectively applies the output from Y-latch 403, one period delay gated 414, or the excitation signal on bus 415 to the input MR0-MR13 of array multiplier 401. The inputs D0-D13 to delay stack 406 are derived from the outputs of adders 404. The logics for summer multiplier 402, adder 404, Y-latch 403, multiplier multiplexer 405 and one period delay circuit 414 are only shown in detail for the least significant bit as enclosed by dotted line reference A. The thirteen most significant bits in the lattice filter also are provided by logics such as those enclosed by the reference A line, which logics are denoted by long rectangular phantom line boxes labeled "A". The logics for each parallel bit being processed in the lattice filter are not shown in detail for sake of clarity. The portions of the lattice filter handling bits more significant than the least significant bit differ from the logic shown for elements 402, 403, 404, 405, and 14 only with respect to the interconnections made with truncation logics 501 and bus 415 which connects to UV gate 408 and chirp ROM 409. In this respect, the output from UV gate 408 and chirp ROM 409 is only applied to inputs I13-I6 and therefore the input labeled $I_x$ within the reference A phantom line is not needed for the six least significant bits in the lattice filter. Similarly, the output from the Y-latch 403 is only applied for the ten most significant bits, $YL_{13}$ through $YL_4$, and therefore the connection labeled YLx within the reference line is not required for the four least significant bits in the lattice filter.

Delay stack 406 comprises 14 nine bit long shift registers, each stage of which comprise inverters clocked on $\phi 4$ and $\phi 3$ clocks. As is discussed in U.S. Patent application Ser. No. 807, 461, since abandoned and continued in U.S. Patent application Ser. No. 905,328, filed May 12, 1978, the delay stack 406 which generally corresponds to shift register 35' of FIG. 7 of the aforementioned patent, is only shifted on certain periods. This is accomplished by logics 416 whereby $\phi 1B$-$\phi 4B$ clocks are generated from T10-T18 timing signal from PLA 512 (FIGS. 7a and 7b). The clock buffers 417 in circuit 416 are also shown in detail in FIGS. 11a and 11b.

Delay stack 406 is nine bits long whereas shift register 35' in FIG. 7 of U.S. Patent application Ser. No. 807,461, since abandoned and continued in U.S. Patent application Ser. No. 905,328, filed May 2, 1978, was eight bits long; this difference occurs because the input to delay stack 406 is shown as being connected from the output of adder 404 as opposed to the output of one period delay circuit 414. Of course, the input to delay stack 406 could be connected from the outputs of one period delay circuit 414 and the timing associated therewith modified to correspond with that shown in U.S. Patent application Ser. No. 807,461, since abandoned and continued in U.S. Patent application Ser. No. 905,328, filed May 12, 1978.

The data handled in delay stack 406, array multiplier 401, adder 402, summer multiplexer 402, Y-latch 403, and multiplier multiplexer 405 is preferably handled in two's complement notation.

Unvoiced generator 407 is a random noise generator comprising a shift register 418 with a feedback term supplied by feedback logics 419 for generating pseudorandom terms in shift register 418. An output is taken therefrom and is applied to UV gate 408 which is also responsive to OLDP from latch 208d (FIGS. 8a and 8b). Old pitch latch 208d controls gate 408 because pitch=0 latch 208b changes state immediately when the new speech parameters are inputted to register 205. However, since this occurs during interpolation count IC0 and since, during an unvoiced condition the new values are not interpolated into K-stack 302, E10 loop 304 and pitch register 305 until the following ICO, the speech excitation value cannot change from a periodic excitation from chirp ROM 409 to a random excitation from unvoiced generator 407 until eight interpolation cycles have occurred. Gate 420 nors the output of gate 408 into the most significant bit of the excitation signal, $I_{13}$, thereby effectively causing the sign bit to randomly change during unvoiced speech. Gate 421 effectively forces the most significant bit of the excitation signal, $I_{12}$, to a logical one during unvoiced speech conditions. Thus the combined effect of gates 408, 420 and 421 is to cause a randomly changing sign to be associated with a steady decimal equivalent value of 0.5 to be applied to the lattice filter and Filtering Excitation Generator 24.

Figure 14A:
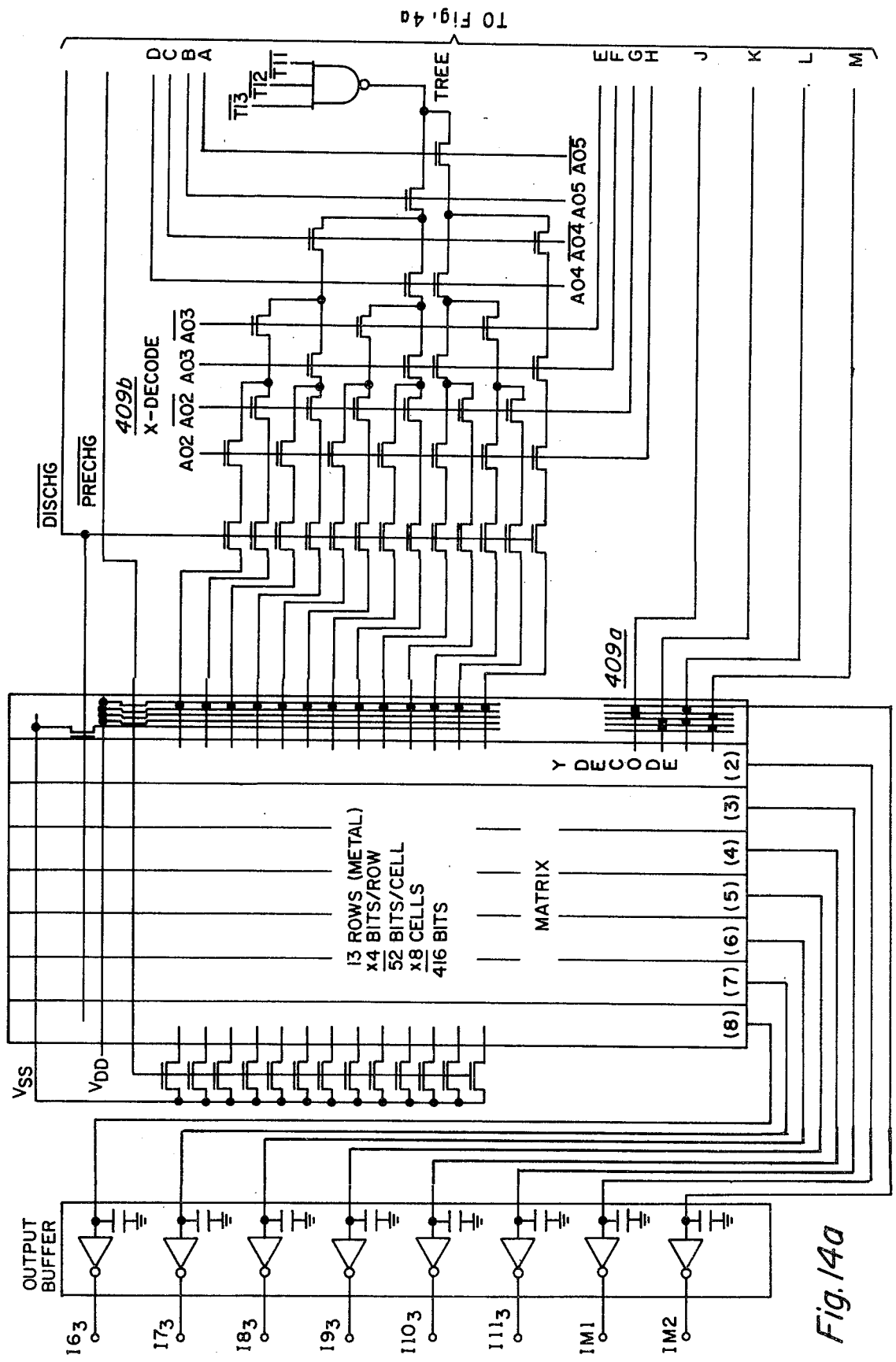
FIGS. 14a–14b form a composite diagram of the chirp ROM.
Figure 14B:
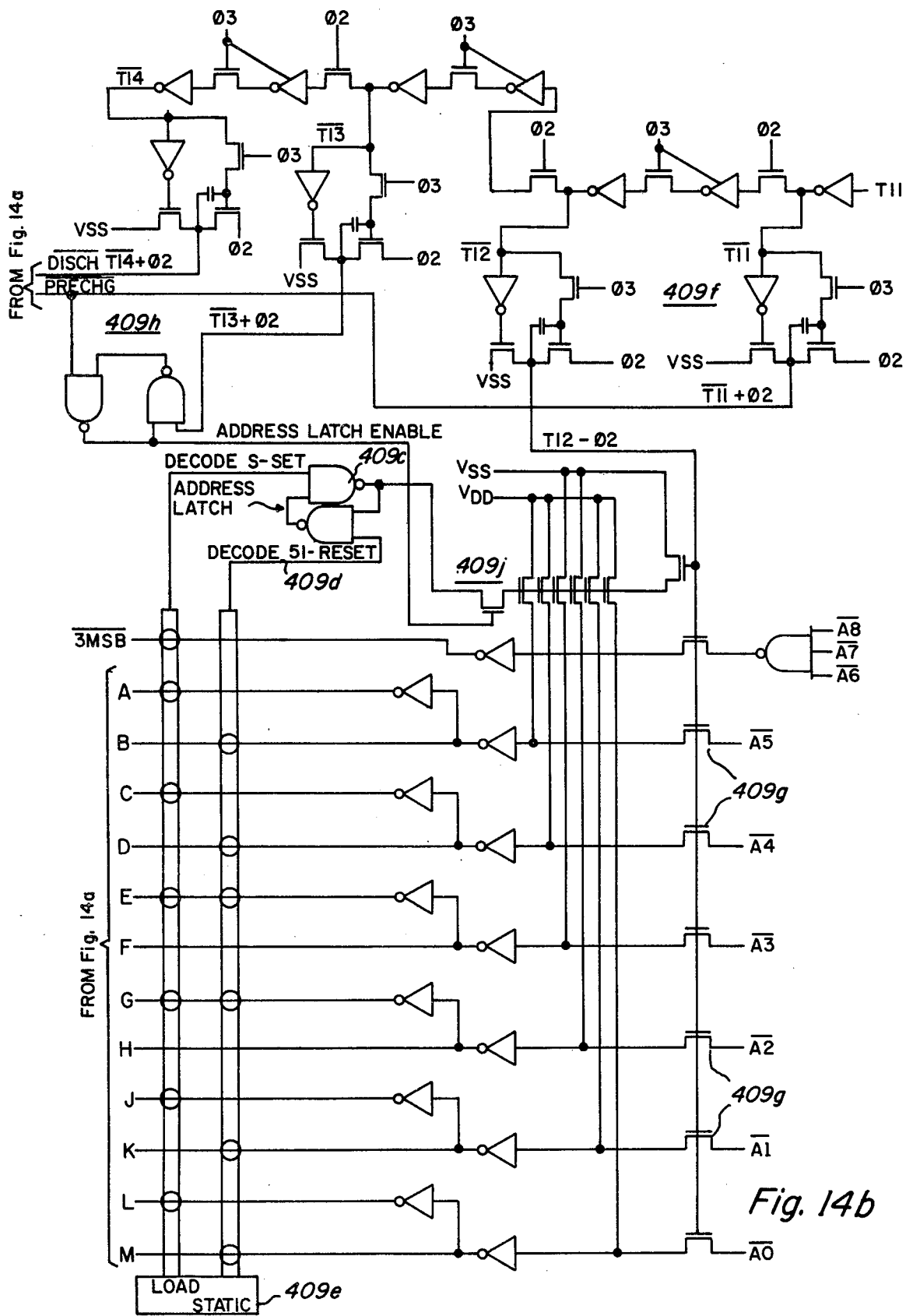

During voiced speech, chirp ROM 409 provides an eight bit output on lines $I_6$-$I_{13}$ to the lattice filter. This output comprises forty-one successively changing values which, when graphed, represent a chirp function. The contents of ROM 409 are listed in Table VIII; ROM 404 is set up to invert its outputs and thus the data is stored therein in complemented format. The chirp function value and the complemented value stored in the chirp ROM are expressed in two's complement hexadecimal notation. ROM 409 is addressed by an eight bit register 410 whose contents are normally updated during each cycle through the lattice filter by add one circuit 411. The output of register 410 is compared with the contents of pitch register 305 in a magnitude comparitor 403 for zeroing the contents of 410 when the contents of register 410 become equal to or greater than the contents of register 305. ROM 409, which is shown in greater detail in FIGS. 14a-14b, is arranged so that addresses greater than 110010 cause all zeroes to be outputted on lines $I_{13}$-$I_6$ to multiplier multiplexer 405. Zeros are also stored in address locations 41-51. Thus, the chirp may be expanded to occupy up to address location fifty, if desired.

Random Access Memory Logic Diagram

Referring now to FIGS. 12a -12b, there is shown a composite detailed logic diagram of RAM 203. RAM 203 is addressed by address on PC1-PC4, which address is decoded in a PLA 203a and defines which coded parameter is to be inputted into RAM 203. RAM 203 stores the twelve decoded parameters, the parameters having bit lengths varing between three bits and five bits according to the decoding scheme described with reference to FIG. 6. Each cell, reference B, of RAM 203 is shown in greater detail in FIG. 12b. Read/-Write control logic 203b is responsive to T1, DIV1, PC0 and parameter load enable for writing into the RAM 203 during the A cycle of each parameter count during interpolation count zero when enabled by parameter load enable from logics 238 (FIGS. 8a-c). Data is inputted to RAM 203 on lines IN0-IN4 from register 205 as shown in FIGS. 8a and 8b and data is outputted on lines OUT1-OUT5 to ROM 202 as is shown in the aforementioned figures.

Parameter Read-Only-Memory Logic Diagram

Figure 13A:
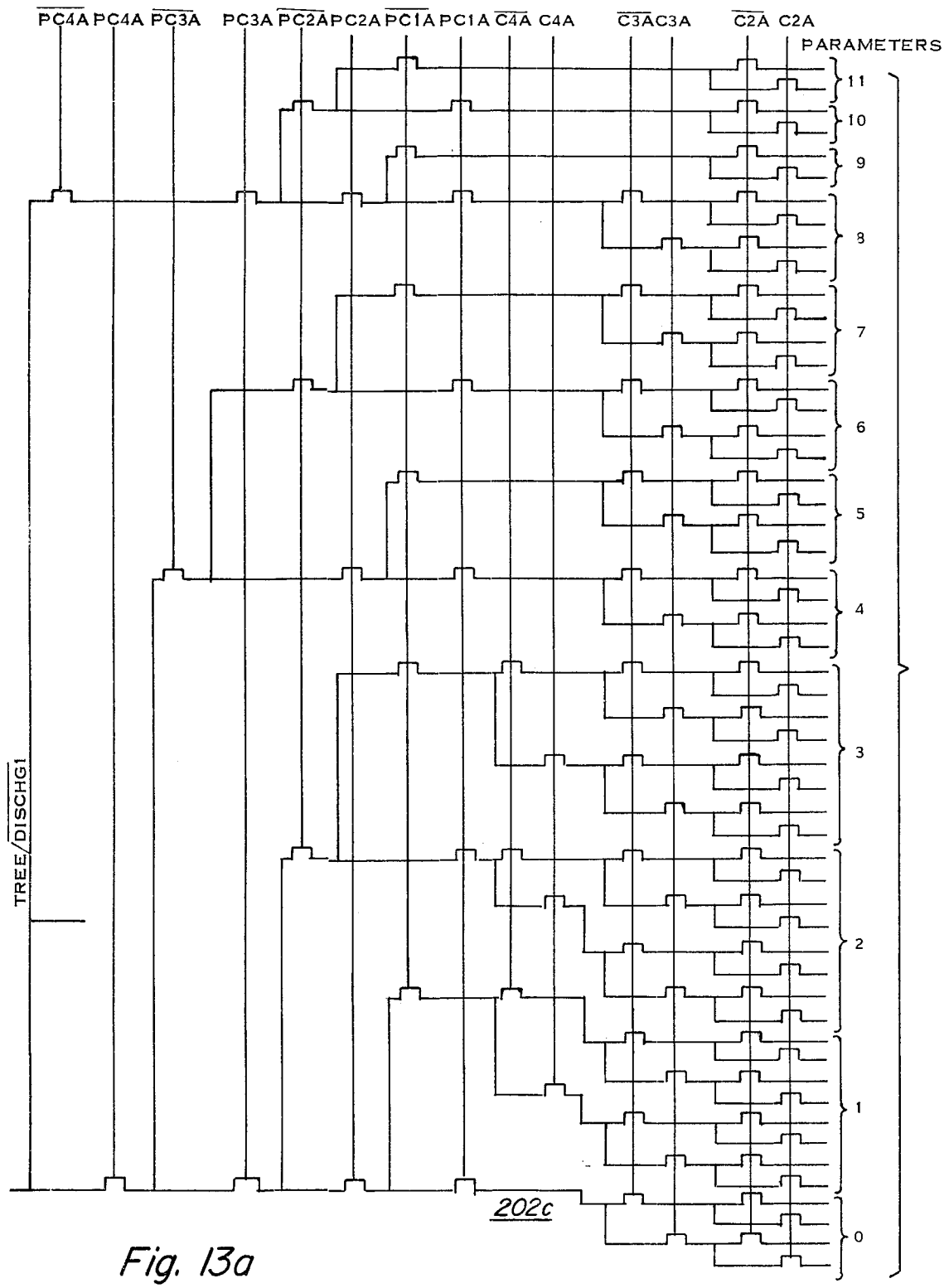
FIGS. 13a and 13b are schematic diagrams of the parameter ROM.
Figure 13B:
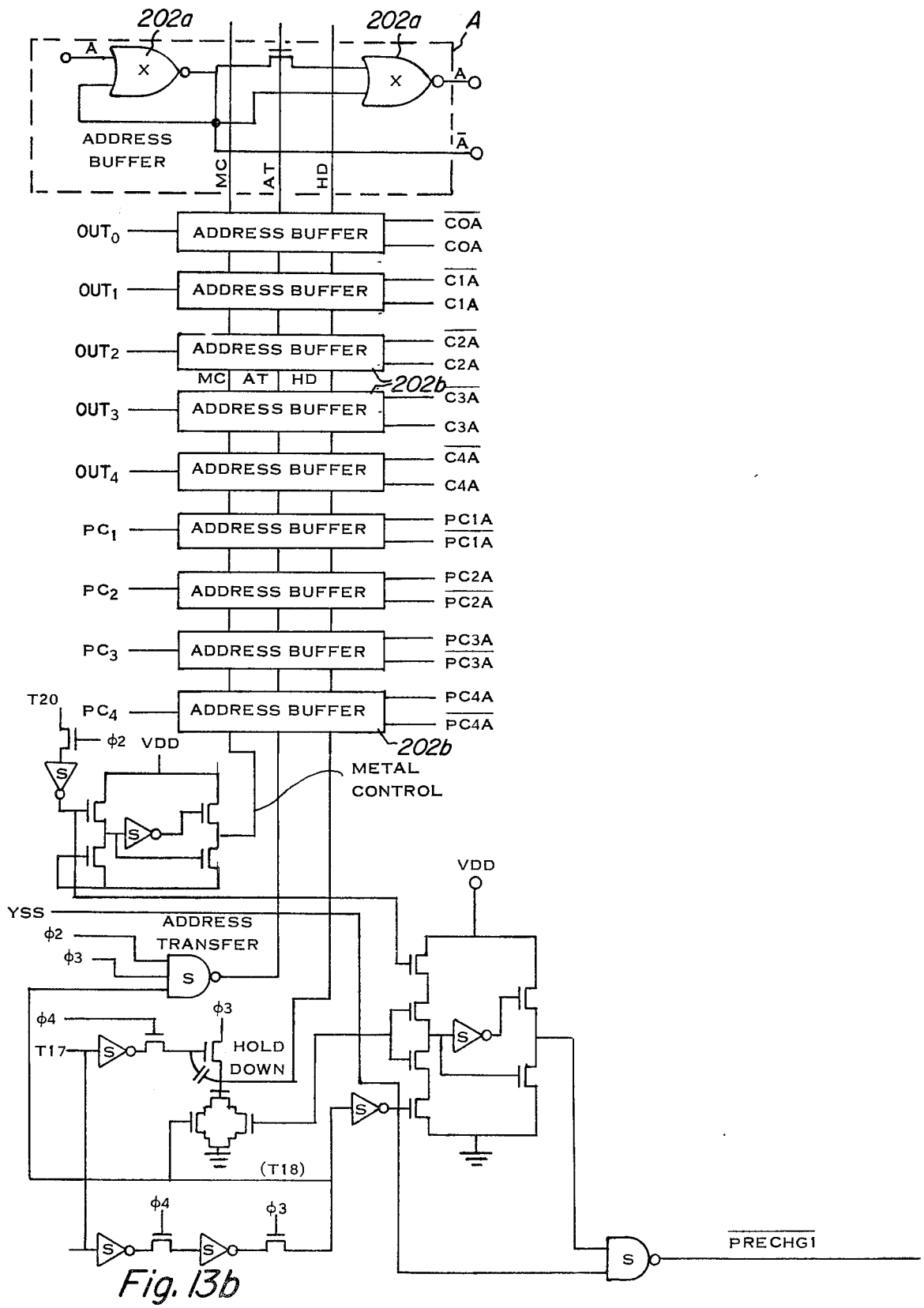

In FIGS. 13a -13b, there is shown a logic diagram of ROM 202. ROM 202 is preferably a virtual ground ROM of the type disclosed in U.S. Pat. No. 3,934,233. Address information from RAM 202 and from parameter counter 513 are applied to address buffers 202b which are shown in detail at reference A. The NOR gates 202a used in address buffers 202b are shown in detail at reference B. The outputs of the address buffers 202b are applied to an X-decoder 202c or to a Y-decoder 202d. The ROM is divided into ten sections labeled reference C, one of which is shown in greater detail. The outline for output line from each of the sections is applied to register 201 via inverters as shown in FIGS. 8a and 8b. X-decoder selects one of fifty-four X-decode lines while Y-decoder 202d test for the presence or nonpresence of a transistor cell between an adjacent pair of diffusion lines, as is explained in greater detail in the aforementioned U.S. Pat. No. 3,934,233. The data preferably stored in ROM 202 of this embodiment is listed in Table VI.

Chirp Read-Only-Memory Logic Diagram

FIGS. 14a–14b form a composite diagram of chirp ROM 409. ROM 409 is addressed via address lines $\overline{A_0}$–$\overline{A_8}$ from register 410 (FIGS. 11a–11b) and output information on lines $I_6$–$I_{11}$ to multiplier multiplexer 405 and lines $I_{m1}$ and $I_{m2}$ to gates 421 and 420, all which are shown in FIGS. 11a and 11b. As was previously discussed with reference to FIGS. 11a and 11b, chirp ROM outputs all zeros after a predetermined count is reached in register 410, which, in this case is the count equivalent to a decimal 51. ROM 409 includes a Y-decoder 409a which is responsive to the address on lines $A_0$ and $A_1$ (and $\overline{A_0}$ and $\overline{A_1}$) in an X-decoder 409b which is responsive to the address on lines $\overline{A_2}$ through $\overline{A_5}$ (and $A_2$–$A_5$).

ROM 409 also includes a latch 409c which is set when decimal 51 is detected on lines $\overline{A_0}$–$\overline{A_5}$ according to line 409c from a decoder 409e. Decoder 409e also decodes a logical zero on lines $\overline{A_0}$–$\overline{A_8}$ for resetting latch 409c. ROM 409 includes timing logics 409f which permit data to be clocked in via gates 409g at time period T12. At this time decoder 409e checks to determine whether either a decimal 0 or decimal 51 is occurring on address lines $\overline{A_0}$–$\overline{A_8}$. If either condition occur, latch 409c, which is a static latch, is caused to flip.

An address latch 409h is set at time period T13 and reset at time period T11. Latch 409h permits latch 409c to force a decimal 51 onto lines $\overline{A_0}$–$\overline{A_5}$ when latch 409c is set. Thus, for addresses greater than 51 address register 410, the address is first sampled at time period T12 to determine whether it has been reset to zero by reset logic 412 (FIGS. 12a–12b) for the purpose of resetting latch 409c and if the address has not been reset to zero then whatever address has been inputted on lines $\overline{A_0}$–$\overline{A_8}$ is written over by logics 409j at T13. Of course, at location 51 in ROM 409 will be stored all zeros on the output lines $I_6$–$I_{11}$, IM1, and IM2. Thus by the means of logics 409c, 409h and 409j addresses of a preselected value, in this case a decimal 51, are merely tested to determine whether a reset has occurred but are not permitted to address the array of ROM cells via decoders 409a and 409b. Address between a decimal 0 and 50 address the ROM normally via decoders 409a and 409b. The ROM matrix is preferably of the virtual ground type described in U.S. Pat. No. 3,934,233. As aforementioned, the contents of ROM 409 are listed in Table VIII. The chirp function is located at addresses 00–40 while zeros are located at addresses 41–51.

Truncation Logic and Digital-To-Analog Converter

Turning again to FIGS. 11a and 11b, the truncation logic 425 and Digital-to-Analog (D/A) converter is shown in detail. Truncation logic 425 includes circuitry for converting the two's complement data on $YL_{1}$-3–$YL_{14}$ to sign magnitude data. Logics 425a test the MSB from Y-latch 403 on line $YL_{13}$ for the purpose of generating a sign bit and for controlling the two's complement to sign magnitude conversion accomplished by logics 425c. The sign bit is supplied in true and false logic on lines D/Asn and $\overline{D/Asn}$ to D/A converter 426.

Logics 425c convert the two's complement data from Y-latches 403 in lines $YL_{10}$–$YL_4$ to simple magnitude notation on lines $D/A_6$–$D/A_0$. Only the logics 425c associated with $YL_{10}$ are shown in detail for sake of simplicity.

Logics 425b sample the $YL_{12}$ and $YL_{11}$ bits from th Y-latches 403 and perform a magnitude truncation function thereon by forcing outputs $D/A_6$ through $D/A_0$ to a logical zero (i.e., a value of one if the outputs were in true logic) wherever either $YL_{12}$ or $YL_{11}$ is a logical one and $YL_{13}$ is a logical zero, indicating that the value is positive or either $YL_{12}$ or $YL_{11}$ is a logical zero and $YL_{13}$ is a logical one, indicating that the value is negative (and complemented, of course). Whenever one of these conditions occurs, a logical zero appears on line 27 and Vss is thereby coupled to the output buffer 428 in each of logics 425c. The magnitude function effectively truncates the more significant bits on $YL_{11}$ and $YL_{12}$. It is realized that this is somewhat unorthodox truncation since normally the less signficant bits are truncated in most other circuits where truncation occurs. However, in this circuit, large positive or negative values are effectively clipped. More important digital speech information, which has smaller magnitudes, is effectively amplified by a factor of four by this truncation scheme.

Figure 23A:
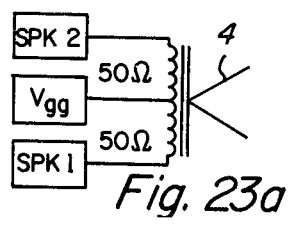
FIGS. 23a–23b depict embodiments of the voice coil connection.

The outputs $\overline{D/A_6}$–$\overline{D/A_0}$, along with $\overline{D/Asn}$, are coupled to D/A converter 426. D/A converter 426 preferably has seven MOS devices 429 coupled to the seven lines $\overline{D/A_6}$ through $\overline{D/A_0}$ from truncation logics 425. Each device 429 preferably includes a MOS transistor whose gates is coupled to one of the lines $\overline{D/A_6}$–$\overline{D/A_0}$ and a series connected implanted load transistor 429b. Devices 429 are arranged, by controlling their length to width ratios, to act as current sources, the device 429 coupled to $\overline{D/A_6}$ sourcing twice as much current (when on) as the device 429 coupled to $\overline{D/A_5}$. Likewise the devices 429 coupled to $\overline{D/A_5}$ is capable of sourcing twice as much current as the device 429 coupled to $\overline{D/A_4}$. This two to one current sourcing capability similarly applies to the remaining devices 429 coupled to the remaining lines $\overline{D/A_3}$–$\overline{D/A_0}$. Thus, device 429 coupled to $\overline{D/A_1}$, is likewise capable of sourcing twice as much current as the device 429 coupled to $\overline{D/A_0}$, but only one-half of that source by the device 429 coupled to $\overline{D/A_2}$. All devices 429 are connected in parallel, one side of which are preferably coupled to Vss and the other side is preferably coupled to either side of the speaker 4 via transistors 430 and 431. Transistor 430 is controlled by $\overline{D/Asn}$ which is applied to its gates; transistor 431 is turned off and on in response to D/Asn. Thus, either transistor 430 or 431 is on depending on the state of the sign bit, D/Asn. The voice coil of speaker 4 preferably has a 100 ohm impedance and has a center tap connected to Vgg, as shown in FIG. 23a. Thus, the signals on lines $\overline{D/A_6}$–$\overline{DA_0}$ control the magnitude of current flow through the voice coil while the signals on lines D/Asn and $\overline{D/Asn}$ control the direction of that flow.

Figure 23B:
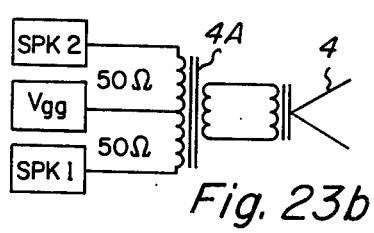

Alternatively to using a center-topped 100 ohm voice coil, a more conventional eight ohm speaker may be used along with a transformer having a 100 ohm center topped primary (connected to Vgg and transistors 430 and 431) and an eight ohm secondary (connected to the speaker's terminals), as shown in FIG. 23b.

It should now be appreciated by those skilled in the art that D/A converter 426 not only converts digital sign magnitude information on lines $\overline{D/A_6}$–$D/A_0$ and D/Asn–$\overline{D/Asn}$ to an analog signal, but has effectively amplified this analog signal to sufficient levels to permit a speaker to be driven directly from the MOS synthesis chip 10 (or via the aforementioned transformer, if desired). Of course, those skilled in the art will appreciate that simple D/A converters, such as that disclosed here, will find use in other applications in addition to speech synthesis circuits.

THE SPEECH SYNTHESIZER CHIP

Figure 22:
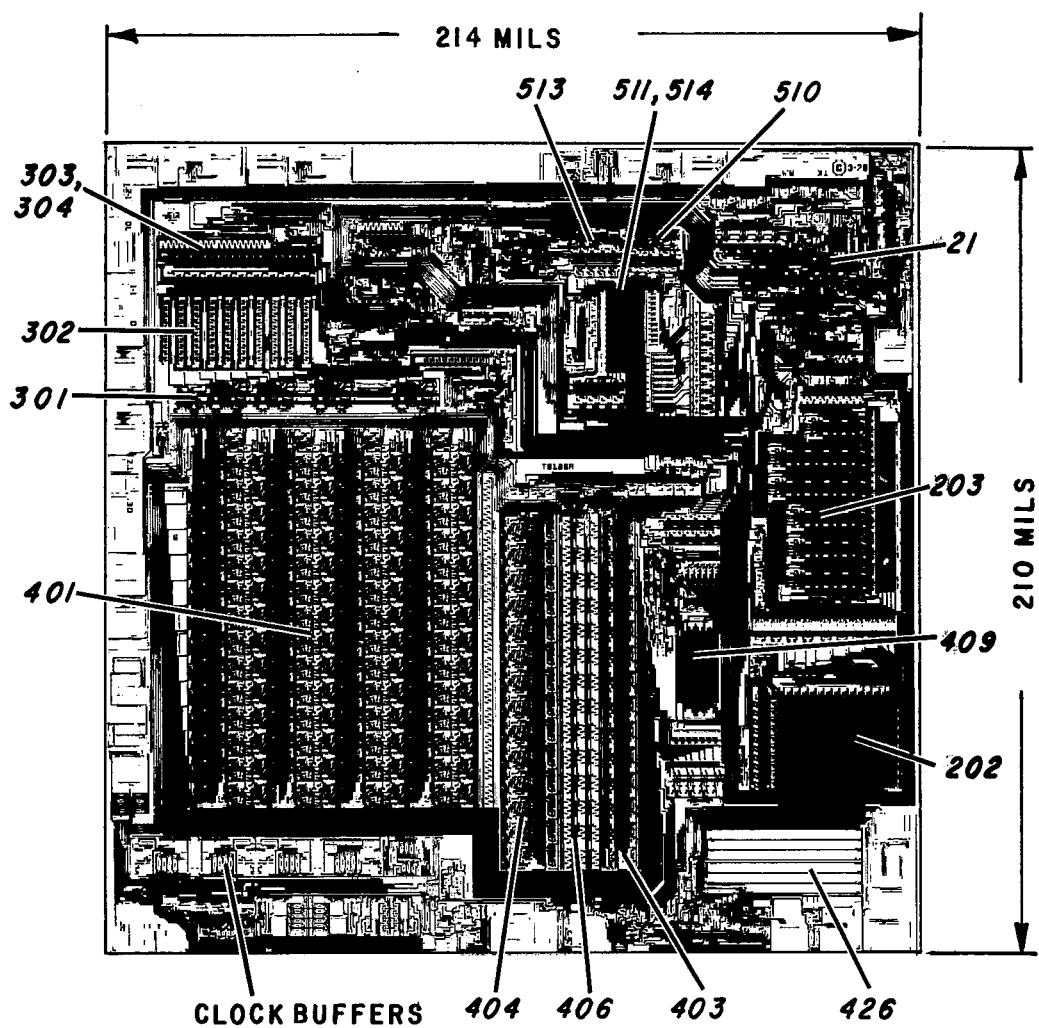
FIG. 22 is a plan view of the synthesizer chip herein described, showing the metal mask or metal pattern, enlarged about fifty times.

In FIG. 22 a greatly enlarged plan view of a semiconductor chip which contains the entire system of FIGS. 4a and 4b is illustrated. The chip is only about two hundred fifteen mils (about 0.215 inches) on a side. In the example shown, the chip is manufactured by the P-channel metal gate process using the following design rules: metal line width 0.25 mil; metal line spacing 0.25 mil; diffusion line width 0.15 mil; and diffusion line spacing 0.30 mil. Of course, as design rules are tightened with the advent of electron beam mask production or slice writing, and other techniques, it will be possible to further reduce the size of the synthesizer chip. The size of the synthesizer chip can, of course also be reduced by not taking advantage of some of the features preferably used on the synthesizer chip.

The total active area of speech synthesizer chip 10 is approximately 45,000 square mils.

It will also be appreciated by those skilled in the art, that other MOS manufacturing techniques, such as N-channel, complementary MOS (CMOS) or silicon gate process may alternatively be used.

The various parts of the system are labeled with the same reference numeral previously used in this description.

CONTROLLER LOGIC DIAGRAMS

The controller used in the learning aid is preferably a microprocessor of the type described in U.S. Pat. No. 4,074,355, with modifications which are subsequently described. U.S. Pat. No. 4,074,355 is hereby incorporated herein by reference. It is to be understood, of course, that other microprocessor, as well as future microprocessors, may well find use in applications such as the speaking learning aid described herein.

The microprocessor of U.S. Pat. No. 4,074,355 is an improved version of an earlier microprocessor described in U.s. Pat. 3,991,305. One of the improvements concerned the elimination of digit driver devices so that arrays of light emitting diodes (LED's) forming a display could be driven directly from the microprocessor. As a matter of design choice, the display used with this learning aid is preferably a vacuum fluorescent (VF) display device. Those skilled in the art will appreciate that when LED's are directly driven, the display segments are preferably sequentially actuated while the display's common character position electrodes are selectively actuated according to information in a display register or memory. When VF displays are utilized, on the other hand, the common character position electrodes are preferably sequentially actuated while the segments are selectively actuated according to information in the display register or memory. Thus, the microprocessor of U.S. Pat. No. 4,074,355 is preferably altered to utilize digit scan similar to that used in U.S. Pat. No. 3,991,305.

The microprocessor of U.S. Pat. No. 4,074,355 is a four bit processor and to process alphanumeric information, additional bits are required. By using six bits, which can represent 26 or 64 unique codes, the twenty-six characters of the alphabet, ten numerals as well as several special characters can be handled with ease. In lieu of converting the microprocessor of U.S. Pat. No. 4,074,355 directly to a six bit processor, it was accomplished indirectly by software pairing the four bit words into eight bit bytes and transmitting six of those bits to the display decoder.

Figure 15A:
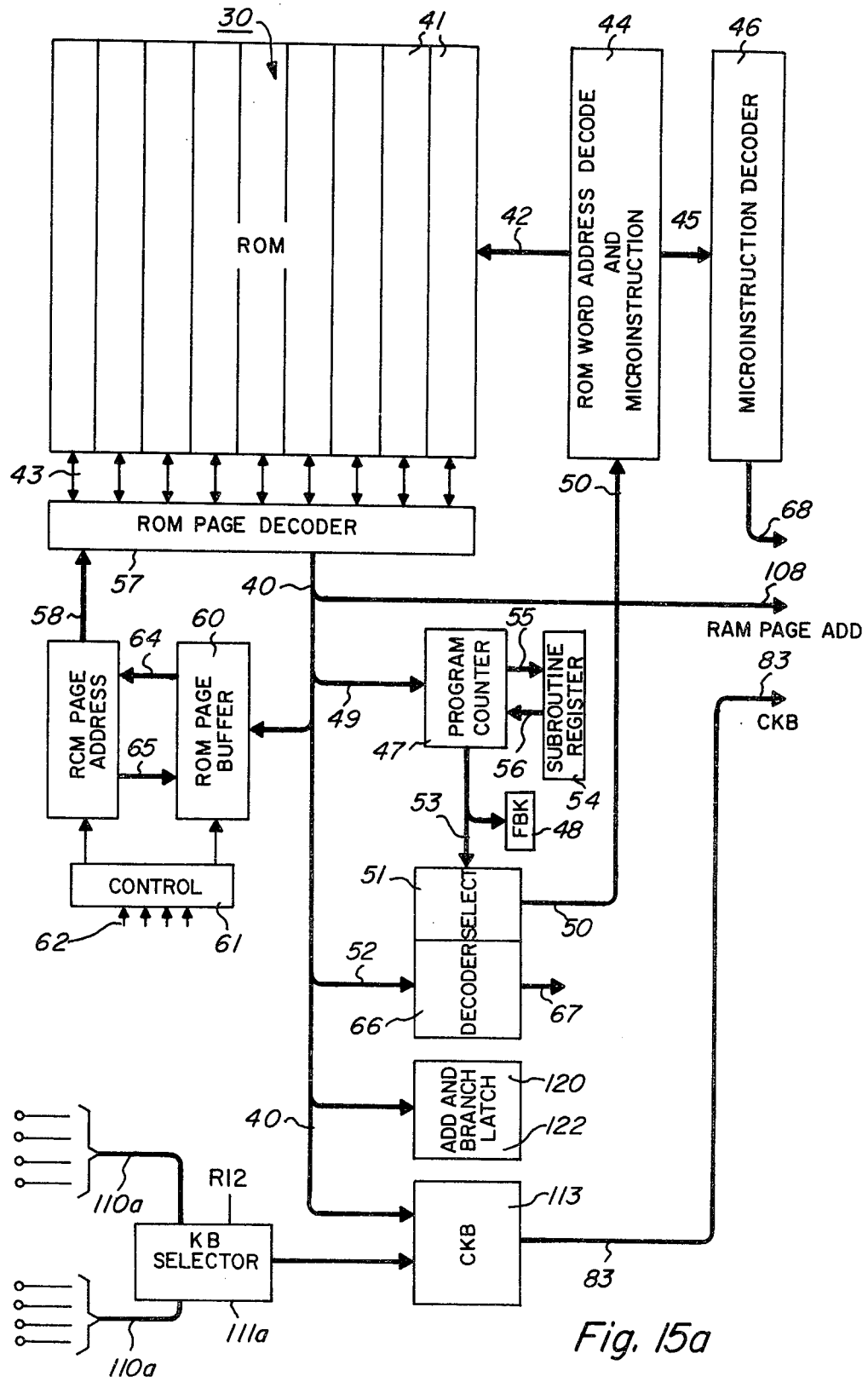
FIGS. 15a–15b form a composite block diagram of a microprocessor which may be utilized as the controller.
Figure 15B:
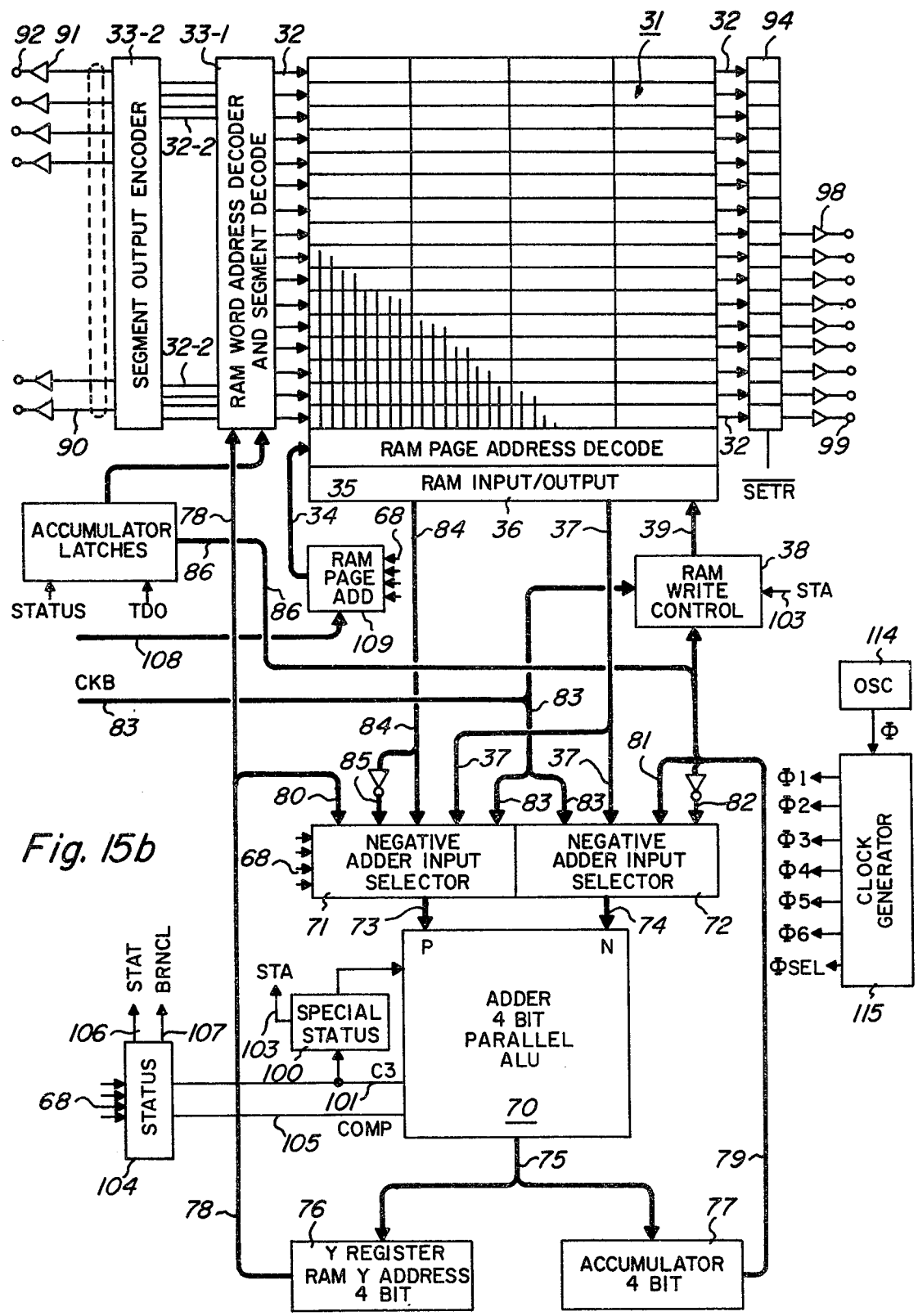

Referring now to FIGS. 15a–15b, which form a composite block diagram of the microprocessor preferably used in the learning aid, it should be appreciated that this block diagram generally corresponds with the block diagram of FIGS. 7a and 7b of U.S. Pat. No. 4,074,355; several modifications to provide the aforementioned features of six bit operation and VF display compatability are also shown. The numbering shown in FIGS. 15a and 15b generally agrees with that of U.S. Pat. No. 4,074,355. The modifications will now be described in detail.

Figure 13B:
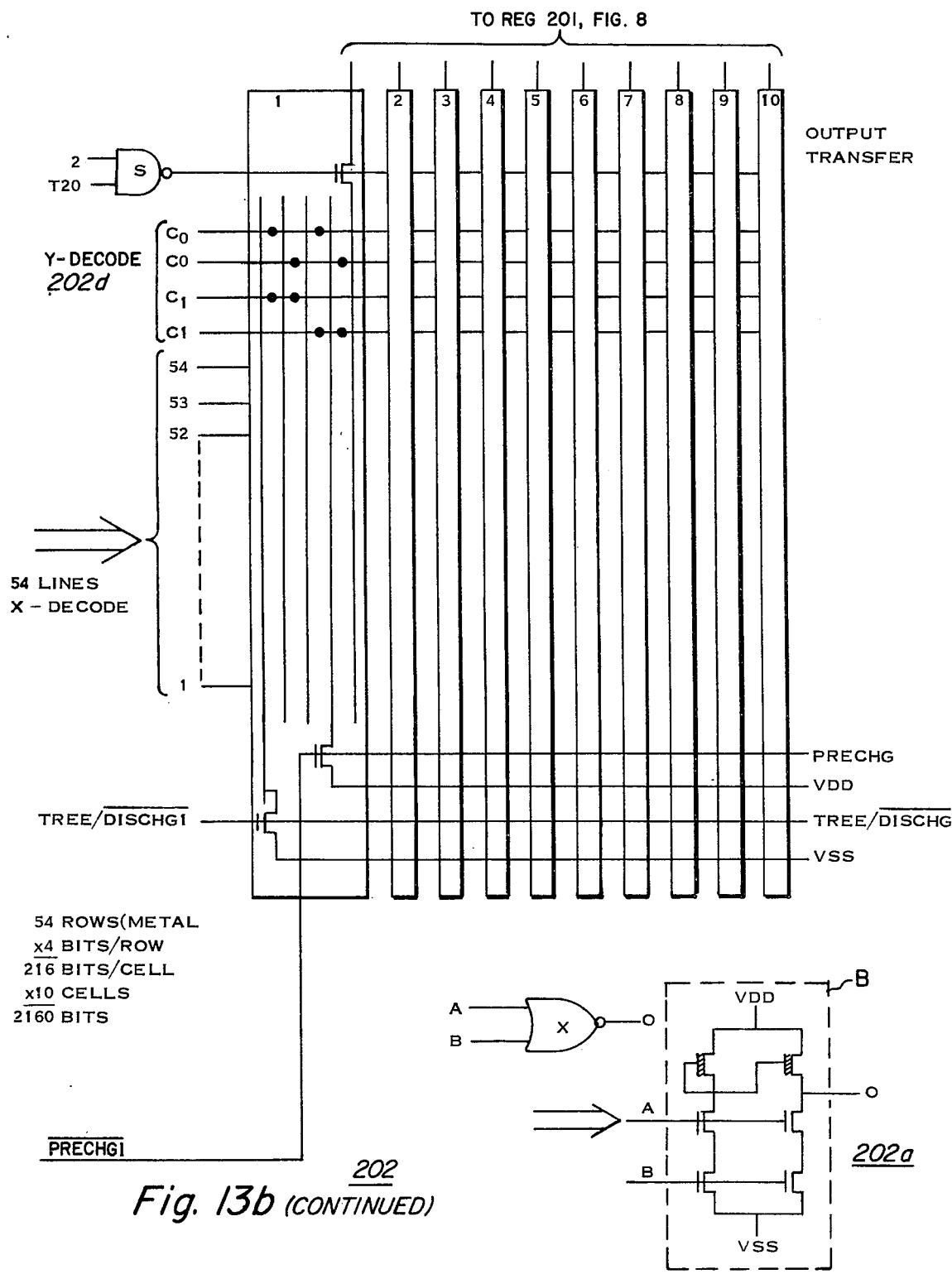
Figure 16A:
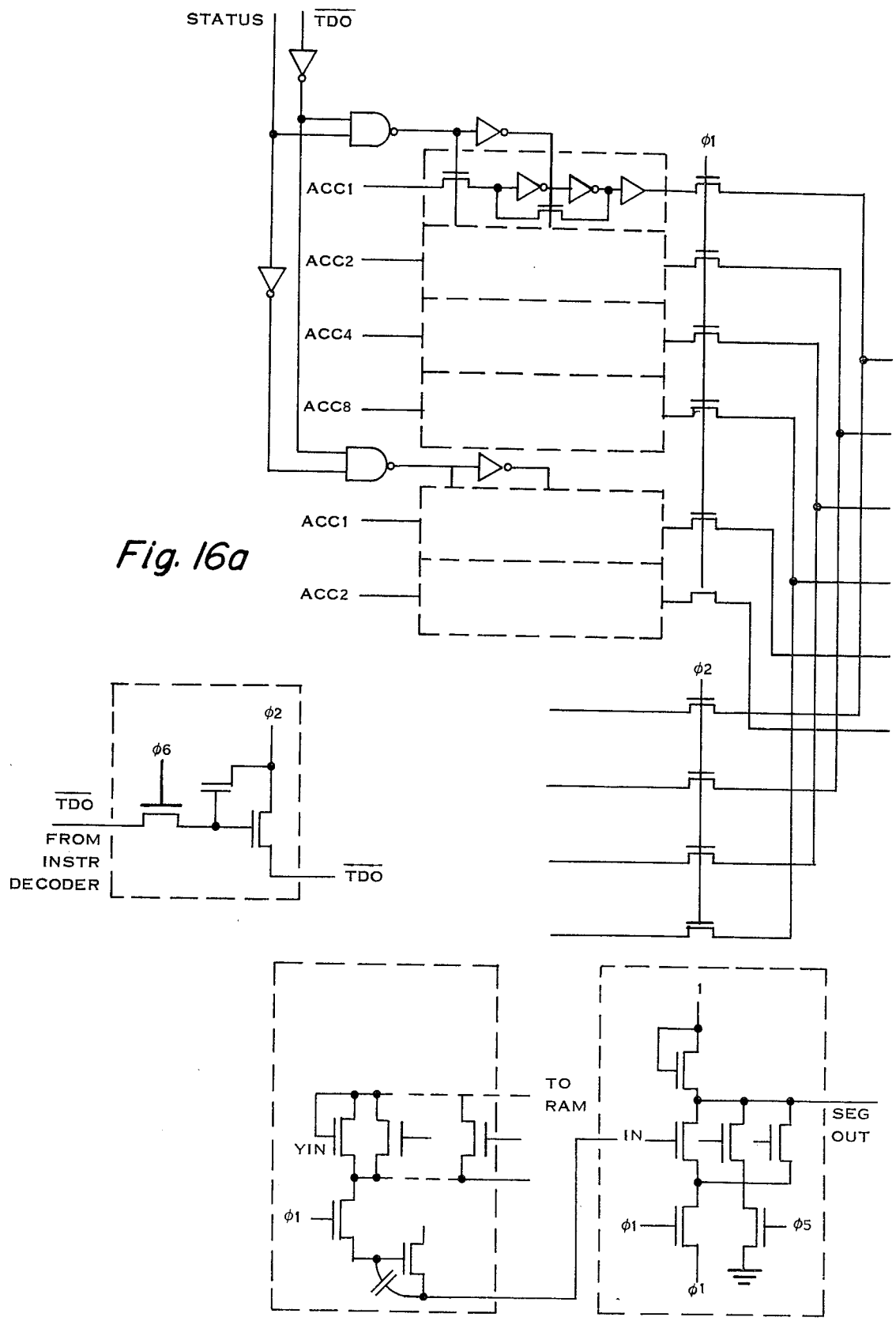
FIGS. 16a and 16b form a composite logic diagram of the segment decoder of the microprocessor.
Figure 16B:
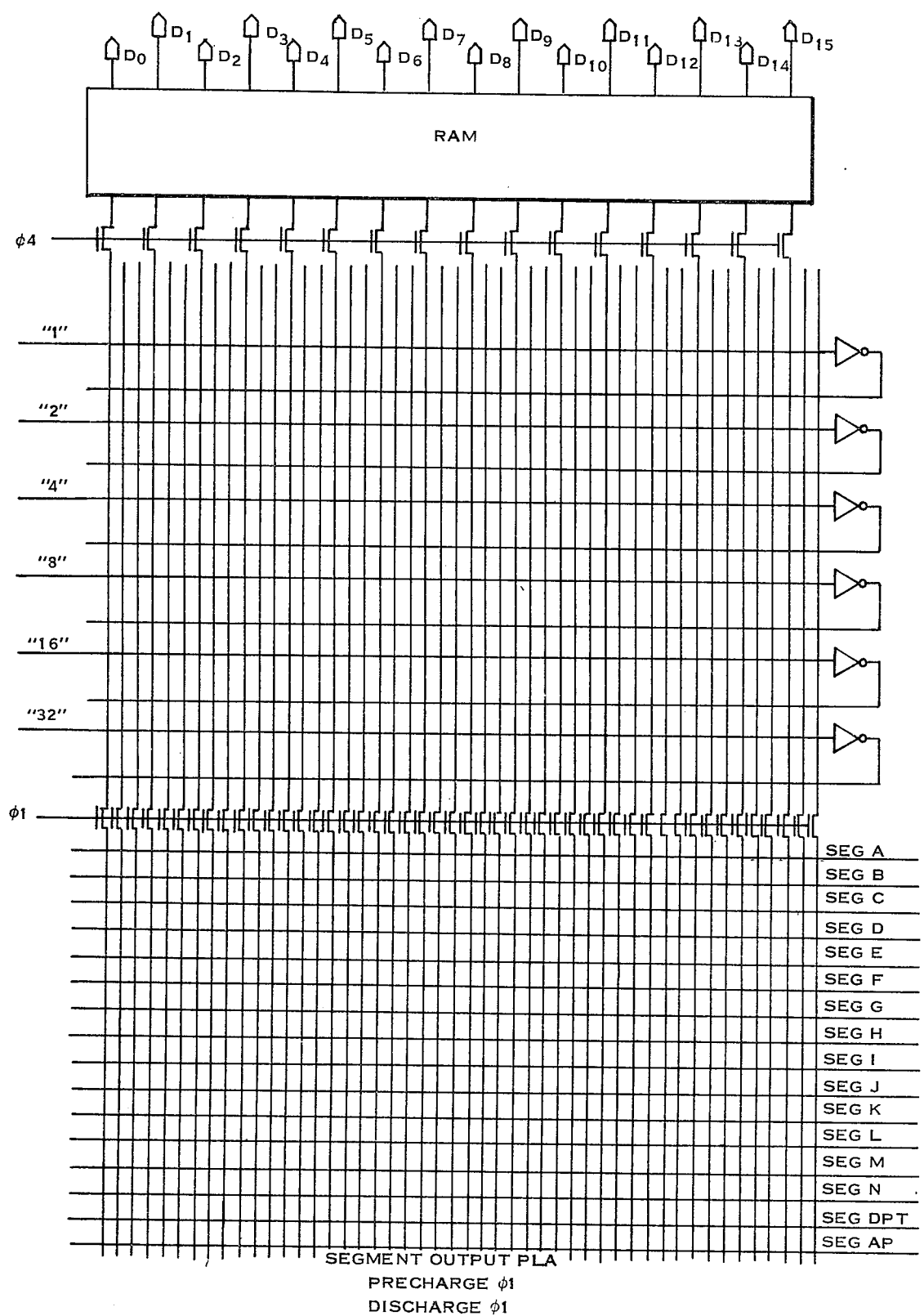
Figure 16B:
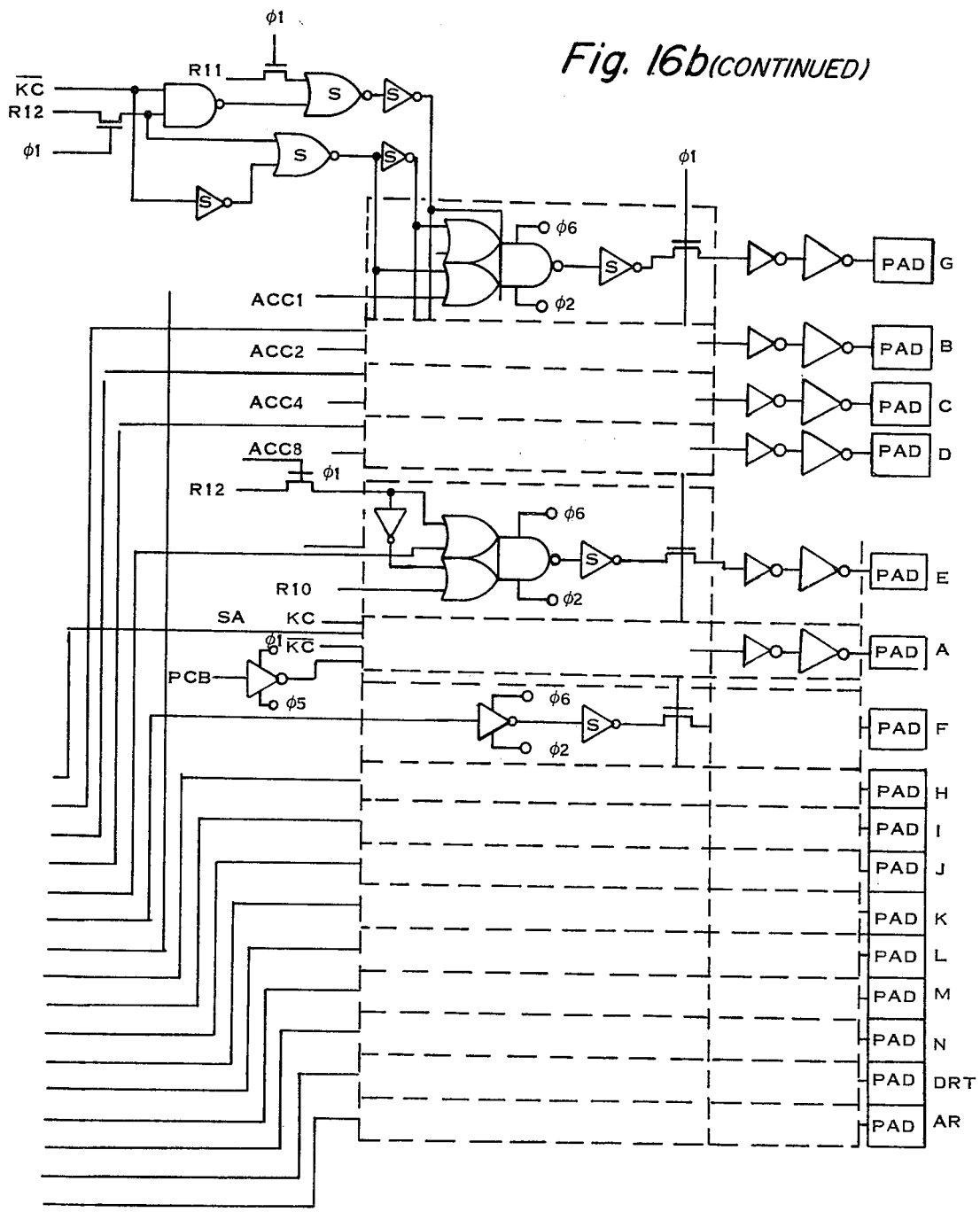

Referring now to the composite diagram formed by FIGS. 16a–16b, which replace FIG. 13 of U.S. Pat. No. 4,074,355, there can be seen the segment decoder and RAM address decoder 33-1 which decodes RAMY for addressing RAM 31 or ACC1–ACC8 for decoding segment information. Decoder 33-1 generally corresponds to decoder 33 in the aforementioned U.S. patent. The segment information is re-encoded into particular segment line information in output section 32-2 and outputted on bus 90 to segment drivers 91. Six bits of data from the processor's four bit accumulator 77 are decoder 33-1 as is now described. First, four bits on bus 6 are latched into accumulator latches 87-1 through 87-8 on a TDO (Transfer Data Out) instruction when status is a logical one. Then, two bits on bus 86 (from lines 86-1 and 86-2) are latched into accumulator latches 87-16 and 86-32, respectively, on another TD0 instruction when status is a logical zero. Then the six bits in latches 87-1 through 87-32 is decoded in decoder 33-1. Segment drivers 91 may preferably be of one of three types, 91A, 91B or 91C as shown on FIGS. 16a–16b. The 91A type drivers permits the data on ACC1–ACC8 to be communicated externally via pins SEG G, SEG B, SEG C and SEG D. The 91B type driver coupled to pin SEG E permits the contents of digit register 94-10 to be communicated externally when digit register 94-12 is set. The 91B type driver coupled to pin SEG A permits the contents of the program counter to be outputted during test operations.

Figure 17:
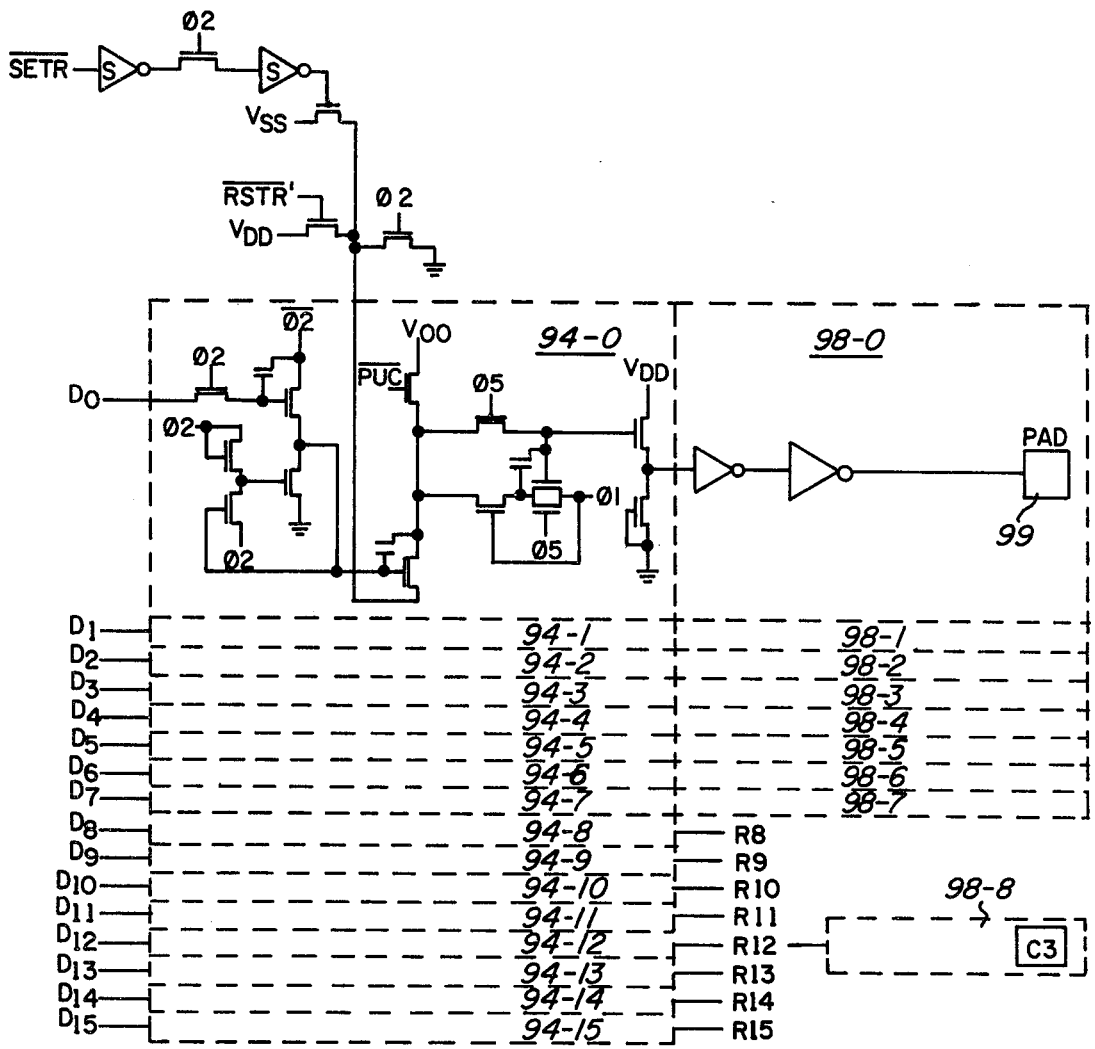
FIG. 17 depicts the digit output buffers and digit registers of the microprocessor.

The digit buffers registers and TD0 latches of FIG. 14 of U.S. Pat. No. 4,074,355 are also preferably with the digit buffers registers of FIG. 17 herein inasmuch as (1) the DDIG signal is no longer used and (2) the digit latches (elements 97 in U.S. Pat. No. 4,074,355) are no longer used. For simplicity's sake, only one of the digit output buffer registers 94 is shown in detail. Further, since in this embodiment of the learning aid, display 2 preferably has eight character positions, eight output buffers 98-0 through 98-7 connect $D_0$-$D_7$ to the common electrodes of display 2 via registers 94-0 through 94-7 are shown in FIG. 17. An additional output buffer 98-8 communicates the contents of registers 94-12, which is the chip select signal, to synthesizer 10.

To facilitate bi-directional communcation with synthesizer 10, the microprocessor of U.S. Pat. No. 4,074,355 is preferably modified to permit bi-directional communication on pins SEG G, SEG B, SEG C and SEG D. Thus, in FIG. 18, these SEG pins are coupled to the normal K lines, 112-1 through 112-8, via an input selector 111a for inputting information when digit registers 94-12 (R12) is set. Further, these pins are also coupled to ACC1-ACC8 via segment drivers 91A when digit registers 94-12 (R12) and 94-11 (R11) are set for outputting information in accumulator 77.

Figure 18:
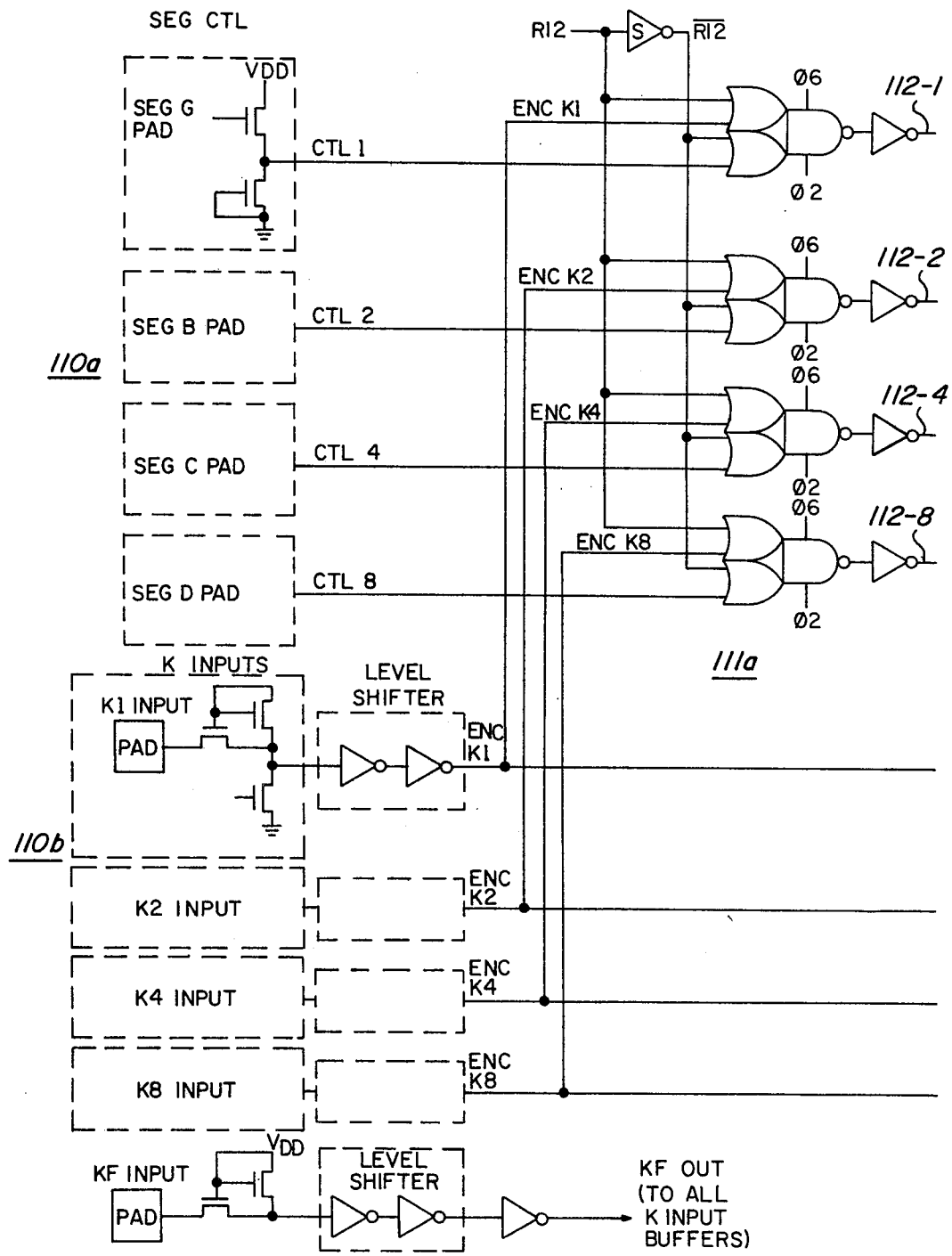
FIG. 18 depicts the KB selector circuit of the microprocessor.

Thus, when digit latch 94-12 (which communicates the chip select signal externally) is set, SEG E is coupled to R10 (digit registers 94-10) for communicating the PDC signal to synthesizer 10. Also, ACC1-ACC8 is outputted on SEG G and SEG B-SEG D, during the time R12 and R11 are set. When R11 is a logical 0, i.e. is reset, segment drivers 91A are turned off and data may be read into CKB circuit 113 for receiving data from ROMs 12a-12b via synthesizer 10, for instance. FIG. 18 replaces the keyboard circuit 111 shown in FIG. 22 of U.S. Pat. No. 4,064,554.

Preferably, pins SEG G and SEG B-SEG D are coupled to CTL1-CTL8 pins of synthesizer 10, while pin SEG E is coupled to the PDC pin of synthesizer 10.

In Table IX (which comprises Tables 0 through IX-15) is listed the set of instructions which may be stored in the main Read-Only-Memory 30 of FIGS. 15a-15b to provide controller 11. Referring now to Table IX, there are several columns of data which are, reading from left to right: PC (Program Counter), INST (Instuction), BRLN (Branch Line), Line and Source Statement (which includes Name, Title and Comments). In U.S. Pat. No. 4,074,355, it can be seen that main Read-Only-Memory 30 is addressed with a seven bit address in program counter 47 and a four bit address in a buffer 60. The address in buffer 60 is referred to as a page address in the main Read-Only-Memory. The instructions listed on Table IX-0 correspond to page zero in the microprocessor while the instructions listed in Table IX-1 are those on page one and so forth through to the instructions in Table IX-15 which are stored on page fifteen in the microprocessor.

The program counter 47 of the aforementioned microprocessor is comprised of a feedback shift register and therefore counts in a pseudorandom fashion, thus the addresses in the left-hand column of Table IX, which are expressed as a hexadecimal number, exhibit such pseudorandomness. If the instruction starting at page zero were read out sequentially from the starting position in the program counter (00) then the instructions would be read out in the order shown in Table IX. In the "Line" column is listed a sequentially increasing decimal number associated with each source statement and its instruction and program counter address as well as those lines in which only comments appear. The line number starts at line 55 merely for reasons of convenience not important here. When an instruction requiring either a branch or call is to be performed, the address to which the program counter will jump and the page number to which the buffer will jump, if required, is reflected by the binary code comprising the instruction or instructions performing the branch or call. For sake of convenience, however, the branch line column indicates the line number in Table IX to which the branch or call will be made. For example, the instruction on line 59 (page 0, Program Counter Address 0F) is a branch instruction, with a branch address of 1010111(57 in hexadecimal). To facilitate finding the 57 address in the program counter, the branch line column directs the reader to line 80, where the 57 address is located.

READ-ONLY-MEMORY LOGIC DIAGRAMS

Figure 19:
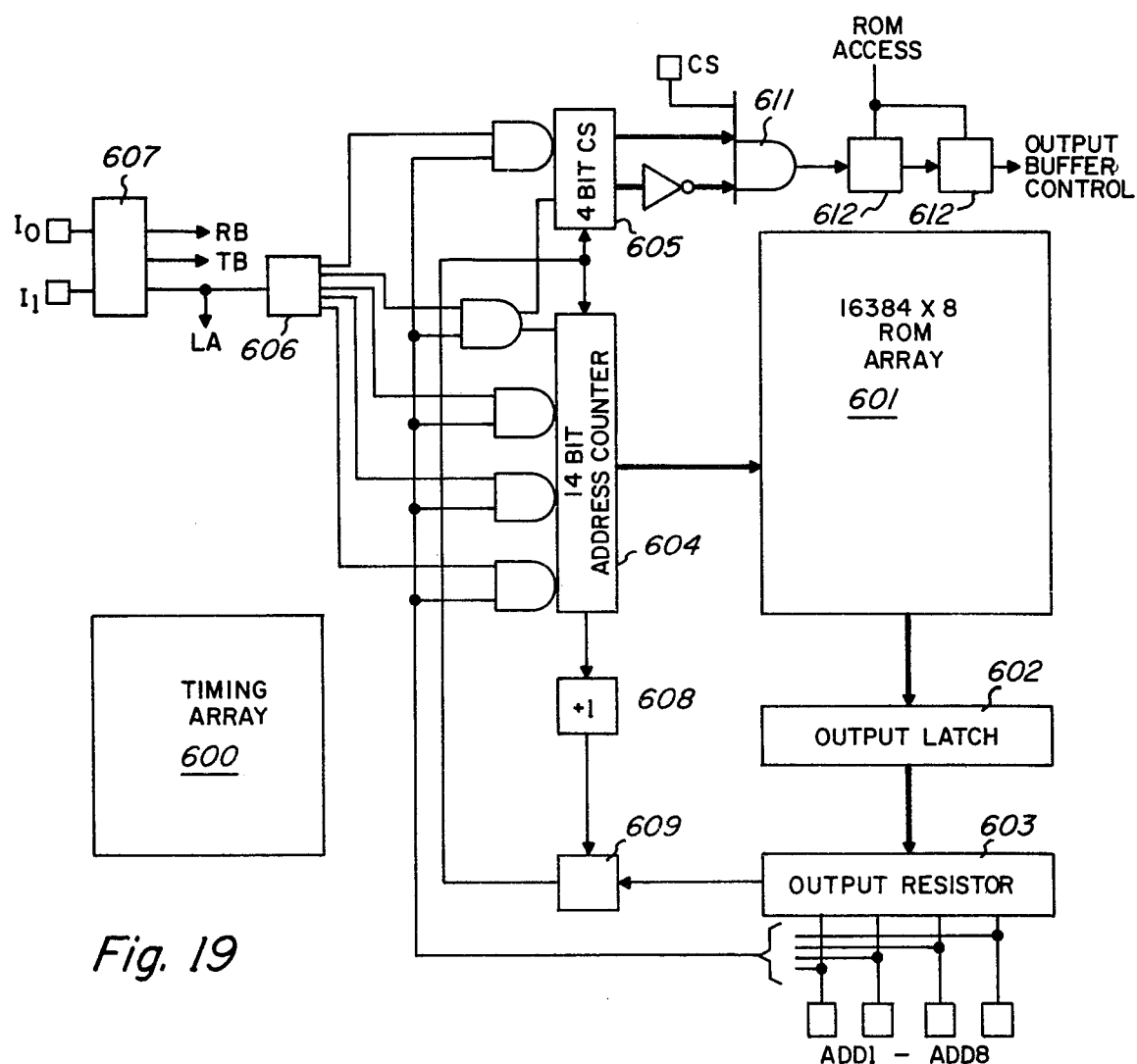
FIG. 19 is a block diagram of ROM's 12a, 12b, 13a or 13b.
Figure 20A:
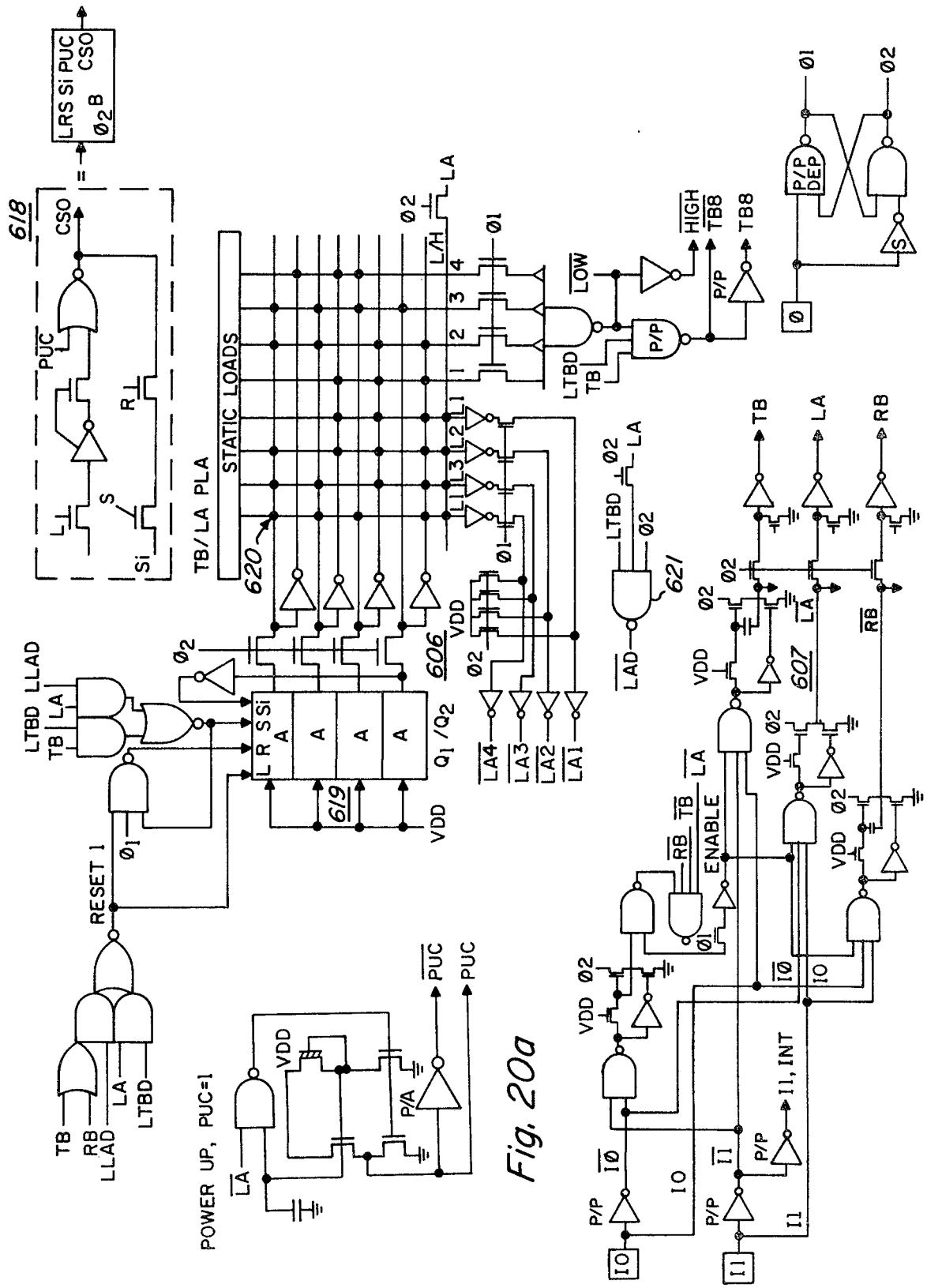
FIGS. 20a–20e form a composite logic diagram of the control logic for ROMs 12a, 12b, 13a or 13b.
Figure 20B:
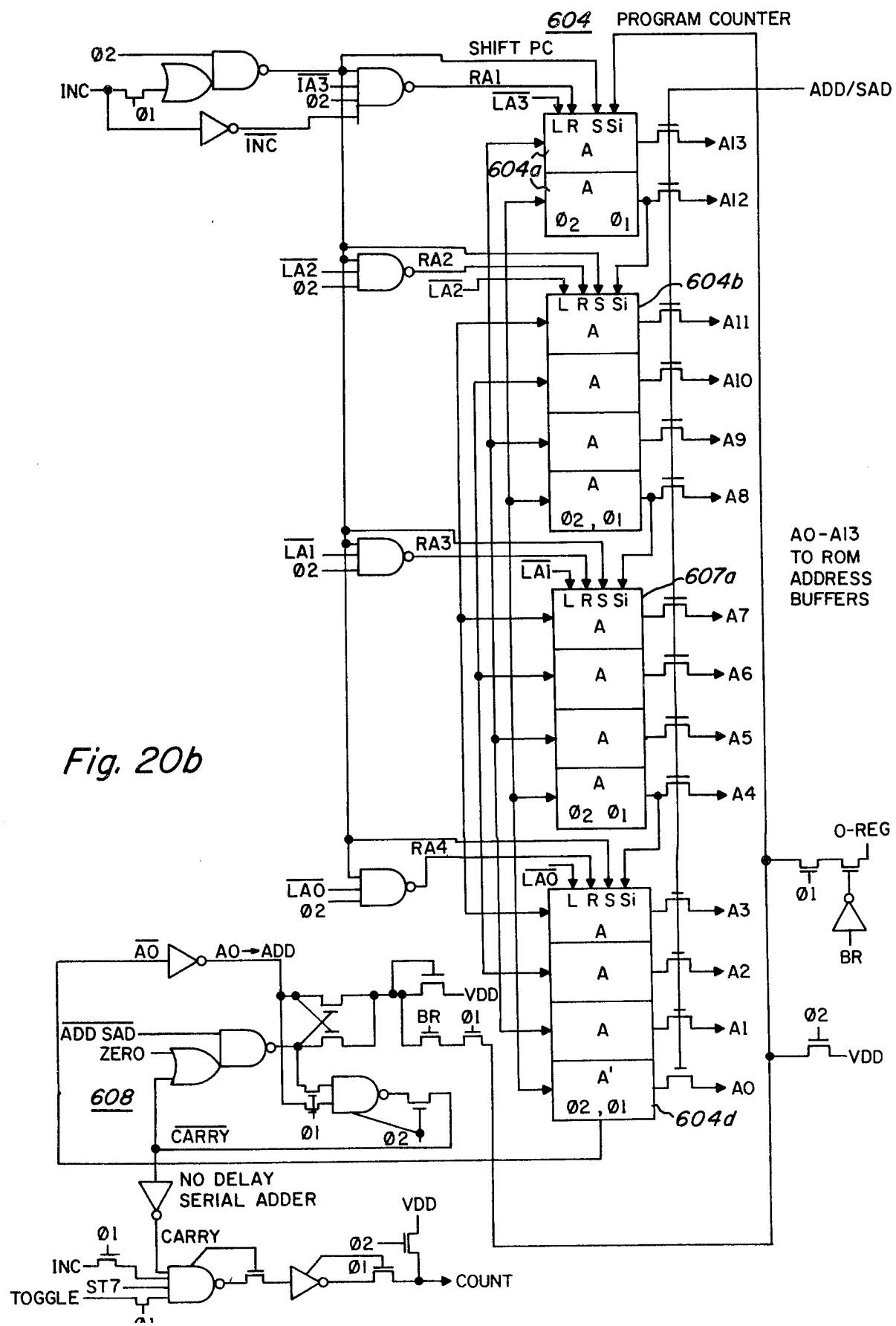
Figure 20C:
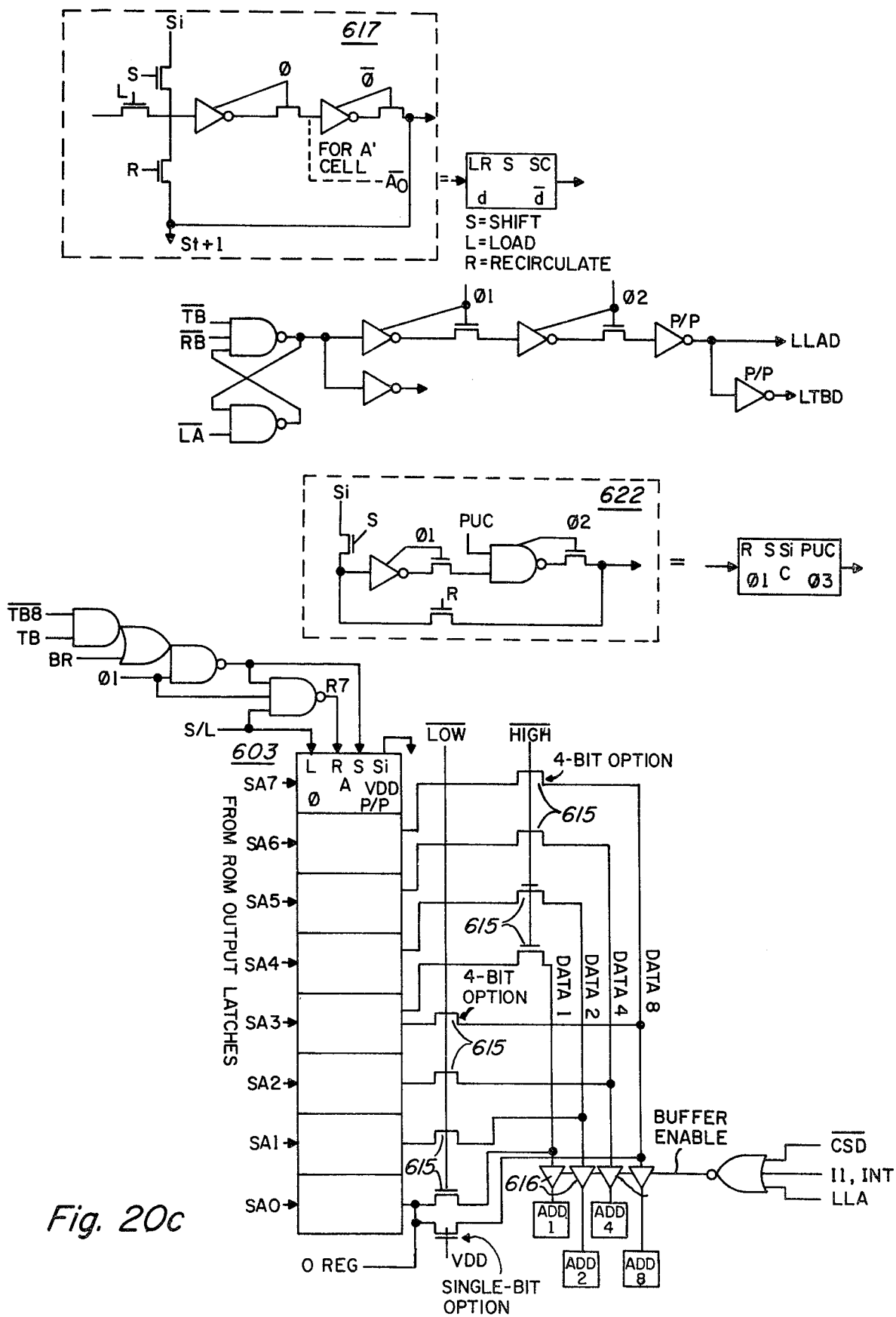
Figure 20D:
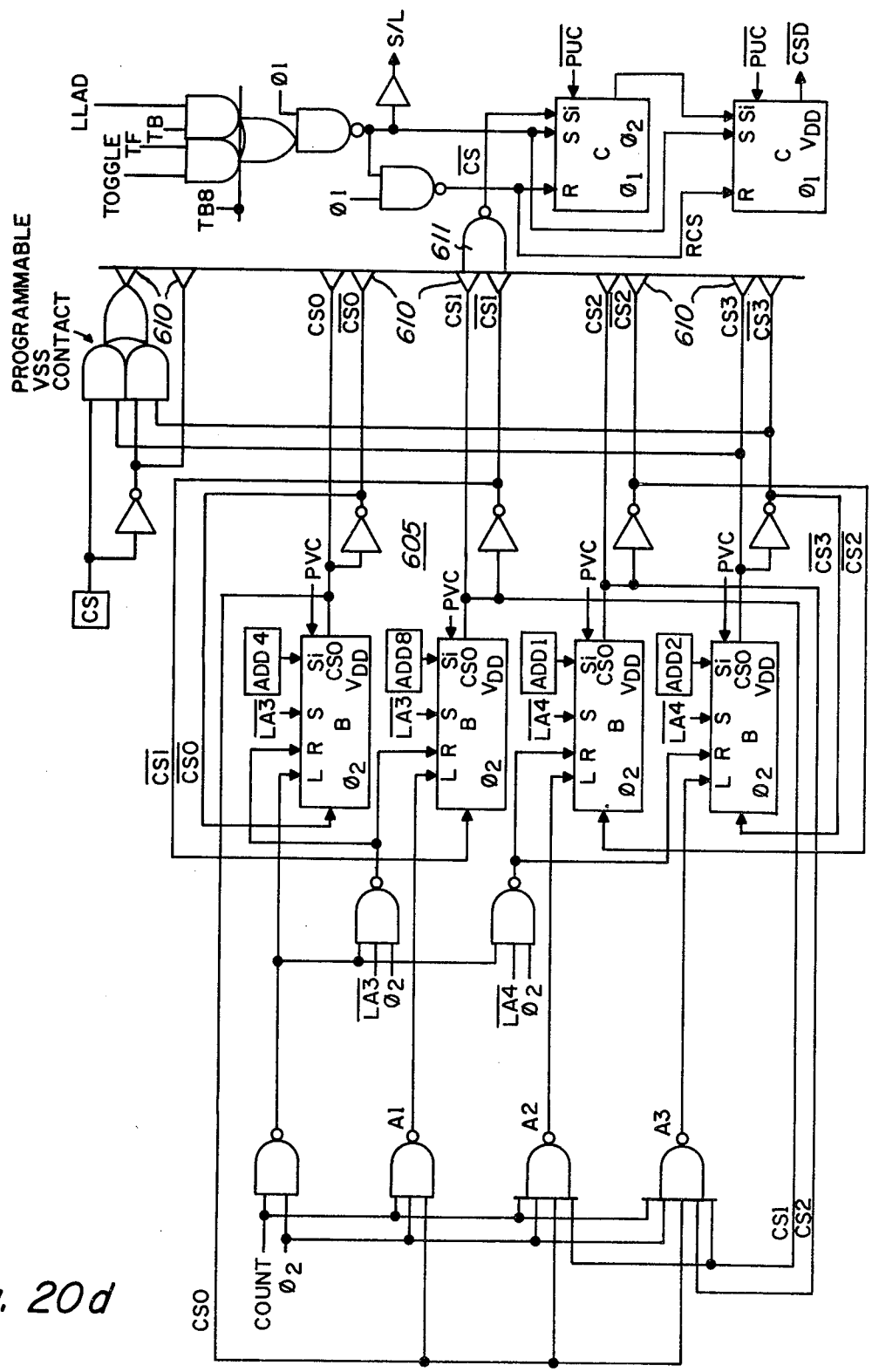
Figure 20E:
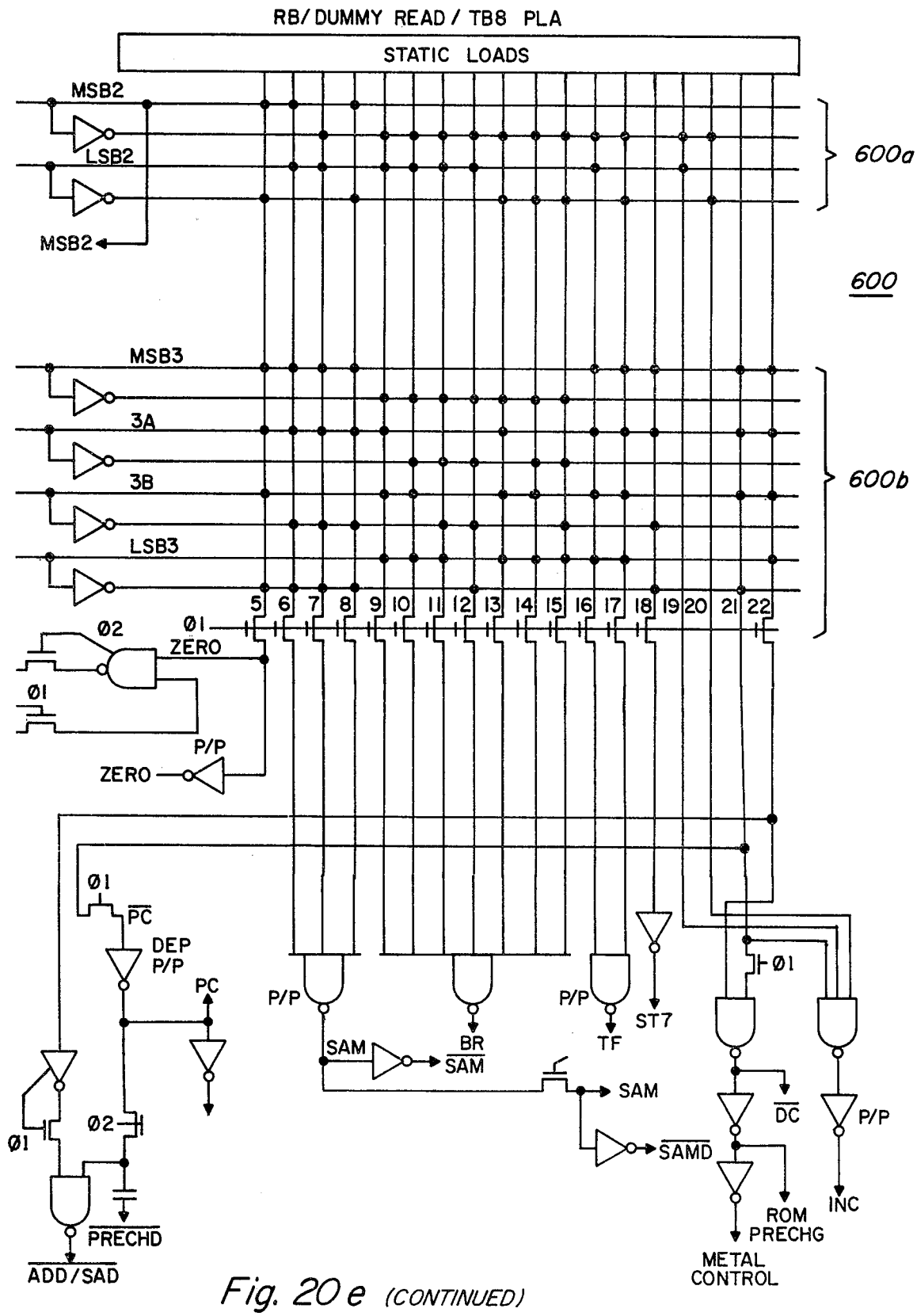

Read-Only-Memories 12a or 12b or 13a or 13b are shown in FIGS. 19, 20a, 20b, 21a and 21b. FIG. 19 is a block diagram of any one of these ROMS. FIGS. 20a and 20b form a composite logic diagram of the control logic for the ROMs while FIGS. 20a and 20b form a composite logic diagram of the X and Y address decoders and pictorially show the array of memory cells.

Referring now to FIG. 19, the RAM array 601 is arranged with eight output lines, one output line from each section of 16,384 bits. The eight output lines from ROM array 601 are connected via an output latch 602 to an eight bit output register 603. The output register 603 is interconnected with pins ADD1-ADD8 and arranged either to communicate the four high or low order bits from output register 603 via the four pins ADD1-ADD8 or alternatively to communicate the bit serially from output register 603 via pin ADD1. The particular alternative used may be selective according to mask programmable gates.

ROM array 601 is addressed via a 14 bit address counter 604. The address counter 604 has associated therewith a four bit chip select counter 605. Addresses in address counter 604 and chip select counter 605 are loaded four bits at a time from pins ADD1-ADD8 in response to a decoded Load Address (LA) command. The first LA command loads the four least significant bits in address counter 604 (bits $A_0$-$A_3$), and subsequent LA commands load the higher order bits, ($A_4$-$A_7$, $A_8$-$A_{11}$ and $A_{12}$-$A_{13}$). During the fourth LA cycle the $A_{12}$ and $A_{13}$ bits are loaded at the same time the CS0 and CS1 bits in chip select counter 605 are loaded. Upon the fifth LA command the two most significant bits in chip select counter 605 are loaded form ADD1 and ADD2. A counter 606 counts consecutively received LA commands for indicating where the four bits on ADD1-ADD8 are to be inputted into counters 604 and/or 605.

Commands are sent to the ROM chip via $I_0$ and $I_1$ pins to a decoder 607 which outputs the LA command a TB (transfer bit) and a RB (read and branch) command.

Address register 604 and chip select register 605 have an add-one circuit 608 associated therewith for incrementing the address container therein. When a carry occurs outside the fourteen bit number stored in address register 604 the carry is carried into shift select register 605 which may enable the chip select function if not previously enabled or disable the chip select function if previously enabled, for example. Alternatively, the eight bit contents of output register 603 may be loaded into address register 604 by means of selector 609 in response to an RB command. During an RB command, the first byte read out of array 601 is used as the lower order eight bits while the next successive byte is used for the higher order six bits in counter 604.

The output of chip select register 605 is applied via programmable connectors 610 to gate 611 for comparing the contents of chip select counter 605 with a preselected code entered by the programming of connectors 610. Gate 611 is also responsive to a chip select signal on the chip select pin for permitting the chip select feature to be based on either the contents of the four bit chip select register 605 and/or the state of the chip select bit on the CS pin. The output of gate 611 is applied to two delay circuits 612, the output of which controls the output buffers associated with outputting information from output register 603 to pins ADD1-ADD8. The delay imposed by delay circuits 612 effect the two byte delay in this embodiment, because the address information inputted on pins ADD1-ADD8 leads the data outputted in response thereto by the time to require to access ROM array 601. The CS pin is preferably used in the embodiment of the learning aid disclosed herein.

A timing PLA 600 is used for timing the control signals outputted to ROM array 601 as well as the timing of other control signals.

Referring now to the composite drawing formed by FIGS. 20a and 20b, output register 603 is formed by eight "A" bit latches, an exemplary one of which is shown at 617. The output of register 603 is connected in parallel via a four bit path controlled on $\overline{\text{LOW}}$ or $\overline{\text{HIGH}}$ signals to output buffers 616 for ADD1-ADD4 and 616a for ADD8. Buffers 616 and 616a are shown in detail on FIGS. 21a-21b.

Gates 615 which control the transferring of the parallel outputs from register 603 via in response to $\overline{\text{LOW}}$ and $\overline{\text{HIGH}}$ are preferably mask level programmable gates which are preferably not programmed when this chip is used with the learning aid described herein. Rather the data in register 603 is communicated serially via programmable gate 614 to buffer 616a and pin ADD8. The bits outputted to ADD1-ADD8 in response to a $\overline{\text{HIGH}}$ signal are driven from the third through sixth bits in register 603 rather that the fourth through seventh bits inasmuch as a serial shift will normally be accomplished between a $\overline{\text{LOW}}$ and $\overline{\text{HIGH}}$ signal.

Address register 604 comprises fourteen of the bit latches shown at 617. The address in address 604 on lines A0-A13 is communicated to the ROM X and Y address buffers shown on FIGS. 21a-21b. Register 604 is divided into four sections 601a-601d, the 601d section loading four bits from ADD1-ADD8 in response an $\overline{\text{LA0}}$ signal, the 601c section loading four bits from ADD1-ADD8 in response to an $\overline{\text{LA1}}$ signal and likewise for section 601b in response to an $\overline{\text{LA2}}$ signal. Section 601a is two bits in length and loads the ADD1 and ADD2 bits in response to an $\overline{\text{LA2}}$ signal. The chip select register 605 comprise four B type bit latches of the type shown at 618. The low order bits, CS0 and CS1 are loaded from ADD4 and ADD8 in response to an $\overline{\text{LA3}}$ signal while the high order bits CS2 and CS3 are loaded from ADD1 and ADD2 on an $\overline{\text{LA4}}$ signal. The $\overline{\text{LA0}}$-$\overline{\text{LA4}}$ signals are generated by counter 606. Counter 606 includes a four bit register 619 comprised of four A bit latches 617. The output of the four bit counter 619 is applied to a PLA 620 for decoding the $\overline{\text{LA1}}$-$\overline{\text{LA4}}$ signals. The $\overline{\text{LA0}}$ signal is generated by a NAND gate 621. As can be seen, the $\overline{\text{LA0}}$ signal comes up in response to an LA signal being decoded immediately after a TB signal. The gate 621 looks for a logical one on the LA signal and a logical one on an LTBD (latched transer bit delay) signal from latch 622. Decoder 607 decodes the $I_0$ and $I_1$ signaLS APPLIED TO PINS $I_0$ and $I_1$ for decoding the TB, LA and RB control signals. The signals on the $I_0$ and $I_1$ pins are set out in Table X. Latch circuit 622 is responsive to LA, RB and TB for indicating whether the previously received instruction was either an LA or a TB or RB command.

In addition to counting successive LA commands, four bit counter 609 and PLA 620 are used to count successive TB commands. This is done because in this embodiment each TB command transfers one bit from register 603 on pin ADD8 to the synthesizer chip 10 and output register 603 is loaded once each eight successive TB commands. Thus, PLA 620 also generates a TB8 command for initiating a ROM array addressing sequence. The timing sequence of counter 619 and PLA 620 are set forth in Table XI. Of course, the $\overline{\text{LA1}}$-$\overline{\text{LA4}}$ signal is only generated responsive to successive LA commands while the TB8 signals only generate in response to successive TB commands.

Figure 21A:
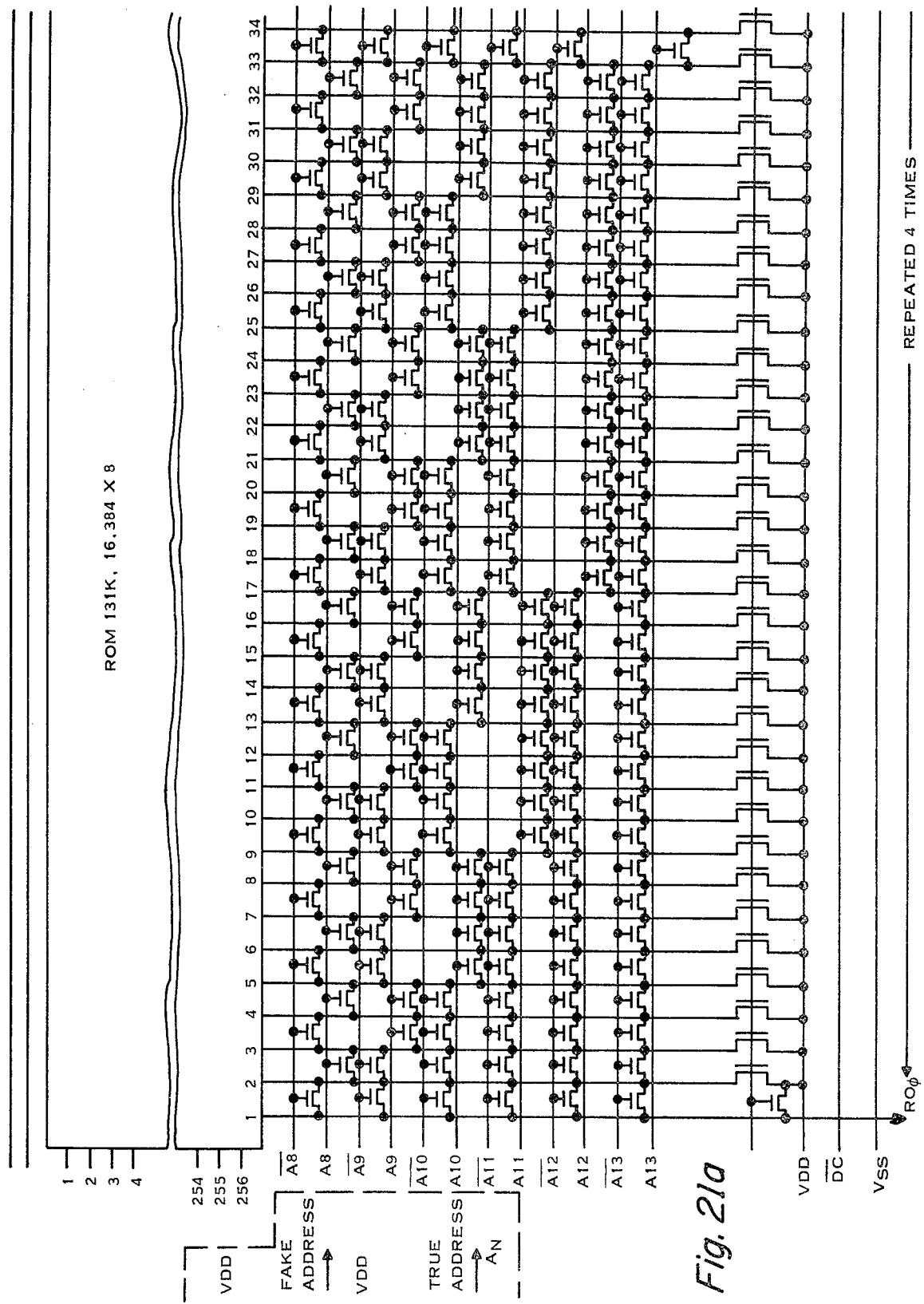

Add-one circuits 608 increments the number in program counter 604 in response to a TB command or an RB command. Since two successive bytes are used as a new address during an RB cycle, the card address and the present address incremented by one must be used to generate these two bytes. The output of add-one circuit 608 is applied via selector 609 for communicating the results of the incrementation back to the input of counter 604. Selector 609 permits the bits in output register 603 to be communicated to program counter 604 during an RB cycle as controlled by signal BR from array 600. Add-one circuit 608 is also coupled via COUNT to chip select counter 605 for incrementing the number stored therein whenever a CARRY would occur outside the fourteen bits stored in program counter 604. The output of chip select counter 605 is applied via programmable gate 610 to gate 611. The signal on the CS pin may also be applied to gate 611 or compared with the contents of CS3. Thus, gate 611 can test for either (1) the state of the CS signal, (2) a specific count in counter 605 or (3) a comparison between the state on the chip select and the state of CS3 or (4) some combination of the foregoing, as may be controlled by those knowledgeable in the art according to how programmable links 610 are programmed during chip manufacture. The output of gate 611 is applied via two bit latches of the C type, which are shown at 622. Timing array 600 controls the timing of ROM sequencing during RB and TB sequences. Array 600 includes PLA sections 600a and 600b and counters 623 and 624. Counter 623 is a two bit counter comprising two A type bit latches shown at 617. Counter 63 counts the number of times a ROM access is required to carry out a particular instruction. For instance, a TB command requires one ROM access while an RB command requires three ROM accesses. Counter 624, which comprises four "A" type bit latches of the type shown at 617, counts through the ROM timing sequence for generating various control signals used in accessing ROM array 601. The timing sequence for a TB command is shown in Table XI which depicts the states in counter 623 and 624 in the signals generated in response thereto. A similar timing sequence for an RB command is shown in Table XIII. The various signals generated by PLA 600a and 600b will now be briefly described. The BR signal controls the transfer of two serial bits from the output register 603 to the program counter 604. The TF signal controls the transfer of eight bits from the sense amp latch 602 (FIG. 21-21b) to output register 603 on lines SA0-SA7. INC controls the serial incrementing of the program counter, two bits for each INC signal generated. PC is the precharge signal for the ROM array and normally exists for approximately ten microseconds. The DC signal discharges the ROM 601 array and preferably lasts for approximately ten microseconds for each DC signal. This particular ROM array uses approximately seventy microseconds to discharge and thus seven DC signals are preferably generated during each addressing sequence. SAM gates the data outputted from the ROM into the sense amp latch 602 while SAD gates the address lines by gating the address from the program counter into the ROM address buffers 625 (FIGS. 21*a*-21*b*).

ALTERNATIVE EMBODIMENTS

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

TABLE I

THE FOLLOWING SEQUENCE IS AN EXAMPLE OF THE LEARNING AID IN THE SPELLING MODE.

| KEY | DISPLAY | SPEAKER |
|---|---|---|
| COMPUSPELL | | 4 RANDOM TONES |
| | SPELL A | |
| B | SPELL B | B |
| C | SPELL C | C |
| D | SPELL D | D |
| P | SPELL D | P |
| A | SPELL A | A |
| GO | - | SPELL DO AS IN DO NOT |
| D | D- | D |
| O | DO- | O |
| ENTER | DO | THAT IS CORRECT, NOW SPELL WAS |
| W | W- | W |
| U | WU- | U |
| S | WUS- | S |
| ERASE | - | |
| W | W- | W |
| A | WA- | A |
| S | WAS- | S |
| ENTER | WAS | THAT IS RIGHT, NEXT SPELL ANY |
| A | A- | A |
| N | AN- | N |
| I | ANI- | I |
| ENTER | ANI | TRY AGAIN, ANY |
| REPEAT | - | ANY |
| REPEAT | - | ANY (½ SPEED) |
| E | E- | E |
| N | EN- | N |
| Y | ENY- | Y |
| ENTER | ENY | THAT IS INCORRECT, THE CORRECT SPELLING OF ANY IS |
| A | A | A |
| | AN | N |
| | ANY | Y |
| | ANY | ANY NOW TRY FULL |
| F | F- | F |
| U | FU- | U |
| L | FUL- | L |
| L | FULL- | L |
| | FULL | THAT IS CORRECT, TRY SHOE |

TABLE I-continued

THE FOLLOWING SEQUENCE IS AN EXAMPLE OF THE LEARNING AID IN THE SPELLING MODE.

| KEY | DISPLAY | SPEAKER |
|---|---|---|
| | | MEANING FOOTWEAR |
| S | S- | S |
| H | SH- | H |
| O | SHO- | O |
| E | SHOE- | E |
| ENTER | SHOE | YOUR ARE CORRECT, SPELL COMB |
| C | C- | C |
| O | CO- | O |
| M | COM- | M |
| E | COME- | E |
| ENTER | COME | TRY AGAIN, COMB |
| C | C- | |
| O | CO- | |
| M | COM- | |
| B | COMB- | |
| ENTER | COMB | YOU ARE CORRECT, NOW SPELL FOUR AS IN THE NUMBER |
| F | F- | F |
| O | FO- | O |
| U | FOU- | U |
| R | FOUR- | R |
| ENTER | FOUR | THAT IS CORRECT, NEXT SPELL WHO |
| W | W- | W |
| H | WH- | H |
| O | WHO- | O |
| ENTER | WHO | YOU ARE RIGHT, NOW TRY SOUP |
| S | S- | S |
| O | SO- | O |
| U | SOU- | U |
| P | SOUP- | P |
| ENTER | SOUP | THAT IS RIGHT, TRY MOST |
| M | M- | M |
| O | MO- | O |
| S | MOS- | S |
| T | MOST- | T |
| ENTER | MOST | YOU ARE CORRECT |
| | +8 -2 | 4 TONES |
| | +8 -2 | 4 TONES |
| | +8 -2 | HERE IS YOUR SCORE, EIGHT CORRECT, TWO DID NOT COMPUTE. |

TABLE II

LEARN MODE

| KEY | DISPLAY | SPEAKER |
|---|---|---|
| | BUSY | (1 SECOND PAUSE) SAY IT (2 SECOND PAUSE) BUSY |
| | MANY | (1 SECOND PAUSE) SAY IT (2 SECOND PAUSE) MANY |
| | CARRY | (1 SECOND PAUSE) SAY IT (2 SECOND PAUSE) CARRY |
| | YOUR | (1 SECOND PAUSE) SAY IT (2 SECOND PAUSE) YOUR |
| | WILD | (1 SECOND PAUSE) SAY IT (2 SECOND PAUSE) WILD |
| | LOVE | (1 SECOND PAUSE) SAY IT |

TABLE II-continued

LEARN MODE

| KEY | DISPLAY | SPEAKER |
|---|---|---|
|  |  | (2 SECOND PAUSE) |
|  |  | LOVE |
|  | BUSH | (1 SECOND PAUSE) |
| REPEAT |  | SAY IT |
| REPEAT |  | (2 SECOND PAUSE) |
| REPEAT } IGNORED |  | BUSH |
| REPEAT | EARN | (1 SECOND PAUSE) |
|  |  | SAY IT |
|  |  | (2 SECOND PAUSE) |
|  |  | EARN |
|  | - | SPELL MANY |
| M | M- | M |
| A | MA- | A |
| N | MAN- | N |
| Y | MANY- | Y |
| ENTER | MANY | YOU ARE CORRECT, |
|  | - | NOW SPELL EARN |

THE LEARNING AID CONTINUES THROUGH THE
REMAINING 9 WORDS AS IN
THE SPELLING MODE.

TABLE III

IN THE WORD GUESSER MODE THE LEARNING AID
RANDOMLY SELECTS A WORD FROM LEVEL C OR D
AND DISPLAYS DASHES TO REPRESENT THE NUMBER
OF LETTERS IN THE CHOSEN WORD. THE USER TRIES
TO GUESS THE WORD. THE USER MUST COMPLETE
THE WORD BEFORE MAKING SEVEN INCORRECT
GUESSES. THE FOLLOWING IS AN EXAMPLE OF THE
FUNCTION OF THE LEARNING AID IN THE
SPELLING MODE.

| KEY | DISPLAY | SPEAKER |
|---|---|---|
| HANGMAN | ------- | 4 TONES |
| A | ------- |  |
| E | E- E- - - - E | 4 TONES |
| I | E- E- - - - E |  |
| O | E- E- - O- E | 4 TONES |
| U | E- E- - O- E |  |
| B | E- E- - O- E |  |
| C | E- E- - O- E |  |
| D | E- E- - O- E |  |
| F | E- E- - O- E |  |
|  | EVERYONE | 4 TONES, I WIN |
|  | ------ |  |
| A | ------ |  |
| E | - - - - -E | 4 TONES |
| I | - - - - -E |  |
| O | -O- - -E | 4 TONES |
| U | -OU- -E | 4 TONES |
| B | -OU- -E |  |
| C | COU- -E | 4 TONES |
| R | COUR-E | 4 TONES |
| S | COURSE | 4 TONES |
|  | COURSE | 4 TONES, YOU WIN |

TABLE IV

The synthesizer 10 includes interpolation logics to accomplish a nearly linear interpolation of all twelve speech parameters at eight points within each frame, that is, once each 2.5 msec. The parameters are interpolated one at a time as selected by the parameter counter. The interpolation logics calculate a new value of a parameter from its present value (i.e. the value currently stored in the K-stack, pitch register or E-10 loop) and the target value stored in encoded form in RAM 203 (and decoded by ROM 202). The value computed by each interpolation is listed below.

Where $P_i$ is the present value of the parameter,
$P_{i+1}$ is the new parameter value
$P_t$ is the target value
$N_i$ is an integer determined by the interpolation counter The values of $N_i$ for specific interpolation counts and the values $$\frac{P_i - P_o}{P_t - P_o}$$

($P_0$ is initial parameter value) are as follows:

| INTERPOLATION COUNT | $N_i$ | $\frac{P_i - P_o}{P_t - P_o}$ |
|---|---|---|
| 1 | 8 | 0.125 |
| 2 | 8 | 0.234 |
| 3 | 8 | 0.330 |
| 4 | 4 | 0.498 |
| 5 | 4 | 0.623 |
| 6 | 2 | 0.717 |
| 7 | 2 | 0.859 |
| 0 | 1 | 1.000 |

TABLE V

"HELP"

0000
0100000000100110111010010111
01110000001
1101100100100001010010000110011110001010100101010
110110011
1110100111
110110100001101011110101010010111100010010101
110110100001110010111000110011011000010010001111101 } HEL
11011001101000101010011010011111101101010100001110
1011100101
1010100100001101001111000110011110111001000101010110
1001100001
1001011101
100001101 1

TABLE V-continued

```
0010011100001010010111011001111001010111001011011
0000
0000
0000
0111000000101000101110111000
0111000000100001010111011011010
0101000001
0011000000100110011110100110
0010000000100100010110110101
0000
1111
```

| E N E R G Y | P I T C H | R E P E A T | K1 | K2 | K3 | K4 | K5 | K6 | K7 | K8 | K9 | K10 |

TABLE VI

DECODED PARAMETERS

| CODE | E | P | K1 | K2 | K3 | K4 | K5 | K6 | K7 | K8 | K9 | K10 |
|---|---|---|---|---|---|---|---|---|---|---|---|---|
| 00 | 000 | 000 | 20B | 2AB | 273 | 28F | 201 | 2DE | 2DD | 326 | 31F | 34D |
| 01 | 000 | 029 | 20B | 288 | 293 | 282 | 2E2 | 304 | 300 | 378 | 363 | 386 |
| 02 | 001 | 02B | 213 | 20F | 289 | 2D8 | 306 | 32F | 328 | 3DA | 3AF | 3C3 |
| 03 | 001 | 02D | 218 | 2B8 | 2F6 | 308 | 32D | 35D | 352 | 038 | 3FD | 001 |
| 04 | 002 | 02F | 229 | 304 | 31B | 341 | 358 | 38E | 380 | 098 | 04C | 03F |
| 05 | 003 | 031 | 229 | 321 | 356 | 37D | 386 | 3C2 | 3B0 | 0B8 | 097 | 078 |
| 06 | 005 | 033 | 234 | 340 | 398 | 38D | 386 | 3F7 | 3E1 | 131 | 0DC | 083 |
| 07 | 007 | 035 | 242 | 362 | 3DC | 3FF | 3E7 | 02C | 013 | 169 | 118 | 087 |
| 08 | 00A | 037 | 255 | 384 | 023 | 040 | 018 | 061 | 045 | | | |
| 09 | 00B | 03A | 268 | 3A8 | 068 | 080 | 049 | 093 | 075 | | | |
| 0A | 019 | 03C | 286 | 3CD | 0A9 | 0BC | 079 | 0C2 | 0A3 | | | |
| 0B | 018 | 03F | 2A8 | 3F2 | 0E4 | 0F3 | 0A7 | 0EF | 0CE | | | |
| 0C | 028 | 042 | 20F | 017 | 119 | 123 | 0D2 | 116 | 0E6 | | | |
| 0D | 03D | 046 | 2FD | 03C | 146 | 14C | 0F9 | 139 | 118 | | | |
| 0E | 056 | 049 | 332 | 061 | 16C | 16F | 11D | 158 | 13C | | | |
| 0F | 000 | 04C | 36C | 085 | 18C | 18D | 13E | 173 | 159 | | | |
| 10 | | 04F | 3AA | 0A7 | | | | | | | | |
| 11 | | 053 | 3B8 | 0C7 | | | | | | | | |
| 12 | | 057 | 02D | 0E6 | | | | | | | | |
| 13 | | 05A | 06E | 103 | | | | | | | | |
| 14 | | 05F | 0A8 | 11F | | | | | | | | |
| 15 | | 063 | 0B3 | 136 | | | | | | | | |
| 16 | | 067 | 115 | 14D | | | | | | | | |
| 17 | | 068 | 140 | 162 | | | | | | | | |
| 18 | | 070 | 165 | 174 | | | | | | | | |
| 19 | | 076 | 184 | 185 | | | | | | | | |
| 1A | | 078 | 19D | 194 | | | | | | | | |
| 1B | | 081 | 182 | 1A1 | | | | | | | | |
| 1C | | 086 | 1C3 | 1AD | | | | | | | | |
| 1D | | 08C | 1D0 | 187 | | | | | | | | |
| 1E | | 093 | 1DA | 1C1 | | | | | | | | |
| 1F | | 099 | 1E2 | 1FA | | | | | | | | |

TABLE VII

DATA OUTPUTTED FROM K-STACK 302 TO RECODING LOGIC 301 BY TIME PERIODS

| K-STACK OUTPUT BIT | LINE | T8 | T9 | T10 | T11 | T12 | T13 | T14 | T15 | T16 | T17 | T18 | T19 | T20 | T21 | T22 | T23 | T24 | T25 | T26 | T27 |
|---|---|---|---|---|---|---|---|---|---|---|---|---|---|---|---|---|---|---|---|---|---|
| LSB | 32-1 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-2 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-3 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-4 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-5 | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| | 32-6 | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| | 32-7 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| | 32-8 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| | 32-9 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |
| MBS | 32-10 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |

TABLE VIII

CHIRP ROM CONTENTS

| ADDRESS | CHIRP FUNCTION VALUE | STORED VALUE (COMPLEMENTED) |
|---|---|---|
| 00 | 00 | FF |
| 01 | 2A | D5 |
| 02 | D4 | 2B |
| 03 | 32 | CD |
| 04 | B2 | 4D |
| 05 | 12 | ED |
| 06 | 25 | DA |
| 07 | 14 | EB |
| 08 | 02 | FD |
| 09 | E1 | 1E |
| 10 | C5 | 3A |
| 11 | 02 | FD |
| 12 | 5F | A0 |
| 13 | 5A | A5 |
| 14 | 05 | FA |
| 15 | 0F | F0 |
| 16 | 26 | D9 |
| 17 | FC | 03 |
| 18 | A5 | 5A |
| 19 | A5 | 5A |
| 20 | D6 | 29 |
| 21 | DD | 22 |
| 22 | DC | 23 |
| 23 | FC | 03 |
| 24 | 25 | DA |
| 25 | 2B | D4 |
| 26 | 22 | DD |
| 27 | 21 | DE |
| 28 | 0F | F0 |
| 29 | FF | 00 |
| 30 | F8 | 07 |
| 31 | EE | 11 |
| 32 | ED | 12 |
| 33 | EF | 10 |
| 34 | F7 | 08 |
| 35 | F6 | 09 |
| 36 | FA | 05 |
| 37 | 00 | FF |
| 38 | 03 | FC |
| 39 | 02 | FD |
| 40 | 01 | FE |

TABLE X

I₀/I₁ COMMANDS

| I₀ | I₁ | |
|---|---|---|
| 0 | 0 | No Operation |
| 0 | 1 | Load Address (LA) |
| 1 | 0 | Transfer Bit (TB) |
| 1 | 1 | Read and Branch (RB) |

TABLE XI

Counter 619/PLA 620 Timing Sequence

| STEP | COUNTER CONTENTS (HEX) | SIGNALS GENERATED |
|---|---|---|
| 1 | 0 | $\overline{LA1}$, TB8 |
| 2 | 8 | $\overline{LA2}$ |
| 3 | C | $\overline{LA3}$ |
| 4 | E | $\overline{LA4}$ |
| 5 | F | |
| 6 | 7 | |
| 7 | 3 | |
| 8 | 1 | |

TABLE XII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 10 | F | SAD, INC |
| 2 | 10 | E | DC, INC |
| 3 | 10 | C | DC, INC |
| 4 | 10 | 8 | DC, INC |
| 5 | 10 | 0 | DC, INC |
| 6 | 10 | 1 | DC, INC |
| 7 | 10 | 3 | SAM, DC, INC |
| 8 | 10 | 7 | PC, $\overline{ZERO}$ |

TABLE XIII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 11 | F | SAD, INC |
| 2 | 11 | E | DC, INC |
| 3 | 11 | C | DC, INC |
| 4 | 11 | 8 | DC, INC |
| 5 | 11 | 0 | DC, INC |
| 6 | 11 | 1 | DC, INC |
| 7 | 11 | 3 | SAM, DC, INC |
| 8 | 11 | 7 | PC |
| 9 | 01 | F | SAD, TF |
| 10 | 01 | E | BR, PC |
| 11 | 01 | C | BR, DC |
| 12 | 01 | 8 | BR, DC |
| 13 | 01 | 0 | BR, DC |
| 14 | 01 | 1 | DC |
| 15 | 01 | 3 | SAM, DC |
| 16 | 01 | 7 | PC |
| 17 | 00 | F | SAD, TF |
| 18 | 00 | E | BR |
| 19 | 00 | C | BR |
| 20 | 00 | 8 | BR |
| 21 | 00 | 0 | |
| 22 | 00 | 1 | |
| 23 | 00 | 3 | |
| 24 | 00 | 7 | PC |
| 25 | 10 | F | SAD, INC |
| 26 | 10 | E | DC, INC |
| 27 | 10 | C | DC, INC |
| 28 | 10 | 8 | DC, INC |
| 29 | 10 | 0 | DC, INC |
| 30 | 10 | 1 | DC, INC |
| 31 | 10 | 3 | SAM, DC, INC |
| 32 | 10 | 7 | PC, $\overline{ZERO}$ |

What is claimed is:

1. An apparatus for storing digital speech data and for communicating such digital speech data to a speech synthesis circuit, said apparatus comprising:
    (a) a memory for storing a plurality frames of digital speech data, said frames including a first frame type representative of voiced speech and a second frame type representative of unvoiced speech, said first frame type having a greater number of bits of data associated therewith than said second frame type;
    (b) means for addressing said memory with an address; and
    (c) control means responsive to control signals generated by said speech synthesis circuit for communicating the digital data stored in said memory to said speech synthesis circuit.

2. The apparatus according to claim 1, wherein said control means further includes means responsive to control signals generated by said speech synthesis circuit for inserting an address outputted by said speech synthesis circuit into said addressing means.

3. A method of communicating frames of digital speech data to a speech synthesis circuit, said method comprising the steps of:
(a) communicating a first type of frame including a first number of bits representative of a speech energy coefficient, a second number of bits representative of a speech pitch coefficient and a third number of bits representative of speech filter parameters, said first type of frame being communicated during voiced speech; and
(b) communicating a second type of frame including said first number of bits representative of a speech energy coefficient, said second number of bits and a fourth number of bits representative of speech filter parameters, said fourth number of bits being fewer than said third number of bits and said second number of bits being of a preselected state, said second type of frame being communicated during unvoiced speech.

4. The method according to claim 3 further including the step of:
communicating a third type of frame having said first number of bits, said first number of bits being of a first preselected logical setting, said third type of frame being communicated during a pause.

5. The method according to claims 3 or 4, wherein said first and second types of frames each include a repeat bit of one preselected state and further including the step of:
communicating a repeat frame including said first number of bits representative of the speech energy coefficient, a second number of bits representative of the speech pitch coefficient and the repeat bit, said repeat bit being of the other state.

6. The method according to claim 5, wherein said first number of bits in each frame are communicated before the second number of bits in each frame in which the second number of bits are present.

7. A method of communicating a frame of digital speech data to a speech synthesis circuit, said speech synthesis circuit, said method comprising the steps of:
(a) communicating a first number of bits representative of an enclosed speech energy coefficient;
(b) selectively communicating a second number of bits representative of an encoded speech pitch coefficient and a repeat bit, said second number of bits being communicated unless said first number of bits is of at least one preselected setting;
(c) selectively communicating a third number of bits representative of a first number of encoded speech filter parameters, said third number of bits being communicated unless said repeat bit is of a preselected state; and
(d) selectively communicating a fourth number of bits representative of a second number of encoded speech filter parameters, said fourth number of bits being communicated unless said repeat bit is of a said preselected state or unless the bits representative of said encoded speech pitch coefficient are of a preselected setting.

8. The method according to claim 7, wherein said first number of bits is four bits, said second number of bits is six bits, and third number of bits is eighteen bits, said fourth number of bits is twenty-one bits, said first number of parameters is four parameters and said second number of parameters is six parameters.

* * * * *

UNITED STATES PATENT OFFICE
CERTIFICATE OF CORRECTION

Patent No.  4,234,761    Dated  11/18/80

Inventor(s)  Richard H. Wiggins, Jr. and George L. Brantingham

It is certified that error appears in the above-identified patent and that said Letters Patent are hereby corrected as shown below:

In Claim 1, subparagraph (a), after "plurality" insert --of--.

In Claim 7, subparagraph (a), change "enclosed" to --encoded--.

Signed and Sealed this

Twenty-seventh Day of January 1981

[SEAL]

Attest:

RENE D. TEGTMEYER

Attesting Officer    Acting Commissioner of Patents and Trademarks